United States Patent
Singh et al.

(10) Patent No.: US 6,539,536 B1
(45) Date of Patent: Mar. 25, 2003

(54) ELECTRONIC DESIGN AUTOMATION SYSTEM AND METHODS UTILIZING GROUPS OF MULTIPLE CELLS HAVING LOOP-BACK CONNECTIONS FOR MODELING PORT ELECTRICAL CHARACTERISTICS

(75) Inventors: Harbinder Singh, San Jose, CA (US); Denis Martin, Palo Alto, CA (US); Srinivas Ajjarapu, Sunnyvale, CA (US); Robert Walker, Boulder, CO (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/496,967

(22) Filed: Feb. 2, 2000

(51) Int. Cl.[7] .................................................. G06F 17/50
(52) U.S. Cl. .................................. 716/18; 716/8; 716/9; 716/10; 716/11
(58) Field of Search ........................... 716/8, 9, 10, 11, 716/18; 714/724; 703/23

(56) References Cited

U.S. PATENT DOCUMENTS

| | | | | |
|---|---|---|---|---|
| 5,812,417 A | * | 9/1998 | Young ............................ | 716/8 |
| 5,903,466 A | * | 5/1999 | Beausang et al. ............. | 716/12 |
| 5,960,191 A | * | 9/1999 | Sample et al. ................ | 703/23 |
| 6,067,650 A | * | 5/2000 | Beausang et al. ........... | 714/724 |
| 6,195,776 B1 | * | 2/2001 | Ruiz et al. ................... | 714/738 |

* cited by examiner

Primary Examiner—Matthew Smith
Assistant Examiner—Thuan Do
(74) Attorney, Agent, or Firm—Wagner, Murabito & Hao LLP

(57) ABSTRACT

A computer implemented process and system for electronic design automation (EDA) using groups of multiple cells having loop-back connections for modeling port electrical characteristics. Multi-bit cells have multiple gates of the same function implemented within a same cell. Multi-bit components have multiple multi-bit cells implemented within a same component. Scannable multi-bit cells and components are similar to multi-bit cells and components but contain scannable sequential elements with scan chains installed. Multi-bit cells may or may not have each sequential cells' input and each sequential cells' output available externally. The scannable sequential elements of a multi-bit component are ordered into a predefined scan chain which is defined by the library containing the multi-bit component or multi-bit cell. During scan replacement processes of the EDA compile process, multi-bit cells and components of the netlist are replaced with scannable multi-bit cells and components. Also, during optimization, multi-bit cells and components undergo equivalence replacement to meet specified constraints (e.g., area, performance, etc.). To model the electrical characteristics of the port during certain optimizations, loopback connections are applied to the multi-bit components from the scan out port to the scan in port of the multi-bit cell or component, therefore, one loopback connection spans multiple sequential cells within the multi-bit cell or component. During certain optimizations, loopback connections are applied to multiple sequential cells that are coupled together but do not necessarily reside in a multi-bit cell or component. By spanning multiple sequential cells, circuit degeneration is reduced thereby providing better circuit optimizations for netlists having scan circuitry.

20 Claims, 44 Drawing Sheets

645

ELECTRONIC DESIGN AUTOMATION SYSTEM AND METHODS UTILIZING GROUPS OF MULTIPLE CELLS HAVING LOOP-BACK CONNECTIONS FOR MODELING PORT ELECTRICAL CHARACTERISTICS

BACKGROUND OF THE INVENTION (1) Field of the Invention

The present invention relates generally to the field of logic synthesis for integrated circuit devices. More particularly, aspects of the present invention relate to methods and apparatus for design for test within a logic synthesis system.

(2) Background of the Related Art

Complex integrated circuits are designed with the use of computer aided design (CAD) tools. Specifically, application specific integrated circuits (ASICs) and field programmable gate array (FPGA) circuits can be designed using a variety of CAD tools. The development of ASICs and FPGA circuits with the aid of CAD tools is referred to as electronic design automatic or EDA. Design, checking and testing of large scale integrated circuits are so complex that the use of programmed computer systems are required for realization of normal circuits. This is partly because the integrated devices are inherently complex and partly because the circuit design needs to be decomposed into simpler functions which are recognized by the CAD tool. It is also partly because considerable computation is required in order to achieve an efficient layout of the resultant network. The result of the computerized design process is a detailed specification defining a complex integrated circuit in terms of a particular technology. This specification can be regarded as a template for the fabrication of the physical embodiment of the integrated circuit using transistors, routing resources, etc.

Integrated circuit designs can be represented in different levels of abstraction, such as the register transfer level (RTL) and the logical level, using a hardware description language (HDL), also called high level design language. Two exemplary forms of HDL are Verilog and VHDL. The integrated circuit can be represented by different layers of abstractions (e.g., behavioral levels, structural levels and gate levels). An RTL level is an intermediary level of abstraction between the behavioral and structural levels. HDL descriptions can represent designs of all these levels.

The behavior levels and RTL levels consist generally of descriptions of the circuit expressed with program-like constructs, such as variables, operators conditional loops, procedures and functions. At the logic level, the descriptions of the circuit are expressed with Boolean equations. The HDL can be used along with a set of circuit constraints as an input to a computer implemented compiler (also called a "silicon compiler"). The computer implemented compiler program processes this description of the integrated circuit and generates therefrom a detailed list of logic components and the interconnections between these components. This list is called a "netlist." The components of a netlist can include primitive cells such as full-adders, NAND gates, NOR gates, XOR gates, latches and D-flip flops, etc. and their interconnections used to form a custom design.

In processing the HDL input, the compiler first generates a netlist of generic primitive cells that are technology independent. The compiler then applies a particular cell library to this generic netlist (this process is called mapping) in order to generate a technology dependent mapped netlist.

The mapping process converts the logical representation which is independent of technology into a form which is technology dependent. The mapped netlist has recourse to standard circuits, or cells which are available within a cell library forming a part of the data available to the computer system.

Compiler programs and mapping programs are well known in the art and several of these systems are described in U.S. Pat. No. 5,406,497, by Altheimer et al.

An important part of the logic synthesis process involves designing for testability. Programs that aid in the testability process of logic synthesis are called design for test (DFT) processes. As part of DFT, it is known to take the mapped netlist generated from a compiler and add and/or replace certain memory cells and associated circuitry with special memory cells that are designed to allow the application of test vectors to certain logic portions of the integrated circuit. The act of applying test vectors is called stimulation of the design and the special memory cells and associated circuitry are referred to as DFT implementations. Issues concerning controllability deal with facilitating the application of the test vectors to the circuitry to be tested. The same memory cells can be used to capture the output of the circuitry for observation and compare this output to the expected output in an effort to determine if circuit (e.g., manufacturing) defects are present.

The portions of an integrated circuit that are designed to perform its intended or expected operational function are called its "mission mode" circuitry while the portions added to the integrated circuit to facilitate testability are called "test mode" circuitry or DFT implementations. The resultant circuit therefore has two functional modes, mission and test.

An exemplary flow chart diagram of a typical logic synthesis process, including a DFT process, is shown in FIG. 1. The processes 200 described with respect to this flow chart is implemented within a computer system in a CAD environment. High level design language (HDL) descriptions of the integrated circuit enter at block 201. Also accompanying the HDL 201 is a set of performance constraints 205 applicable to the design which typically include timing, area, power consumption, and other performance related limitations that the compiler 225 will attempt to satisfy when synthesizing the integrated circuit design. Constraints 205 can also include non-performance related constraints such as structural and routing constraints. Compiler 225 consists of a generic compiler 203 (also called an HDL compiler, RTL synthesizer, or architectural optimizer) that inputs the HDL 201 description and generates therefrom a technology independent or "generic" netlist 207 which is also dependent on the constraints 205. As discussed above, the netlist 207 is a list of technology independent components or operators and the interconnections between them.

The generic netlist 207 is then input to a design compiler 209 that includes a computer implemented logic optimization procedure and a mapping procedure which interfaces with a technology dependent cell library 230 (e.g., from LSI, VLSI, TI or Xilinx technologies, etc.). The cell library 230 contains specific information regarding the cells of the specific technology selected such as the cell logic, number of gates, area consumption, power consumption, pin descriptions, etc., for each cell in the library 230. Logic optimization procedure of block 209 includes structuring and flattening procedures. The mapping procedure of block 209 generates a gate level mapped netlist 211 that is technology dependent having cells specifically selected to satisfy the constraints 205. This gate level netlist 211 consists at this point of "mission mode" circuitry.

At block 212 of FIG. 1, DFT process 213 performs a particular test insertion process (here a scan) to implement testability cells or "test mode" cells into the overall integrated circuit design. In this process 213, memory cells of the mapped netlist 211 are replaced with memory cells that are specially designed to apply and observe test vectors or patterns to and from portions of the integrated circuit. In one particular DFT process, these memory cells specially designed for test are called scannable memory cells. The test vector patterns can be derived from combinational or sequential automatic test pattern generation (ATPG) processes depending on whether or not a full or partial scan is performed by the scan insertion process 213. Process 213 also performs linking groups of scannable memory cells into scan chains so that the test vectors can be cycled into and out of the integrated circuit design. The output of the scan insertion process 213 is a scannable netlist 215 that contains both mission and test mode circuitry.

A problem occurs in the prior art process of FIG. 1 in that the scan insertion process 213 does not take into account its impact on the mission mode design. Specifically, the addition of the testability cells (scannable cells), and interconnections there between (chaining resources), and the addition of other dedicated connections required for operation of the scan chains (e.g., scan clock routing and scan enable signal routing) can cause the overall design to violate one or more of the defined constraints 205.

Therefore, a second compile process 217 of FIG. 1 (full or incremental compile) is invoked by the prior art process 200 in order to more effectively optimize the scannable netlist 215 to the constraints 205. An incremental compile 217 does not process all existing structure as in a full compile, it only applies high level logical optimization to the unmapped portions of the design. Those unmapped portions are then mapped using a technology dependent library. During a process iteration, an incremental compile 217 always processes to decrease the circuit cost. However, although this second compile process 217 is only an incremental compile process, it applies mapping optimizations iteratively on the entire scannable netlist 215. As a result, processing time to perform the second compile process 217 can be on the order of weeks given conventional CAD technology and circuit complexity.

Alternatively, many prior systems utilize a full compile as the second compile process 217. The full compile process is similar to process 225 in that the full compile process at 217 applies mapping and logic optimizations to the entire design, not just the unmapped portions.

After the second compile process 217 of FIG. 1 completes, a scannable netlist 219 is again generated that contains the testability cells but that may or may not meet the original performance constraints 205. Therefore, at block 221, the prior art then performs a test to determine if the scannable netlist 219 meets the constraints 205. If the netlist 219 meets the constraints, then at block 235, other circuit synthesis procedures continue until the integrated circuit design can be fabricated onto a substrate and tested.

However, as is often the case, the addition of the testability cells by the scan insertion process 213 does not allow the second compile process 217 to meet constraints 205 without a design modification to the original HDL program 201. In such case, the overall process 200 flows from block 221 back to the HDL 201 where the architect modifies the HDL program 201 so that the addition of the testability cells and other resources will eventually satisfy, when possible, the given constraints 205 after the incremental compile step 217 is again executed.

The prior art process 200 of FIG. 1 has several disadvantages. It is disadvantageous to execute a second substantial compile process 217 in an attempt to match the testability cells and linking resources to the given set of constraints. Although this process can be an incremental compile step in that much of the gate level connections are not removed, mapping optimization portions of this compile process still operate in an iterative fashion over the entire design. The addition of this second compile process, using conventional technology, delays the overall integrated circuit synthesis process by as much as one to two weeks. Even after this long delay, there are no guarantees that the incremental compile process 217 will generate a scannable netlist satisfying the constraints 205. In this case, a time consuming task of returning to the HDL for redesign is required. This process involves the chip architect designers once more and, therefore, it is unclear under the prior art system when a designer can sign off on his or her work in the design process.

Another problem faced by prior art designs involving the introduction of scan cells for testability while maintaining optimization constraints (e.g., timing and area constraints) is that the timing and area constraints cannot be met in some designs if the entire design is scan replaced. This is true no matter how many conventional compile processes are executed after the scan insertion block. Therefore, it would be desirable to determine a set of sequential cells that can be scan replaced to just meet the timing and area constraints while offering significant testability for the design. What is needed is a system that effectively determines a set of sequential cells within a design that can be scan replaced while satisfying given timing and area constraints of the design. The present invention provides this functionality. Further, what is needed is a system that can perform the above based on iterations through determined critical paths of the design. The present invention additionally provides this functionality.

Accordingly, the present invention advantageously provides a system for effectively determining the amount of sequential cells within a design that can be scan replaced while satisfying given timing and area constraints of the design and still offering significant testability for the design. It is an object of the present invention to provide the above within a selected set of scan cells that attempts to offer a high degree of testability given the timing and area constraints to be satisfied. It is an object of the present invention to provide a subtractive system for performing the above wherein a fully scan replaced netlist (that violates timing and area constraints) is input and selected cells are unscanned until the timing and area constraints are met. It is another object of the present invention to provide an additive system wherein an unscanned netlist is received, and using a cell based or a critical path based system, cells are scanned that do not make the timing of the original system any worse than originally submitted until a significant number of sequential cells are scan replaced or area constraints are violated. These and other objects of the present invention not specifically recited above will become clear within discussion of the present invention herein.

SUMMARY OF THE INVENTION

A computer implemented process and system are described for effectively determining a set of sequential cells within a integrated circuit design that can be scan replaced (e.g. for design for test applications) to offer significant testability while still maintaining specified timing and area constraints that are applicable to the design. The novel system selects sequential cells of the set for scan replacement that offer best testability contribution while not selecting sequential cells for scan replacement that do not offer much testability contribution and/or are part of most critical paths within the design.

The novel system is composed of a subtractive method and an additive method that individually operate on different netlist types. The subtractive method inputs a fully scan replaced netlist (e.g., the sequential cells are call scan replaced) that does not meet determined optimization (e.g., area and/or timing) constraints. The subtractive process of the present invention can receive input, for example, from the output of a test ready compiler (TR) also of the present invention. The novel subtractive system unscans selected scannable cells until the timing constraints are met if a timing critical flag is set by the user. Additional cells are unscanned if area constraints are violated. Selection for unscanning is based on a testability cell list (TCL) that ranks cells by their degree of testability contribution; those cells with low degrees of testability are unscanned first. The additive process of the present invention receives an unscanned netlist (the "original design") and scan replaces cells using the TCL until area constraints are violated or, if a timing-critical flag is set, until the performance of the design having the scan replaced cells are worse than the original design. An unscanned netlist for the additive process can be output from an conventional compiler or can be an imported netlist. The additive system iterates through the TCL list with the cells offering the most contribution for testability scan replaced first. Cells on critical paths, or subcritical paths that become critical when the cells are replaced, are not replaced if the user has asserted a timing-critical flag.

The present invention also includes a computer implemented process and system for electronic design automation (EDA) using groups of multiple cells having loop-back connections for modeling port electrical characteristics. Multi-bit cells have multiple gates of the same function implemented within a same cell. Multi-bit components have multiple multi-bit cells implemented within a same component. Scannable multi-bit cells and components are similar to multi-bit cells and components but contain scannable sequential elements with scan chains installed. Multi-bit cells may or may not have each sequential cells' input and each sequential cells' output available externally. The scannable sequential elements of a multi-bit component are ordered into a predefined scan chain which is defined by the library containing the multi-bit component or multi-bit cell. During scan replacement processes of the EDA compile process, multi-bit cells and components of the netlist are replaced with scannable multi-bit cells and components. Also, during optimization, multi-bit cells and components undergo equivalence replacement to meet specified constraints (e.g., area, performance, etc.). To model the electrical characteristics of the port during certain optimizations, loopback connections are applied to the multi-bit components from the scan out port to the scan in port of the multi-bit cell or component, therefore, one loopback connection spans multiple sequential cells within the multi-bit cell or component. During certain optimizations, loopback connections are applied to multiple sequential cells that are coupled together but do not necessarily reside in a multi-bit cell or component. By spanning multiple sequential cells, circuit degeneration is reduced thereby providing better circuit optimizations for netlists having scan circuitry.

Specifically, embodiments of the present invention include, in a computer system having a processor coupled to a bus and a memory coupled to the bus, a computer implemented subtractive method of generating a netlist having scannable sequential cells and satisfying determined optimization constraints (e.g., timing and area constraints), the method comprising the computer implemented steps of: receiving a ranked list ordering sequential cells by their contribution to testability; receiving a fully scan replaced input netlist including scannable sequential cells, the input netlist not satisfying one of the determined optimization constraints (e.g., area and/or timing); if timing constraints are violated and the user has asserted a timing-critical flag, determining a set of critical paths within the input netlist by performing a timing analysis on the input netlist and selecting a selected critical path of the set of critical paths and identifying a first and a second sequential cell located on either end of the selected critical path and if both sequential cells are scannable, determining, using the ranked list, which sequential cell of the selected critical path contributes least to testability and unscanning that sequential cell; repeating the above while critical paths with scannable sequential cells exist within the set of critical paths; and provided area constraints are violated, continue unscanning scannable cells that contribute least to testability until either area constraints are met or until there are no more scannable cells in the netlist.

Embodiments further include the above and wherein if only one sequential cell of the first and second sequential cells is scan replaced, unscanning it regardless of the ranked list. Embodiments further include the above and wherein the input netlist includes a loopback connection associated with each scannable sequential cell. Embodiments of the present invention include the above and wherein the ranked list comprises a list of sequential cells, each sequential cell having a rank number identifying its relative contribution to testability, and wherein sequential cells are determined to contribute least to testability by their rank number within the ranked list. The present invention also includes a computer system implemented in accordance with the above.

Embodiments of the present invention also include, in a computer system, an additive method of generating a netlist having scannable sequential cells and satisfying determined optimization constraints (e.g., timing and area constraints), the method comprising the computer implemented steps of: (a) accessing a ranked list ordering sequential cells by their contribution to testability; (b) accessing an unscanned input netlist including unscanned sequential cells; (c) selecting a selected unscanned sequential cell from the ranked list starting from an end of the ranked list that identifies sequential cells having high contributions to testability; (d) scanning the selected unscanned sequential cell, provided the step of scanning does not worsen timing characteristics or violate timing constraints of the input netlist, wherein the step (d) further comprises the steps of: (1) copying the input netlist to generate an input netlist copy; (2) scanning the selected unscanned sequential cell within the input netlist copy; (4) determining the worst critical path of the copy of the input netlist; (5) summing the areas of each logic and routing element of the input netlist copy to determine an area of the input netlist copy; (6) scanning the selected unscanned sequential cell within the input netlist provided the worst critical path of the input netlist copy is not worse than the worse critical path of the input netlist and provided the area of the input netlist copy does not violate the area constraints; (e) selecting a next selected unscanned sequential cell from the ranked list; and (f) repeating steps (d)–(e) for each unscanned sequential cell within the ranked list. The present invention also includes a computer system implemented in accordance with the above.

Embodiments of the present invention also include a method, in an electronic design automation system, of generating a netlist description comprising the computer implemented steps of: a) accessing an HDL specification representing an integrated circuit to be realized in physical form and accessing constraints applicable to the design; b) compiling the HDL specification with a compiler to produce a netlist description of the integrated circuit wherein the netlist description comprises multi-bit cells, multi-bit components and combinational logic, the step b) comprising the steps of: b1) inserting scannable multi-bit cells and scannable multi-bit components by replacing the multi-bit cells and the multi-bit components with equivalent scannable multi-bit cells and equivalent scannable multi-bit components, respectively; and b2) installing a loopback connection between a scan-out port of a respective scannable multi-bit cell and a scan-in port of the respective scannable multi-bit cell; and b3) installing a loopback connection between a scan-out port of a respective scannable multi-bit component and a scan-in port of the respective scannable multi-bit component; and c) storing the netlist description into computer memory.

Embodiments also include the above and wherein the step b) further includes the step of b4) optimizing the scannable multi-bit cells and the scannable multi-bit components according to the constraints by utilizing the loopback connections installed by steps b2) and b3) to simulate electrical characteristics of scan-in and scan-out ports of the scannable multi-bit cells and the scannable multi-bit components and wherein the step b4) comprises the steps of: installing a long loopback connection over multiple scan cells wherein the long loopback connection is coupled to a scan-in port of a first scan cell of the multiple scan cells and also coupled to a scan-out port of a last scan cell of the multiple scan cells; optimizing using the long loopback connection which prevents circuitry degeneration of the first and last scan cells; and removing the long loopback connection.

DETAILED DESCRIPTION OF THE INVENTION

In the following detailed description of the present invention, an electronic design automation process that makes use of loopback connections that span across multi-bit cells, multi-bit components and multi-cell groups, numerous specific details are set forth in order to provide a thorough understanding of the present invention. However, it will be obvious to one skilled in the art that the present invention may be practiced without these specific details. In other instances well known processes, methods, procedures, components, and circuits have not been described in detail as not to unnecessarily obscure aspects of the present invention.

Some portions of the detailed descriptions which follow are presented in terms of procedures, processes, and symbolic representations of operations on data bits within a computer memory. These procedure descriptions and representations are the means used by those skilled in the data processing arts to most effectively convey the substance of their work to others skilled in the art. A procedure, process, or logic block is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or executing a procedure or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 2:
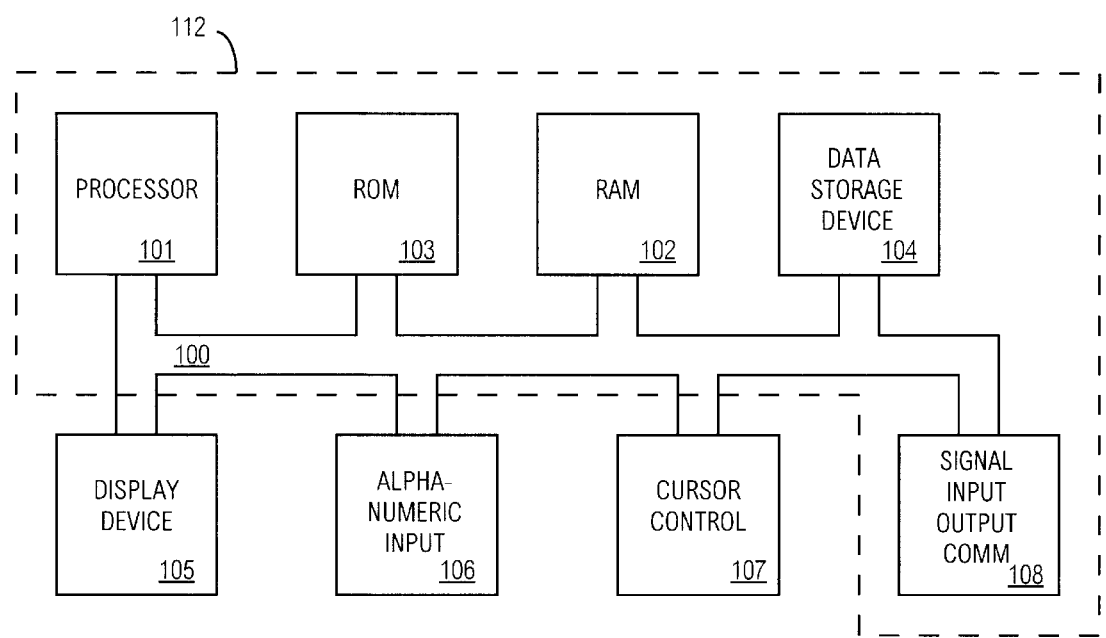
FIG. 2 is an exemplary computer system used in accordance with the present invention as a CAD system for design synthesis.

Specific aspects of the present invention are operable within a programmed computer aided design (CAD) system. A CAD system operable to implement the elements of the present invention is shown in FIG. 2. In general, the CAD system of the present invention includes a computer system 112 which includes a bus 100 for communicating information including address, data, and control signals, a central processor 101 coupled with the bus 100 for processing information and instructions, a random access memory 102 coupled with the bus 100 for storing information and instructions for the central processor 101, a read only memory 103 coupled with the bus 100 for storing static information and instructions for the processor 101, a data storage device 104 such as a magnetic or optical disk and disk drive coupled with the bus 100 for storing information and instructions, a display device 105 coupled to the bus 100 for displaying information to the computer user, an alphanumeric input device 106 including alphanumeric and function keys coupled to the bus 100 for communicating information and command selections to the central processor 101, a cursor control device 107 coupled to the bus for communicating user input information and command selections to the central processor 101, and a signal generating device 108 coupled to the bus 100 for communicating signals that are input and output from the system 112.

Program instructions executed by the CAD system can be stored in RAM 102, ROM 103, or in the storage device 104 and when executed in a group can be referred to as logic blocks or procedures. It is appreciated that data produced at the various logic synthesis stages of the present invention, including representations of the different levels of abstraction of the integrated circuit design, can also be stored in RAM 102, ROM 103 or the storage device 104 as shown in FIG. 2.

The display device 105 of FIG. 2 utilized with the computer system 112 of the present invention may be a liquid crystal device, cathode ray tube, or other display device suitable for creating graphic images and alphanumeric characters recognizable to the user. The cursor control device 107 allows the computer user to dynamically signal the two dimensional movement of a visible pointer on a display screen of the display device 105. Many implementations of the cursor control device are known in the art including a trackball, mouse, joystick or special keys on the alphanumeric input device 105 capable of signaling movement of a given direction or manner of displacement.

Figure 3A:
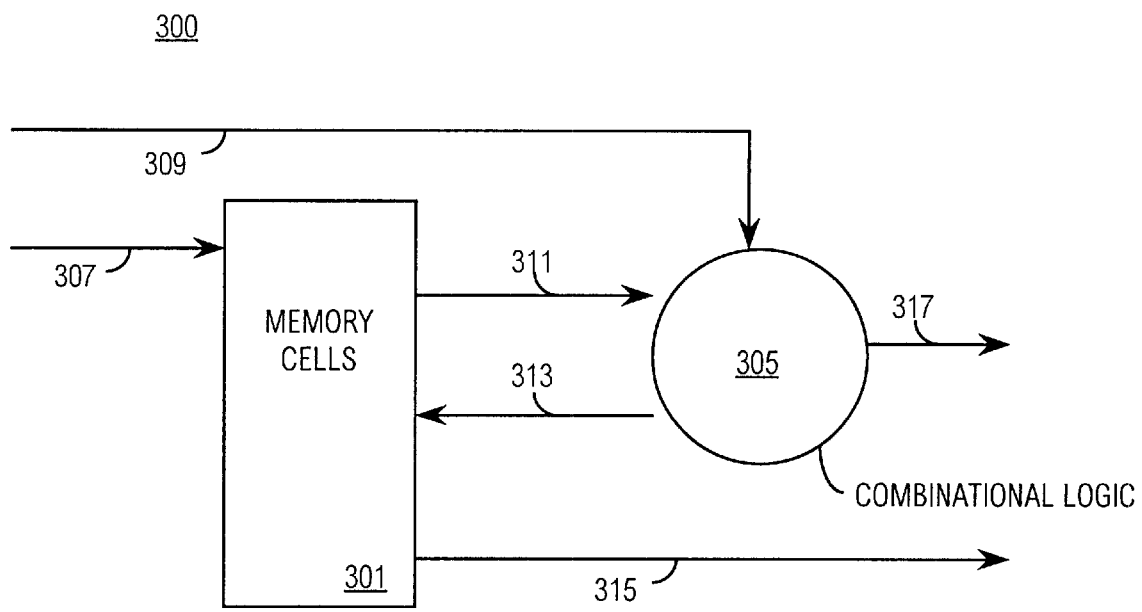
FIG. 3A is a diagram of a logic model including combinational logic and memory cells used by the present invention to represent the design of a synthesized integrated circuit.

FIG. 3A illustrates a circuit model 300 utilized by the present invention to represent a logic unit of an integrated circuit. The model 300 includes a memory cell block 301 that outputs signals over line 311 to a combinational logic block 305. Combinational logic 305 also outputs signals over line 313 to drive inputs of the memory cells 301. Memory 301 receives a primary input signal 307 which typically originates off chip. Combinational logic block 305 also receives a primary input signal 309 which typically originates off chip. Memory block 301 generates a primary output signal 315 that goes off chip and combinational logic block 305 also generates a primary output signal 317 that goes off chip. According to model 300, memory block 301 is composed either of edge sensitive clocked memory cells (e.g., flip-flops) or level sensitive memory cells (e.g., latches or registers) or can be composed of other cell types. A variety of memory modes or styles, including either of the memory modes described above, are acceptable within the present invention. For purposes of explanation, the memory cell style adopted within discussions herein is the edge triggered flip-flop but the present invention is equally adapted for other styles such as level sensitive modes, e.g., Level Sensitive Scan Design (LSSD) modes, clocked scan modes, clocked LSSD modes, and auxiliary clocked LSSD modes.

As shown by FIG. 3A, portions of combinational logic 305 that are directly stimulated by primary input 309 and that are directly coupled by its output to primary line 317, can be readily tested for faults (faulty circuitry) by direct application of test vectors (predetermined data patterns) over line 309 and by direct observation of the output over line 317. However, this represents only a small percentage of the logic of block 305. In typical applications, most of the logic gates within block 305 receive their inputs from memory cells within 301 and forward their outputs to other memory cells within 301. In order to accurately test the combinational logic within block 305, DFT processes provide a mechanism for isolating different logic groups within block 305 by (1) passing test vectors into the memory cells 301, (2) allowing the stimulated logic groups to store the product information in predetermined memory cells, and then (3) recalling the output from stimulated portions of block 305 from memory 301.

In effect, test vectors are scanned into the memory cells during test mode, the combinational logic is operated and its output is then captured in the memory cells to be scanned out.

Figure 3B:
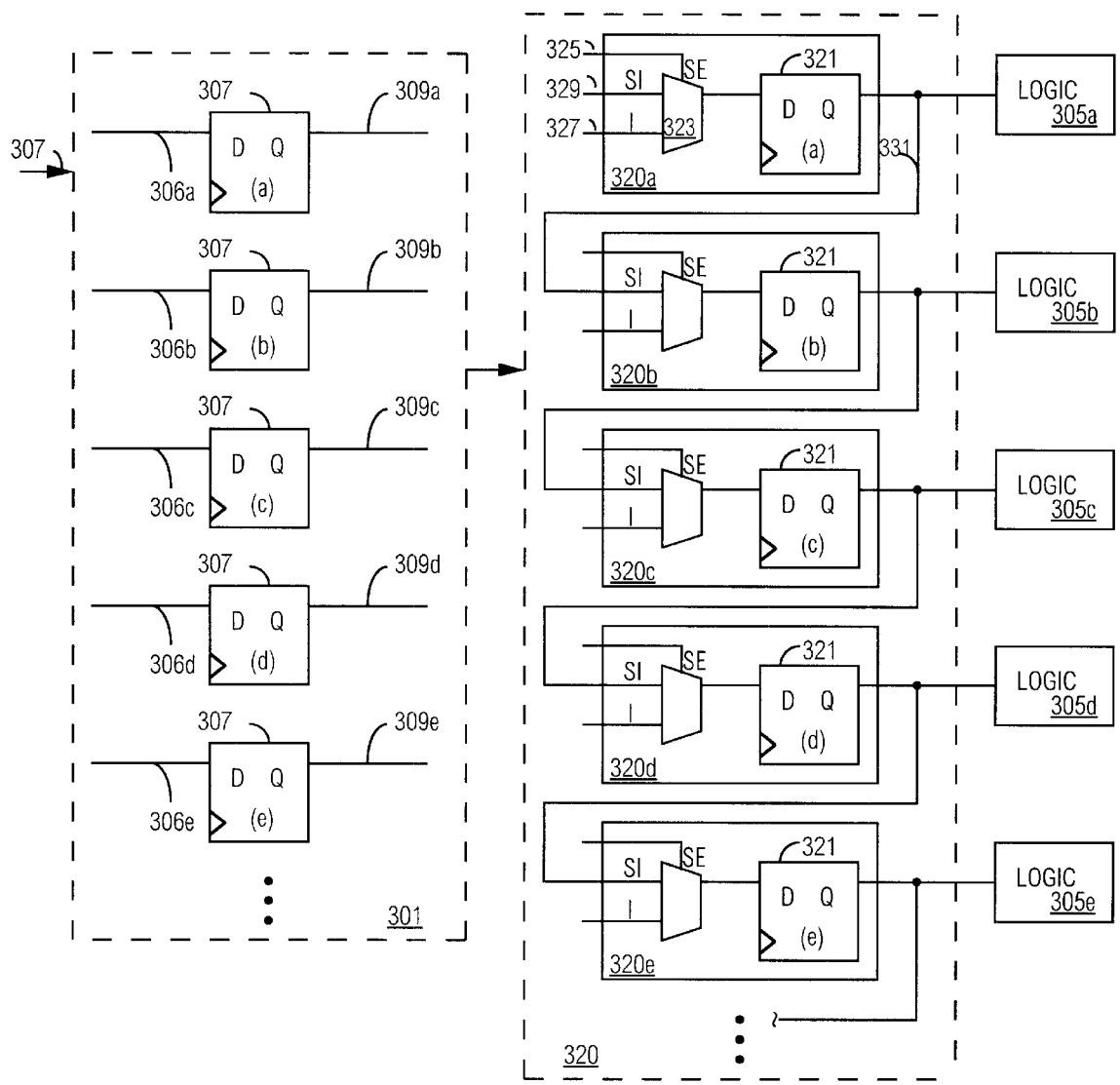
FIG. 3B illustrates replacement performed by the present invention from non-scan memory cells specified by or inferred from the original HDL description into scannable memory cells used for DFT implementation.

FIG. 3B illustrates a portion of the structure of the mapped memory cells within unit 301 as typically specified or inferred in an HDL circuit description without the addition of test circuitry; these cells are called non-scan cells. Unit 301 consists of a plurality of individual non-scan memory cells. In this example, five exemplary D flip-flops are illustrated 307a–307e. Each non-scan memory cell 307a–307e receives an input 306a–306e from either a primary input off chip, from the combinational logic block 305, or from another memory cell within block 301. These non-scan memory cells also have outputs 309a–309e that typically drive combinational logic gates or other memory cells or can be a primary output that goes off chip.

Within one embodiment, a scan replacement process of the present invention replaces the non-scan memory cells 307a–e of unit 301 with scannable memory cells 320a–e (FIG. 3B) that are provided for DFT functionality and links them together to form a scan chain. A scannable memory cell is also called a test memory cell. Memory cells are also called sequential cells. The result is shown in memory unit 320 of FIG. 3B which contains scannable memory cells 320a–e in a scan chain configuration. This configuration 320 accommodates testability for stuck at faults and allows loading of test vectors into the cells and scanning of certain data out of the cells in response to the application of the test vectors.

Herein, a non-scan or unscan memory cell indicates a memory cell that does not support scanning, e.g., cell elements 307a–e of FIG. 3B. A scan cell or scannable cell indicates a memory cell that supports scanning, e.g. cells 320a–e of FIG. 3B. An unscannable or nonscannable memory cell indicates a memory cell that is violated or otherwise user indicated as not to be scanned.

The scannable memory cells 320a–e in this example consist of multiplexed input D flip-flops and are linked together in chains, as shown, to form shift register configurations. Each particular scannable memory cell can be analogous to each other cell, so one cell 320a is described herein. Scannable cell 320a contains a memory cell 321a and a multiplexer 323. The D input of cell 321a is coupled to the output of a multiplexer 323 which has a select line input 325, called the scan enable or SE line. The data inputs to the mux 323 are (1) an I input 327 analogous to input 306a from unit 301 and (2) an SI shift input 329 which originates from a previous scannable memory cell or from a primary input provided cell 320a is the first cell in a scan chain. It is appreciated that the output of the mission mode logic 305a is typically routed (e.g., by a designer) to the I inputs 327 of the scannable memory cells for observation or to a primary output. The output 331 of cell 321a is routed to mission mode circuitry 305a of the combinational logic 305 and is also routed to another scannable memory cell (e.g., 320b) or to a primary output, if this cell is the last cell of a scan chain. It is appreciated that the Q or /Q output pin can be utilized in the chaining configuration.

In this configuration, scannable memory cells 320a–e comprise an exemplary scan chain because the output of one sequential cell is coupled to the input of an adjacent sequential cell.

The circuitry shown in unit 320 has two modes, mission and test. In mission mode, the SE lines are not asserted and data is selected by the mux from the I inputs. In test mode, the SE inputs of each scannable memory cell 320a–e are asserted such that the shift inputs SI are active and a test vector (string of bits) can be inserted into the integrated circuit through a primary input and shifted through the scannable memory cells 320a–e and then applied to the appropriate logic 305a–e coupled thereto. The product information generated by the tested logic (305a–e in this example) is then stored in a scan chain and shifted out to a primary output for observation. In this manner, the testability of the combinational logic. block 305 is greatly enhanced as logic essentially buried deep within a pipeline of the integrated circuit (e.g., coupled only to scannable memory cells) can be directly isolated and tested by shifting test vectors into a scannable memory cell chain and then shifting the product back out to a scannable memory cell chain for observation.

Not all scannable memory cells can be included within a scan chain for a variety of reasons. Some memory cells do not offer a scan-in ability or do not offer a scan-out ability due to logic considerations. Further, some cells cannot capture data at their data in port. Also, some memory cells directly control the reset, clock or input line of another memory cell in a scan chain. In this case, when the test vector is loaded into the scan chain, portions of the test vector can be altered, e.g., where the test vector data loaded into a first scan cell is used as a set or reset signal applied to a second scan cell thereby overwriting the test data in the second scan cell of the scan chain. Lastly, some memory cells, after the scan chain is constructed, do not offer scannability for various logic reasons, e.g., the clock input is not clocked properly.

Figure 4:
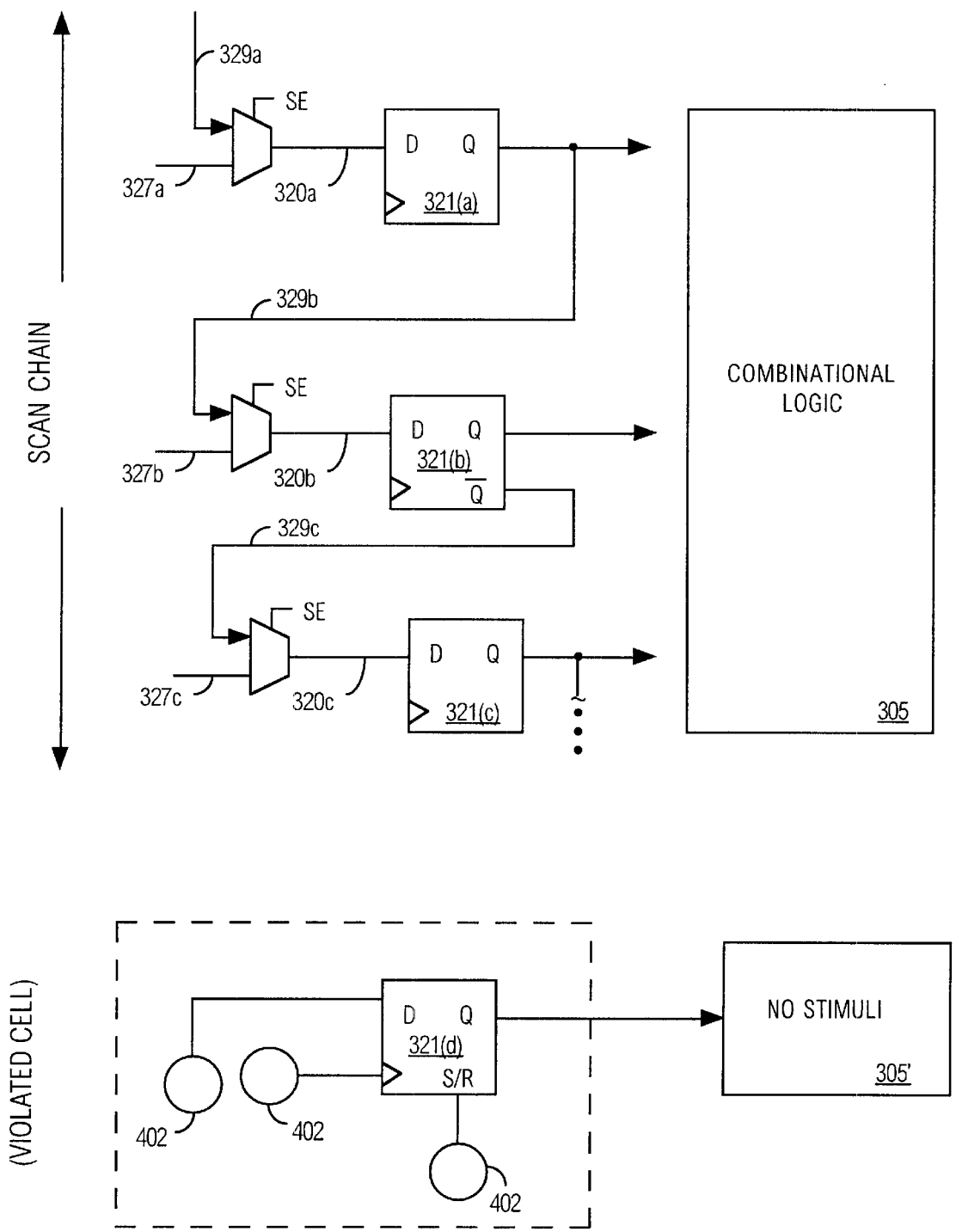
FIG. 4 illustrates a procedure of the present invention (Design Rule Checker) that determines valid scan chains and marks as violated any scannable memory cell not part of a valid scan chain.

Memory cells that cannot be placed into a scan chain are violated by the present invention and removed from its scan chain. FIG. 4 illustrates an exemplary violated memory cell. A sample scan chain as output from constraint driven scan insertion block 645 of the present invention (FIG. 8) is shown including scannable memory cells 320a–320c of memory unit 301. Block 645 is described further below. Assume that logic block 402 of FIG. 4 is a scannable memory cell and directly controls either the clock input or the set/reset input of memory cell 321d. Because memory cell 321d is directly controlled by another sequential element, this memory cell 321d is violated (e.g., eliminated) from the scan chain so that only cells 321a–c remain in the chain. As shown in FIG. 4, the violated cell 321d is not scan replaced. Cell 321c can be the last memory cell of the scan chain or can be coupled to another memory cell (not shown). In either case, the output of cell 321c is not coupled to violated cell 321d.

Although not shown, it is appreciated that combinational logic 305 outputs to primary outputs (off chip) or to scannable memory cells. The present invention utilizes a well known procedure, Design Rule Checking (DRC), to perform the above analysis to check for violated scan cells. No meaningful observations are possible for circuitry coupled to violated memory cells.

An unfortunate result of violating memory cell 321d is that the combinational logic block 305' is no longer able to be stimulated by the DFT circuitry. It is appreciated that if a memory cell is violated that happens to be the observation cell for block 305', instead of being the stimulus cell, this condition also results in block 305' falling out of the DFT circuitry because its results cannot be observed. As discussed further below, the design rule checking (DRC) process of the present invention determines which scans cells to violate of a constructed scan chain and also performs other functions. A violated scan cell is called an unscannable memory cell.

As discussed further below, the computer implemented TR compiler 625 (FIG. 8) of the present invention performs two important functions in predicting the impact of the DFT circuitry on the mission mode circuitry. First, the TR compiler 625 of the present invention replaces the non-scan cells (e.g., HDL specified or inferred memory cells) with scannable memory cells. An HDL specified or inferred memory cell is a non-scan memory cell. This process includes an equivalence test in order to provide the proper scannable memory cell for replacement. Secondly, in order to simulate the presence of the links that connect the scannable memory cells into chains, the TR compiler 625 of the present invention provides loopback circuits that couple the output (either Q or /Q) of a given scannable memory cell back to the scan input (SI) of the same memory cell. This loopback connection provides the TR compiler 625 of the present invention with enough information to determine the electrical impact of the DFT circuitry on its design without knowing the actual routing of the chain, which will be determined by subsequently driven processes. In this way, the TR compiler 625 of the present invention can generate its design with enough information regarding the DFT circuitry so that the circuit constraints associated with the HDL specification can more likely be satisfied when the DFT circuitry is completed. The loopback connection is discussed in more depth further below.

Figure 5A:
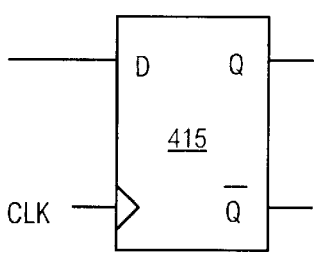
FIG. 5A illustrates an exemplary edge triggered D flip-flop used in the HDL description in an embodiment of the present invention.
Figure 5B:
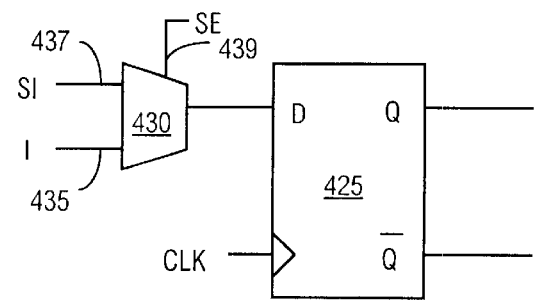
FIG. 5B illustrates an exemplary scannable memory cell version of the memory cell presented in FIG. 5A according to an embodiment of the present invention.

FIG. 5A illustrates a sample non-scan memory cell. The exemplary cell 415 shown in FIG. 5A is an edge triggered D flip-flop, however, the present invention can readily operate with a level sensitive latch or register (e.g., LSSD mode). Once the TR compiler 625 of the present invention performs its mapping functions with a particular technology, the TR compiler 625 replaces the HDL memory cell 415 with an equivalent scannable (or "test") memory cell 425 shown in FIG. 5B. As shown in FIG. 5B and discussed previously, a scannable edge triggered memory cell 425 contains a multiplexed input with mux 430 driving the D input. The mux 430 receives two inputs, an SI input 437, which is a scan input, and another input, I, 435, which is a data input. A scan enable select line SE 439 provides the selection control for data or scan input. Using line 439, scan input (SI) is selected during test mode and data input (I) is selected during the mission mode.

Figure 5C:
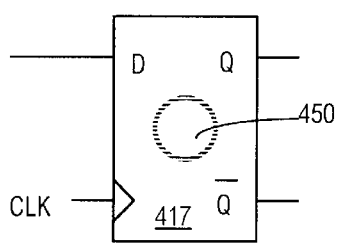
FIG. 5C illustrates an exemplary edge triggered memory cell used in the HDL description that also contains other combinational logic in addition to the memory cell circuitry.
Figure 5D:
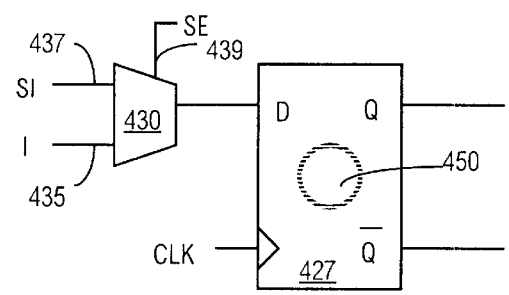
FIG. 5D illustrates an exemplary scannable memory cell version of the memory cell presented in FIG. 5C according to an embodiment of the present invention including other combinational logic present.

As is often the case, memory cells contain additional circuitry aside from the circuitry that performs their sequential memory functions. FIG. 5C illustrates one exemplary non-scan memory cell 417 that also contains combinational logic 450 in addition to its circuitry to perform its memory functions. The TR compiler 625 of the present invention will account for this combinational logic 450 when determining an equivalent scannable memory cell for replacement. This determination process is called scan equivalence and is described in more detail below. FIG. 5D illustrates an equivalent scannable (or "test") memory cell 427 that contains the combinational logic 450 that was also present in the non-scan memory cell 417 of FIG. 5C as well as the multiplexed input to provide for scan chaining. In this fashion, the scannable memory cell 427 is equivalent to the non-scan memory cell 417 and will be used by the TR compiler 625 of the present invention to replace cell 417.

Figure 6A:
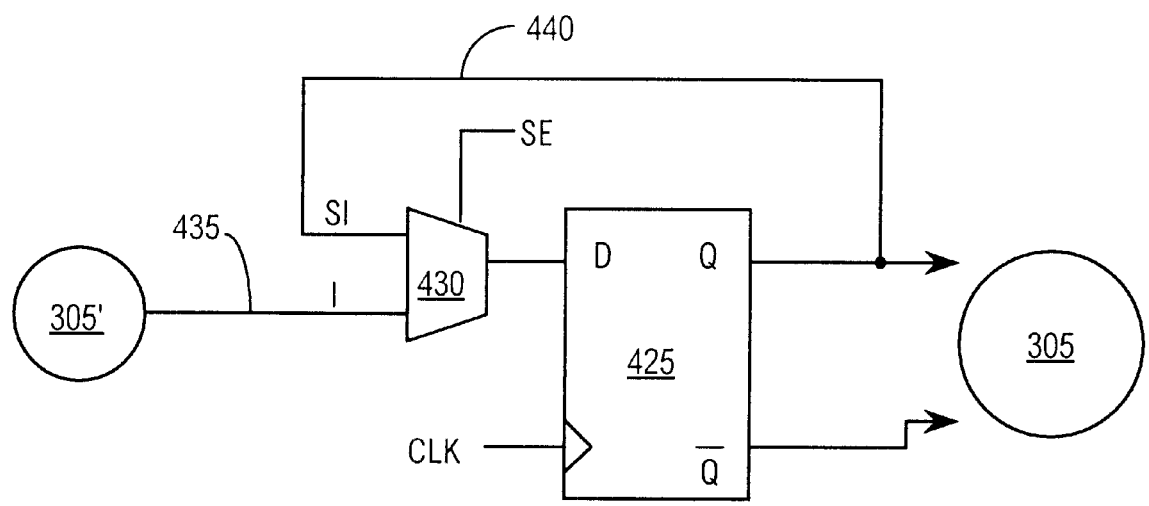
FIG. 6A illustrates an exemplary circuit implementation of a loopback line added by the test ready (TR) compiler of the present invention to simulate a linked scan chain where the loopback is taken from the output (Q).

After the sequential circuitry (e.g., the memory cells) have been replaced with scannable memory cells, the present invention TR compiler 625 provides loopback connections to effectively simulate the scannable memory cells in a scan chain configuration. FIG. 6A illustrates a loopback connection 440 of the present invention from the Q output of scannable memory cell 425 to the scan input SI of mux 430. In operation for DFT purposes, while memory cell 425 will not be so coupled, the loopback connection 440 will accurately simulate the electrical characteristics seen by the Q output port of cell 425 because, in a scan chain, this port will likely be coupled to another scannable memory cell having similar input characteristics as mux 430 and since the compile wire model uses a unit delay model for this connection. Similarly, the loopback connection 440 accurately simulates the electrical characteristics seen by the mux 430 of cell 425 because in its scan chain mux 430 will likely be coupled to another scannable memory cell having similar output characteristics as the Q output of cell 425 and since the compile wire model does not distinguish between inter and intra module connections. As shown in FIG. 6A, the I input of mux 430 can be coupled to other combinational logic 305' over line 435 and the Q and /Q outputs of cell 425 can be coupled to combinational logic 305.

During compilation, the TR compiler 625 of the present invention will therefore accurately operate on this scannable memory cell 425 with the loopback connection so that constraints will more likely be met after the DFT circuitry is complete.

Figure 6B:
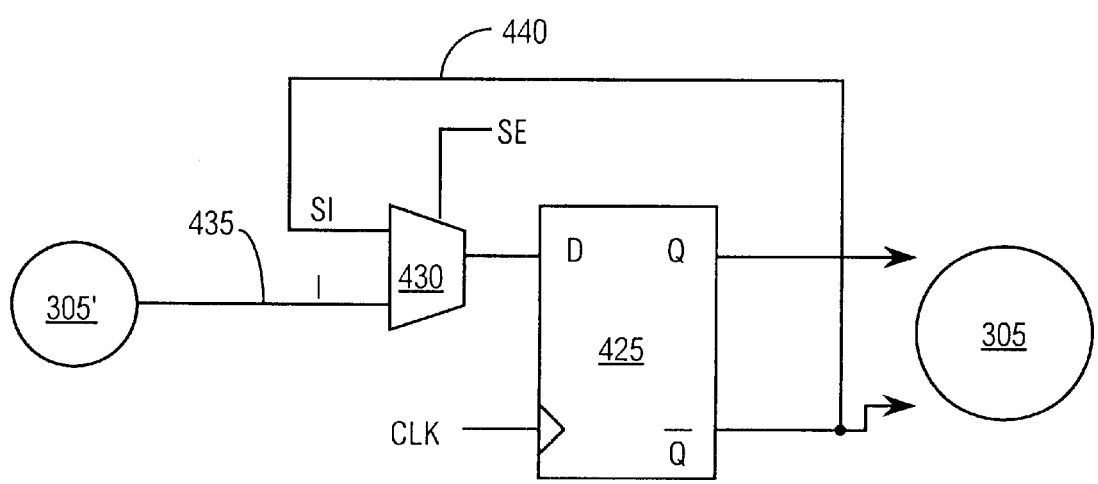
FIG. 6B illustrates an exemplary circuit implementation of a loopback line added by the TR compiler of the present invention to simulate a linked scan chain where the loopback is taken from the inverted output (/Q).

It is appreciated that the loopback connection 440 employed by the TR compiler 625 of the present invention can also originate from the /Q output of cell 425 as shown in FIG. 6B. Here, the loopback connection 440 is coupled from the /Q port of cell 425 to the SI input of mux 430. The selection of Q or /Q will depend on information determined by the TR compiler of the present invention. This information can originate from library attribute information (e.g., indication of a test scan out) associated with the scan cell. It is appreciated that the selection of Q or /Q is not vital to the present invention because logically either output of cell 425 can be utilized for the scan chain. What is important, however, is that at least one output Q or /Q be selected with a loopback connection 440 for optimization. As shown in FIG. 6B, the I input of mux 430 can be coupled to other combinational logic 305' over line 435 and the Q and /Q outputs of cell 425 can be coupled to combinational logic 305.

Figure 7:
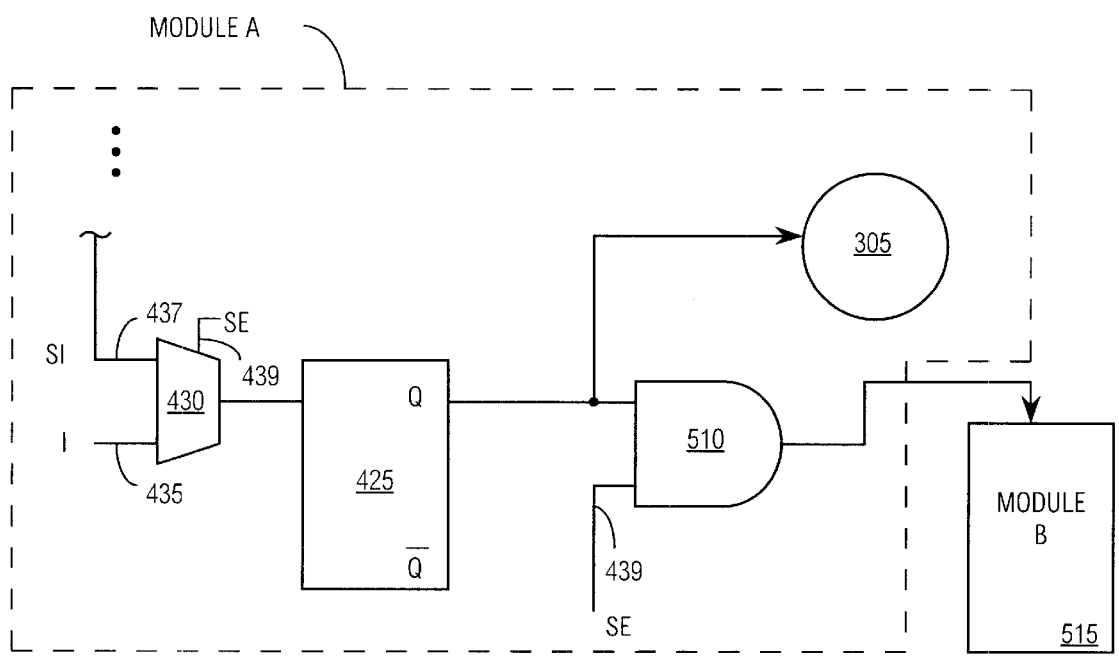
FIG. 7 illustrates a task performed by the modified scan insertion process of the present invention where the scan chain is buffered in links that span more than one module allowing the loopback lines to accurately simulate this condition.

FIG. 7 illustrates a circuit modification performed by the present invention after the TR compiler 625 is run. Since scan chains can span between module, this modification occurs when a link of a scan chain spans more than one module. A module represents a design portion that can be separated by some area within the integrated circuit. The TR compiler 625 applies a unit delay associated with each loop back connection 440 which will accurately characterize most scan links that are intra-module but will not accurately model scan links that are inter-module. In the latter case, a gating element is added to satisfy the assumption made by the TR compiler 625.

In FIG. 7, the link spans between two memory cells, one in module A (cell 425) and another in module B (not shown). In these cases, the modified scan insertion process (to be discussed below) of the present invention places a gate 510 (e.g., an AND gate) in the link between the modules. One input of the gate 510 is coupled to scan enable (SE) line 439. With the gate 510 inserted in the scan connection; this physically disables the scan path when SE 439 is not asserted. All the scan path sees electrically is the capacitance of the gate input. Within the wire model of the TR compiler 625, a unit delay is assumed for this scan path. Using the configuration of FIG. 7, the loopback connection 440 of the present invention effectively simulates the mission mode characteristics of this link because the gate 510 hides the mission effects of the long scan link between modules A and B as seen by the Q output of cell 425 and is consistent with the assumptions made by the TR compiler 625. Thus, the addition of gate 510 accurately models the unit delay assumption made in the TR compiler 625 for the scan link.

Figure 8:
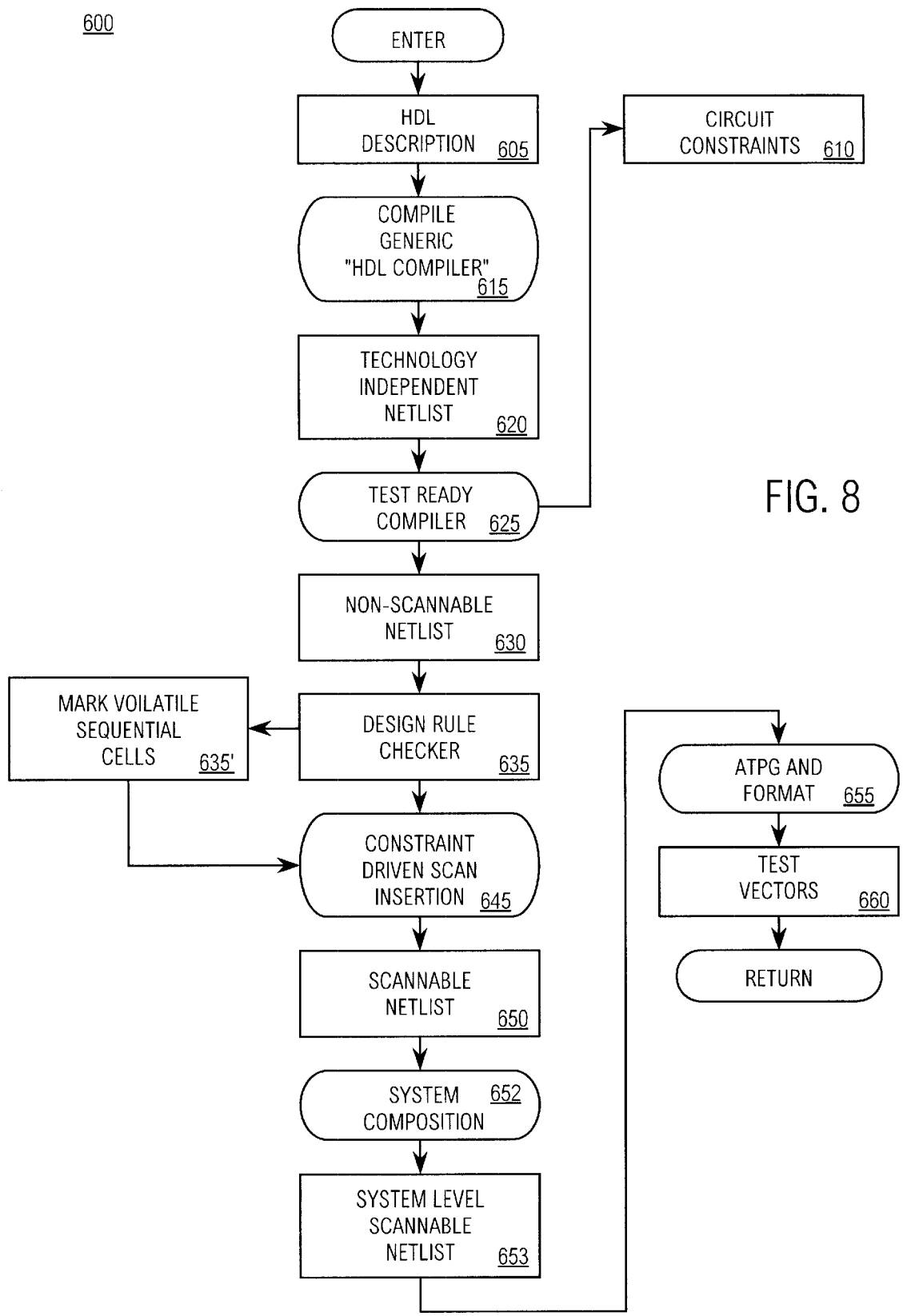
FIG. 8 is an overall flow diagram of the embodiments of the present invention starting from HDL description to the generation of test vectors having a scannable gate level netlist.

FIG. 8 illustrates an overall flow diagram of a synthesis process 600 in accordance with embodiments of the present invention and its logic blocks are implemented within the computer controlled CAD system described above. Flow 600 includes the TR compiler (test ready compile) 625 of the present invention and the modified scan insertion procedure 645 (constraint driven scan insertion) of the present invention. Flow 600 also includes a generic HDL compiler 615 which will be described below but is different from the TR compiler 625 of the present invention. Generic compiler 615 is analogous to generic compiler 203.

The flow 600 receives an HDL description 605 of an integrated circuit layout along with a set of design constraints 610 (including design rule limitations, and performance limitations, such as area, timing, power, etc.) that are pertinent to the circuit described by the HDL description 605. Design rules as used herein refer to maximum fanout, maximum signal transition time, and maximum node capacitance. The HDL description 605 can be of a number of different formats, such as VHDL or Verilog and can also represent an entire IC design, but typically represents a module of the overall IC design. The HDL description 605 can be stored in a computer memory unit (e.g., unit 102 or 104) and is fed into an optional generic compiler logic block 615 that is well known in the art. This generic compiler 615 transforms the HDL description 605 into a technology independent netlist 620 that is more readily recognized by the TR compiler 625. Block 615 performs a process on the input netlist 620 to generate a technology independent or generic netlist of the IC layout by interfacing with a synthetic library or "designware" library. Technology independent netlist 620 is composed of logical primitives and operators of the IC layout but the components described therein contain no structure. The generic compile process 615 and resultant output 620 are well known in the art.

The netlist 620 of FIG. 8 generated by block 615 is input to the TR compiler logic block 625 of the present invention. The TR compiler 625 is described in more detail in FIG. 9 which illustrates the particular stages within the TR compiler 625 where the sequential circuits are replaced and where the loopback connections are inserted. The TR compiler 625 in FIG. 8 performs a process on the generic netlist that interfaces with a technology specific library, "cell" library, so that a mapped netlist can be generated that includes specific structural information about the components used in the compiled design. In addition, the TR compiler 625 of the present invention: (1) replaces the HDL memory cells specified in or inferred from the netlist 620 (e.g., non-scan cells) with scannable memory cells; and (2) inserts loopback connections in each scannable memory cell added. FIG. 5A, FIG. 5B, FIG. 5C and FIG. 5D illustrate the memory cell replacements performed by the present invention while FIG. 6A and FIG. 6B illustrate the addition of the loopback connections performed by the present invention TR compiler 625.

Referring to FIG. 8, by performing the above processes, the TR compiler 625 of the present invention is able to better optimize for the eventual construction and completion of the DFT circuitry. In this way, it is more likely that the resultant test circuit design will meet constraints 610. The output of the TR compiler 625 of the present invention is a non-scannable technology dependent netlist 630 that comprises scannable memory cells with loopback connections 440. Although called "nonscannable" because of the loopback connections, netlist 630 is nevertheless a fully scan replaced netlist in that the TR compiler 625 replaced each HDL specified or inferred sequential cell (e.g., non-scan cell) by an equivalent scannable cell. This netlist 630 can be stored in a memory unit of the computer system such as RAM 102 or the storage device 104 (FIG. 2). The overall non-scannable netlist 630 is optimized to constraints 610 and is a gate level mapped netlist and therefore is technology specific.

The non-scannable netlist 630 of FIG. 8 is then input to a DFT design rule checker logic block 635 ("DRC"). Any of a number of well known DRC processes can operate within the present invention including a DRC as described by E. B. Pitty, D. Martin, and H. T. Ma in a paper entitled "A Simulation-Based Protocol-Driven Scan Test Design Rule Checker," published in IEEE International Test Conference, page 999, paper 40.2 (1994). The DRC 635 checks the scannable memory cells in the netlist 630 to determine which cells should be violated according to the discussion herein with respect to FIG. 4. Processing flows to DRC block 635' where those scannable memory cells that are determined not to be part of a scan chain by DRC block 635 are marked as violated by the DRC at logic block 635'. Cells marked as violated will be unscanned by the modified scan insertion process 645. The act of unscanning replaces the violated memory cells with an equivalent non-scan memory cell. When unscanned, the loopback connection 440 associated with a violated cell is also destroyed. When violated, the memory cell is referred to as unscannable.

Referring to FIG. 8, the output of the DRC block 635' is a non-scannable netlist (like 630) but with the violated memory cells marked so as to be unscanned. The output of the DRC 635' is input to a modified scan insertion and routing logic block 645 of the present invention which is also called "constraint driven" scan insertion. This procedure 645 is further described in FIG. 10. Referring to FIG. 8, the modified scan insertion and routing procedure 645 of the present invention breaks the loopback connections 440 in the scannable memory cells of netlist 630. Also, for memory cells that are not violated but remain non-scanned (e.g., the cells are still HDL specified sequential cells because they were output from a prior art compiler), process 645 replaces the non-scan memory cells with scannable memory cells. It is appreciated that the TR compiler 625 of the present invention does not output any non-scan yet not violated memory cells to logic block 645. Logic block 645 also unscans any memory cell marked as violated.

Logic block 645 of FIG. 8 allocates resources to construct the scan chains between the scannable memory cells. Well known methods and procedures for linking scannable memory cells can be used to create the scan chains for DFT. The present invention modified scan insertion process 645 then performs a reduced set of compiler procedures (constraint driven procedures) that are described with reference to FIG. 11A and FIG. 11B in order to efficiently and effectively optimize the resultant circuitry to the original constraints 610. These compiler routines of logic block 645 are different from the incremental compile step of the prior art in that there are different levels of user selectable effort applied to the compilation process, some of which are applied only to the circuitry added for DFT implementation. The resulting process is more efficient and requires substantially less time to process while yielding excellent results in optimizing the overall circuit layout to the constraints.

The output of logic block 645 of FIG. 8 is a mapped scannable netlist 650 at the gate level. This netlist 650 contains valid scan chains of scannable memory cells used to receive test vectors. The netlist 650 is incorporated, along with other module scannable netlists, into a scannable system netlist 653 by system composition block 652. The system level scannable netlist 653 is then input to an automatic test pattern generation procedure (ATPG) 655. ATPG procedures are well known in the art and are used to generate the test vectors 660. If the netlist 650 contains a full scan then a combinational ATPG process can be used at logic block 655 to generate the test vectors. If the netlist 650 is the result of a partial scan, in which only some of the memory cells are scanned while others are not, then a sequential ATPG process can be executed at block 655 to generate the test vectors. Both the combinational and sequential ATPG processes are well known. Also at block 655, ATPG formatting is performed in which the test vectors generated by the ATPG processes are altered or modified so that they will operate with a particular specified set of test equipment that accepts a particular format as input.

The test vectors 660 generated from block 655 are therefore customized to a particular test equipment protocol. These test vectors 660 can then be used along with the particular test equipment to load test vectors into the result IC chip to check for faults within the chip.

FIG. 8 illustrates two separate embodiments of the present invention. The first embodiment is the sequential element replacement and the addition of the loopback connections in the TR compiler 625 of the present invention. The second embodiment represents the addition of the reduced set of compile steps (e.g., constraint driven) performed by the modified scan insertion process 645 of the present invention. Both of these processes are described in more detail to follow.

TEST READY COMPILER

Figure 9:
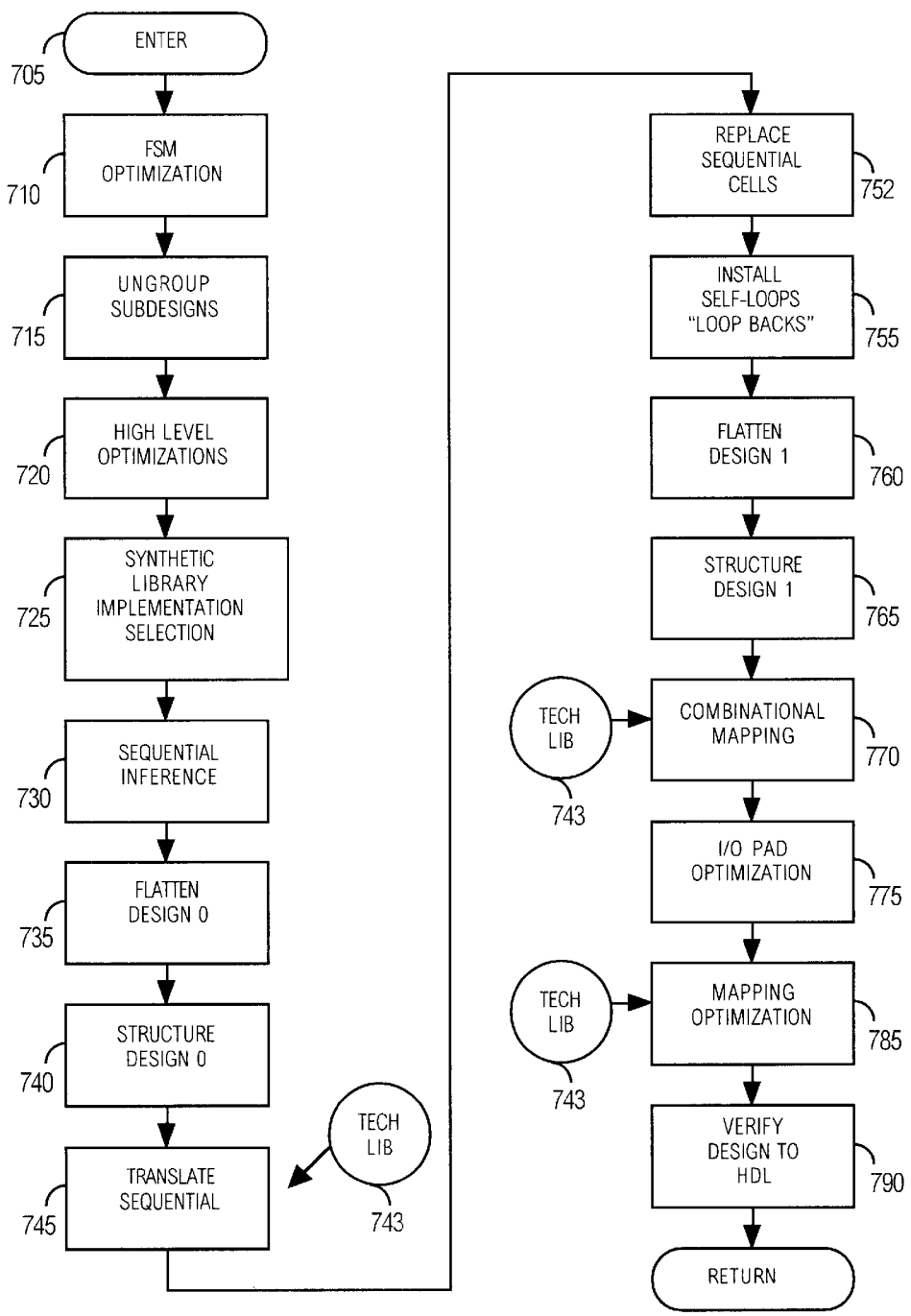
FIG. 9 is a flow diagram illustrating processes of the test ready (TR) compiler of the present invention.

FIG. 9 illustrates processes of the computer system 112 implemented TR compiler 625 of the present invention. As will be discussed below, several of the processes (e.g., logic blocks) shown in FIG. 9 are described for completeness in terms of a particular embodiment of the present invention. Several of these processes are optional and, without departing from the scope of the present invention, can be omitted or replaced with well known procedures. The TR compiler 625 of the present invention starts at logic block 710 (optional) where finite state machine (FSM) optimization is performed. At logic block 710, state machine encoding or descriptions are translated into recognizable or standardized HDL primitives. At logic block 710, the compiler 625 processes each FSM in the design and optimizes their state encoding and then converts them to Boolean equations and technology-independent flip-flops.

At optional logic block 715, subdesigns in the HDL are ungrouped to allow merging of HDL from FSM designs with other HDL portions. By default, subdesigns are compiled hierarchically, preserving their design boundaries. However, this optional logic block 715 will ungroup the subdesigns into their parent designs before being compiled by other procedures. At logic block 720, the present invention TR compiler 625 performs high level optimizations including resource allocation and sharing depending on timing and area considerations. Additional optimizations such as arithmetic optimization and the sharing of common subexpressions are also performed at logic block 720. In resource sharing, when possible, particular operators such as adders, registers, etc. are shared between different expressions.

Referring to FIG. 9, at logic block 725, synthetic library implementation selection is performed. In this process, generic operators are mapped to architectural representations (implementations). Generic operators that can map into more than one architectural generic component are assigned to a particular architectural element based on the constraints 610. At block 725, a technology independent designware library can be used to select to proper architectural representation. The designware library is created by a designware developer.

The implementation used in block 725 is dependent on the defined constraints 610 (FIG. 8) and the results of logic block 725 contain technology independent generic cells. At logic block 730 of FIG. 9, sequential inference is performed by the TR compiler 625 of the present invention. At step 730, a particular memory style or mode can be selected, e.g., it can be determined whether to use edge triggered flip-flops or level sensitive latches for the sequential elements, or to use another mode. At logic block 730, the selected technology-independent memory elements are then inserted into the design.

At logic blocks 735 and 740, the present invention performs two optional and technology independent processes to flatten and/or add structure to the design. These processes are well known. At logic block 735, an optional flattening step is performed where the logic is reduced in order to eliminate intermediate variables and results. During flattening, intermediate variables and therefore intermediate logic structure is removed from a design. While advantageous, flattening can have an adverse effect on CPU 101 processing time and design area. Table I below gives an example of a design before and after flattening.

TABLE I

| Before | After |
|---|---|
| f0 = a t0 | f0 = ab + ac |
| f1 = d + t0 | f1 = b + c + d |
| f2 = t0'e | f2 = b'c'e |
| t0 = b + c | |

At logic block 740, the present invention performs an optional logic block to structure the design. Structuring is an optimization step that adds intermediate variables and logic structure to a design. During structuring, the TR compiler 625 searches for sub-functions that can be factored out, and evaluates these factors based on the size of the factor and number of times the factor appears in the design. The sub-functions that most reduce the logic are turned into intermediate variables and factored out of the design equations. Table II below illustrates results of structuring a set of equations. In this example, the sub-function t0 is isolated as an intermediate variable and then factored out of the remainder of the design.

TABLE II

| Before | After |
|---|---|
| f0 = ab + ac | f0 = a t0 |
| f1 = b + c + d | f1 = d + t0 |
| f2 = b'c'e | f2 = t0'e |
| t0 = b + c | |

After logic block 740, the TR compiler 625 of the present invention, at block 750, translates the sequential elements that were inferred by logic block 730. At logic block 750, the memory cells inferred by logic block 730 are translated into technology dependent non-scan memory cells of a particular target technology. As shown, the technology library 743 is coupled to interface with logic block 750 to provide the cell library for translation. At block 752, the present invention performs scan cell replacement where the technology independent non-scan cells translated by block 750 are then replaced with technology dependent scannable memory cells (e.g., the cell becomes "scan replaced"). The translation procedure 750 performed by the present invention is done with knowledge regarding the types of scannable cells available within the target technology library 743 so that technology dependent non-scan cells inserted by process 750 can be replaced with equivalent scan cells by replacement process 752.

The process of replacement (step 752) involves an equivalence determination because, as shown in FIG. 5C and FIG. 5D, the sequential memory cells can include additional circuitry that needs to be matched during the translation. To perform the equivalence, each component in the technology library 743 contains an ASCII function identification string ("function identifier") that describes in a particular format which functions are implemented in any particular device.

The technology dependent non-scan memory cells placed into the circuit at logic block 750 of FIG. 9 contain similar ASCII function IDs. The present invention at logic block 752 utilizes the function IDs of the non-scan memory cells to compare against function IDs of the scannable memory cell elements of the target technology library 743 to locate scannable memory cells with equivalent functionality as the non-scan memory cell. In this way, functionally equivalent scannable memory cells can be used to effectively replace the non-scan memory cells. Technology libraries 743 include timing information (e.g., set up and hold timing) that is used by the present invention at block 752 to arbitrate between functionally equivalent scan cells for replacement. It is appreciated that TR compiler 625 can also use sequential mapping as an alternative to function ID-based equivalence during replacement 752. In accordance with the present invention, once the scannable memory cells are in place, the resultant design represented in a netlist description can be stored in RAM 102 or storage device 104 of the computer system 112 or any media storage unit.

It is appreciated that in an alternate embodiment of the present invention, logic blocks 750 and 752 can be combined into one replacement step wherein the HDL specified generic sequential cells are directly replaced by technology dependent scannable sequential cells.

At logic block 755 of FIG. 9, the TR compiler 625 of the present invention then adds the loopback connections 440 which connect an output of each scannable memory cell to the scan input of the same cell to simulate a link in a scan chain as shown in FIG. 6A and FIG. 6B. This is performed for each scannable memory cell. In the case of D-flip flop cells, the loopback connection 440 can connect from the Q or /Q output to the preferred scan input (SI). In accordance with the present invention, once the scannable memory cells have loopback connections 440 installed, the resultant design represented as a netlist description can be stored in RAM 102 or storage device 104 of the computer system 112 or any media storage unit.

At logic block 760, the TR compiler 625 then performs a second optional flatting procedure analogous to logic block 735. The second optional flattening procedure is used to perform flattening, if desired, given knowledge of the electrical characteristics of the elements added by blocks 750, 752 and 755 of the present invention. This additional knowledge provides a more refined flattening output. At logic block 765, the TR compiler 625 then performs a second optional structure adding procedure analogous to logic block 740. The second optional structure adding procedure is used to add structure, if desired, given knowledge of the electrical characteristics of the elements added by blocks 750, 752 and 755 of the present invention.

At logic block 770 of FIG. 9 an initial combinational mapping step is performed by the present invention where the generic cells ("architectural implementations") of the design are replaced with technology specific components and more specific timing information and area usage can be obtained. Logic block 770 is linked with the selected technology library 743 (also called a "cell library") defining structure and function of particular elements and components that can be used to replace the generic cells of the design. During block 770, the first functionally equivalent library cell is selected. At the completion of block 770, a technology dependent netlist is generated.

At logic block 775 of FIG. 9, the present invention TR compiler 625 performs input/output pad insertion and optimization. I/O pad insertion is the process of adding I/O buffers to primary inputs and outputs of a design. The characteristics of instantiated I/O pads can be predefined, such as voltage levels, current levels, pull up and pull down resistors, slew rate control, and so forth. I/O pad optimization modifies I/O pads that were previously inserted to meet constraints 610. At logic block 775, I/O pads can be optimized to include sizing and incorporation of core logic functionality into the pads. Any of a number of well known procedures can be used at this step.

At logic block 785 of FIG. 9, the present invention TR compiler 625 then performs mapping optimization. The goal of mapping optimization 785 is a gate level implementation that meets the constraints 610 defined in FIG. 8 (e.g., timing, porosity, area, power consumption, etc.). It is applied after the final implementation of the sequential logic is determined. Specifically, logic block 785 of the present invention compares each of its circuit implementations against the constraints 610 to gauge the overall quality of that implementation. Constraints 610 determine which transformations are accepted and which are rejected. There are a number of processes that operate at this step in order to optimize the overall design to satisfy the design rule and performance constraints 610. In general, logic block 785 identifies critical design points throughout the entire design and applies optimization techniques to these points in an attempt to satisfy the constraints 610. A critical point is a point that does not satisfy determined constraints. A critical load is a load associated with a critical path that does not meet determined constraints. A noncritical load a load associated with a path that satisfy determined constraints.

Logic block 785 is applied in an iterative basis over the entire design in an attempt to satisfy constraints 610. During this iterative approach, logic block 785 contains a heuristic that can apply optimizations that locally increase circuit cost, but over the length of the process can reduce circuit cost when applied iteratively over the entire design. Some of the processing of optimization logic block 785 applied at critical circuit points includes: sizing drivers and loads; phasing; buffering; downsizing; isolation; offloading; balancing; and splitting. These are described in more detail with respect to FIG. 12. One embodiment of the present invention advantageously utilizes some of the optimization features of logic block 785 in the modified scan insertion process 645 which is described further below.

At logic block 790, the present invention TR compiler 625 performs logic verification to determine if the design generated by logic block 785 and the HDL design input at logic block 710 are functionally equivalent. Timing considerations are ignored for logic verification. In logic block 790, Boolean matching is performed between the two designs at specified points within the logic design. Logic block 790 can also be used to check manual implementations or changes against the HDL specification. The processing of the TR compiler 625 then exits.

The output generated by the TR compiler 625 of the present invention (see FIG. 8) is a non-scannable netlist description 630 of the design. This netlist description 630, which can be stored in a computer memory or storage unit, contains scannable memory cells (scannable sequential cells) with loopback connections 440 associated with each scannable memory cell.

It is appreciated that the netlist 630 is non-scannable because the loopback connections 440 do not form proper scan chains. However, since each sequential cell has been translated at block 750, and scan replaced at block 752, although the netlist is non-scannable it is nevertheless fully scan replaced.

MODIFIED SCAN INSERTION INCLUDING CONSTRAINT DRIVEN COMPILE

An embodiment of the present invention includes a modified scan insertion logic block 645 that performs a modified version of compile (referred to as "constraint driven" compile) that is applied to the translated and replaced sequential cells added by the TR compiler 625 of the present invention. By selectively applying portions of compile routines in a particular fashion during the scan insertion process, this embodiment of the present invention avoids the time consuming incremental compile process required of the prior art. Instead, the modified scan insertion process 645 provides a tiered effort "constraint driven" compile routine that provides effective results with significantly reduced process time.

Further, by application of specific optimization routines during the scan insertion phase, the present invention offers increased flexibility at this phase because logic changes can be more readily made during scan insertion that alter the gate level connections. These optimizations are discussed below.

Figure 10:
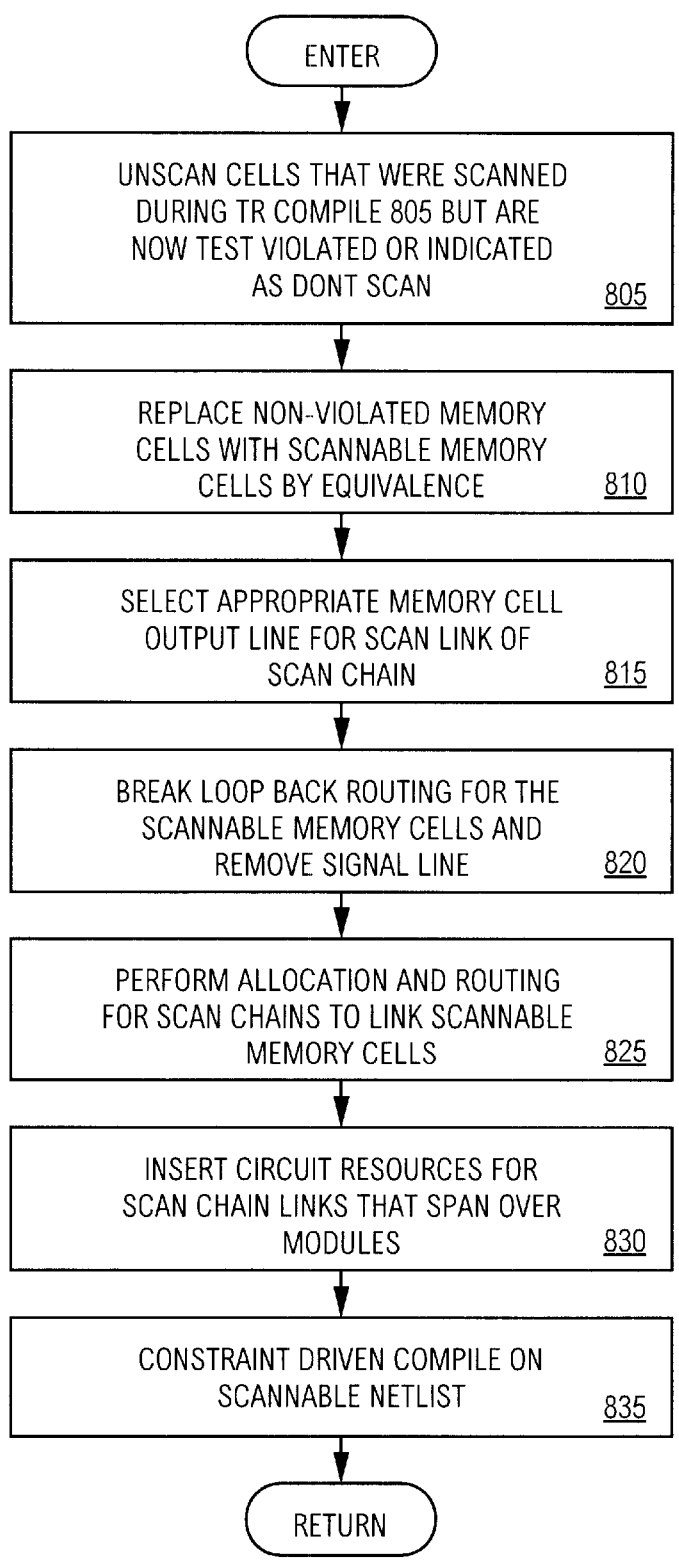
FIG. 10 is an overall flow diagram illustrating processes of the modified scan insertion process of the present invention including the constraint driven compile process.

Specifically, the modified scan insertion block 645 of FIG. 8 is described in more detail with reference to FIG. 10. The logic blocks of FIG. 10 are implemented within computer system 112. Unlike the present invention TR compiler 625, prior art compilers do not provide scannable sequential cell translation. Therefore, the modified scan insertion logic block 645 of the present invention provides logic for processing (1) netlists that have scannable sequential cells and (2) those netlists that do not have scannable sequential cells so that block 645 is compatible with both compiler types.

With reference to FIG. 10, logic block 645 begins at logic block 805 which receives a netlist output by the DRC 635 (FIG. 8). This netlist can contain sequential cells that are marked as violated. Block 805 unscans those sequential cells that are marked as violated or marked as otherwise "do not scan." These cells are unscannable. This is essentially a reverse of the replace sequential cells block 752 and at block 805 the scannable sequential cell is replaced by a timing and functionally equivalent unscannable sequential cell.

It is appreciated that block 645 can also receive input from a prior art compiler which does not perform scannable sequential translation. In such case, the input netlist can contain non-scan memory cells (e.g., they are not scannable sequential cells). At block 810, the present invention identifies those non-violated sequential cells that are not scan replaced. The present invention modified scan insertion block 645 then scan replaces these identified sequential cells with equivalent technology dependent scannable memory cells.

The process of sequential cell replacement applied at block 810 of FIG. 10 is analogous to the sequential replacement block 752 of FIG. 9 that can utilize a function identification string for comparison. If the above string identification approach fails, the present invention applies sequential mapping. Sequential mapping is performed at block 810 based on design rules and area constraints while performance constraints are not considered.

At logic block 815 of FIG. 10, the present invention modified scan insertion process 645 determines which cell output to select as appropriate to couple a particular scannable sequential cell to another scannable sequential cell in a valid scan chain. Assuming an exemplary D flip-flop model, block 815 selects the Q output, or the /Q output, an equal cell output, or opposite cell output. This selection is based on rules that attempt to best optimize to the constraints 610. With equal cells outputs, the output having the most slack (e.g., most favorable timing characteristics) is selected to be the scan-out driver to better optimize the design to timing constraints. In general, at block 815, the present invention attempts to select the output that will least likely impact the mission mode circuitry of the overall design. In other words, if one output (e.g., Q) is coupled to critical mission mode combinational logic, the present invention will attempt to connect this sequential cell to the scan chain using the other output (e.g., /Q).

At logic block 820, the modified scan insertion block beaks the loopback connections 440 inserted by the TR compiler 625 of the present invention. The loopback connections 440 or "routing" lines are broken because block 645 determines and routes the proper connections to form valid scan chains among the scannable sequential cells. The loopback connections 440 were temporarily installed during the HDL compile 625 steps to simulate the electrical characteristics of the actual scan chains for constraint optimization. At this time, they are removed. It is appreciated that blocks 815 and 820 can operate simultaneously.

At logic block 825 of FIG. 10, the present invention performs allocation of resources and routing to construct the scan chains between scannable sequential cells by linking non-violated scannable sequential cells. Also added during block 825 are other circuit resources required to construct the scan chains, such as signals lines for clock signals and scan enable signals, etc. The processing of block 825 required to determine the scan chains, allocate the proper resources to construct the chains, and route the input and output lines and gates accordingly is well known in the art. Any of a number of well known procedures can therefore be used consistent with the scope of the present invention at this stage to construct the scan chains. At block 825, the present invention will construct the scan chains differently, as is known in the art, depending if a full or partial scan is required.

Logic block 645 also determines if the added DFT implementations cause any potential circuit failures as a result of the application of test vectors. After scan insertion, additional logic may be needed to protect against potential problems that are encountered as a result of shifting test vector bits into memory cells that normally would never have these input values. For example, the application of the test vectors can cause bus shorts. In these cases, disabling logic elements are added by block 645 to prevent the potential short circuit.

At logic block 830 of FIG. 10, the present invention determines if a particular scan connection (e.g., between two consecutive scannable sequential cells) spans between modules. If so, then the present invention places an isolation gate between the output port of the upstream scannable cell and the downstream cell, this is shown in FIG. 7. This is referred to as hierarchical isolation. By providing the above isolation logic, the addition of the loopback connections 440 by the TR compiler 625 still accurately represents the electrical characteristics of a scan chain connection that spans across two modules.

At the completion of block 830, a number of components are added to the original circuit design that was input at block 810. These additions were not optimized to satisfy performance or design rule related constraints. Therefore, logic block 835 is provided by the present invention to provide a form of mapping optimization so that the overall design with the DFT circuitry can better meet performance and design rule constraints. These optimizations performed at block 835 are called "constraint driven" compile optimizations and are a proper subset of the optimizations performed by the TR compiler 625 of the present invention. However, as described below, block 835 provides certain optimizations applicable only to the DFT circuitry (e.g., the scannable sequential cells and the routing for the scan chains) in a tiered effort approach. In other instances, block 835 provides optimizations along critical points of the entire netlist design. The combination of the above techniques provides an effective optimization scheme for meeting design rule constraints and attempting to match performance constraints while not consuming a large amount of processing time.

Constraint driven compilation block 835 will be described in more detail with reference to FIG. 11A which shows processes to reach performance constraints and FIG. 11B which illustrates processes to reach design rule constraints (e.g., maximum fanout, maximum capacitance, maximum signal transition). Assuming the constraints are met by application of block 835, the output of block 835 is a scannable netlist of the circuit design.

Figure 11A:
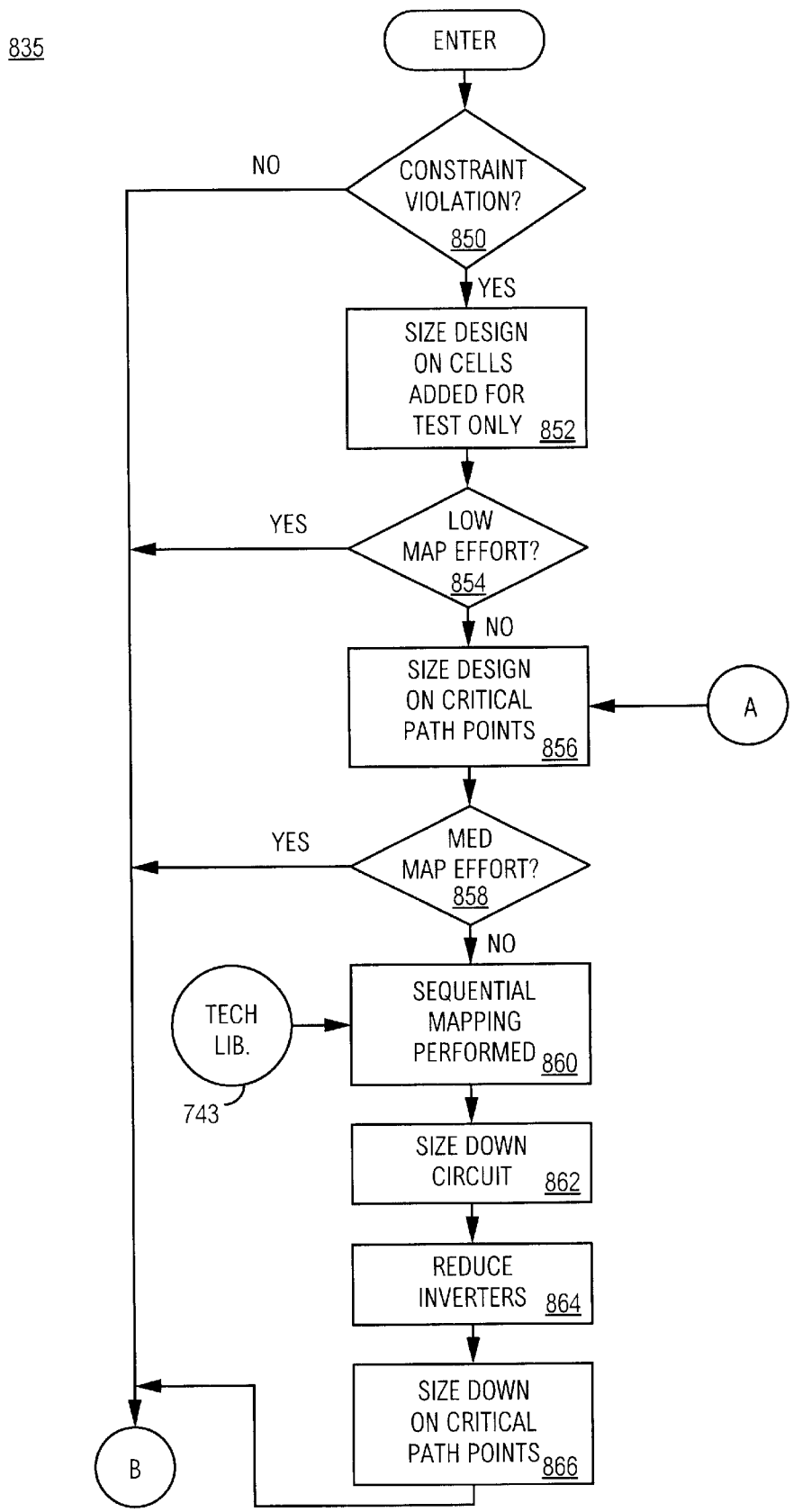
FIG. 11A and FIG. 11B represent a flow diagram illustrating processes of the constraint driven compile process of the modified scan insertion process of the present invention.
Figure 11B:
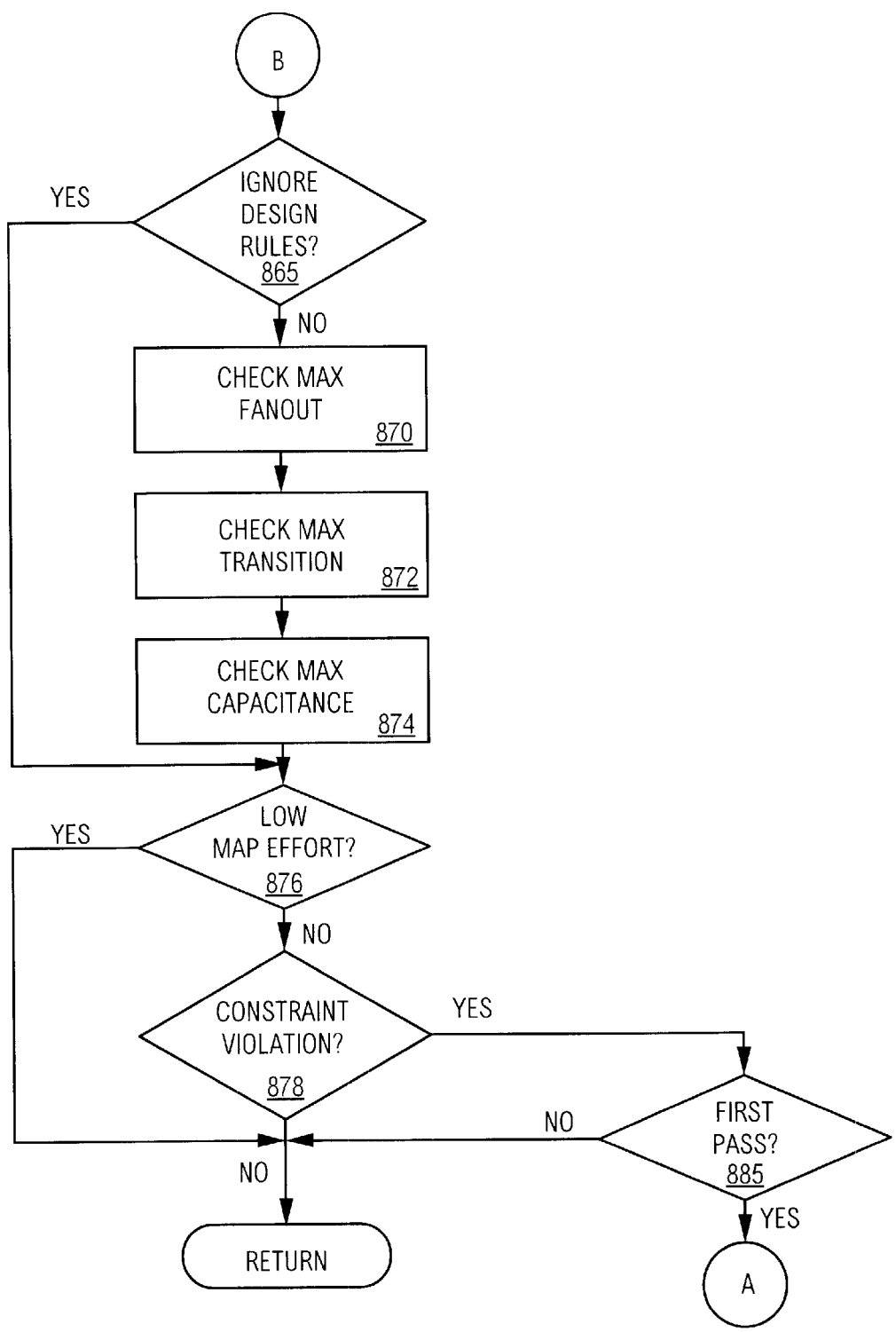

With reference to FIG. 11A and FIG. 11B, the constraint driven compile block 835 of the present invention is described. Logic block 835 receives two selection controls as input (1) an effort selection (map_effort) that can be low, medium or high and (2) an ignore design rules selection (ignore_compile_design_rules) that can be true or false. Processing starts at block 850 where the present invention determines if a performance constraint (e.g., timing, etc.) exists and is violated. If there are no performance constraints or none is violated, then block 835 flows to node "B." If a performance constraint violation appears, processing flows to logic block 852.

At logic block 852, the present invention performs a number of optimizations ("size design") along critical points only of the portion of the netlist that was introduced as a result of DFT processes. Within process 852, the entire design is not modified, only the portion or domain that comprises the DFT implementations, e.g., those portions that were added by insertion of the scannable sequential cells, the scan chains, and any other logic added as a result of the DFT implementations. The present invention is able to advantageously perform this type of size design process 852 because the present invention is knowledgeable about the DFT introduced circuits and can limit this application of the size design to these circuit portions. These optimizations are applied in accordance with design dependent heuristics that are described below. The optimizations performed on the critical points of the DFT introduced circuitry in block 852 include sizing, phasing, buffering, downsizing, isolation, off-loading, balancing, and splitting. These optimizations and their application heuristics are described in more detail in FIG. 12.

At block 852 of FIG. 11A, the cells that were added as a result of DFT are examined and a number of critical points and paths within the design are determined. These points generally contain negative slack values (e.g., they do not meet the timing constraints) and are ranked in a set. Therefore, according to one optimization employed at block 852, any drivers that belong to the DFT implementation at these points are increased in drive strength to increase the amount of slack at these points. By increasing the drive strength of these drivers at these points, the node has a better chance of meeting timing constraints. After a size increase in a particular driver is implemented, a new ranked set of critical points is generated. Other optimizations are then processed and the process is then repeated. It is appreciated that block 852 operates only on the DFT implementations.

At logic block 854 of FIG. 11A, the present invention checks if the map_effort input indicated low effort. If so, then processing continues to node "B." If at the completion of block 852, the performance constraints are not violated and the map_effort is medium or high, then processing also continues to node "B." If the map_effort is medium or high and performance violations still exist, then processing flows to logic block 856. At logic block 856, the present invention performs the size design optimizations along critical points of the entire netlist and there is no domain restriction to the DFT implementations as with block 852. These optimizations are applied in accordance with design dependent heuristics that are described with reference to FIG. 12. The optimizations performed on the critical points of the circuit in block 856 include sizing, phasing, buffering, downsizing, isolation, off-loading, balancing, and splitting. They are described in more detail in FIG. 12. A substantial portion of the processing performed by constraint driven compile 835 is performed at block 856.

At logic block 858 of FIG. 11A, the present invention checks if the map_effort input indicated medium effort. If so, then processing continues to node "B." If at the completion of block 856, the performance constraints are not violated and the map_effort is high, then processing also continues to node "B." If the map_effort is high and performance violations still exist, then processing flows to logic block 860. At logic block 860, sequential mapping is performed along critical points only for non-scan cells. At the identified critical points, surrounding combinational logic is combined with an adjacent non-scan sequential cell and both are replaced with a complex non-scan sequential cell that includes the functions of the surrounding combinational logic. The complex non-scan sequential cell is retrieved from the target technology library 743 as shown. The opposite can also occur wherein a complex non-scan sequential cell can be replaced with a simpler non-scan sequential cell and combinational logic. This process is similar to block 750 of FIG. 9. At block 860, functional equivalence is maintained during the mapping.

At logic block 862 of FIG. 11A, the present invention then reduces the size of circuits along points including non-critical points by performing local optimizations. Although this can decrease the drive strength of some circuits, it does not introduce performance constraint violations and has the advantage of bringing the design closer to the required area constraints. Once block 862 is complete, the present invention flows to logic block 864 to perform a particular local optimization where identified inverter pairs are replaced with single buffers reducing the number of extra or redundant inverters in the design. At the completion of block 864, the present invention then performs another size design optimization at critical points across the entire netlist. Logic block 866 is therefore analogous to block 856. Subsequently, processing flows to node "B" as indicated.

FIG. 11B illustrates the remainder of the processing performed by logic block 835 of the present invention. The flow enters through node "B" and at block 868 the present invention tests if the ignore_compile_design_rules selection is true or false. If true, then processing flows to block 876 and logic blocks 870, 872, and 874 are skipped. Logic blocks 870, 872, and 874 represent optimizations the present invention can perform to ensure that the netlist satisfies the design rule constraints (e.g., fanout, signal transition, and node capacitance). Generally, by the addition of an appropriate number of elements, the present invention can fix the design rule violations. If ignore_compile_design_rules selection is false, then processing flows to logic block 870 where the fanout number of each point is checked and violations of the fanout limitation in the design rules constraints are fixed. Violations are fixed at block 870 by adding an appropriate number of buffers so that each point along the design satisfies the fanout limitations.

At logic block 872 of FIG. 11B, the present invention checks the points in the design to determine if any signal transitions are too slow and violate signal transition constraints. The signal transitions can be too slow if the nodes are overloaded. To increase signal transition time, the present invention adds buffer elements to reduce the loading effects and/or increases the size the drivers at these nodes. At logic block 874, the present invention checks the points in the design to determine if any node has node capacitance that exceed the node capacitance constraints. If so, the present invention adds buffer elements to decrease the loading and therefore decrease the capacitance at any particular node having excessive node capacitance.

At logic block 876 of FIG. 11B, the present invention checks if map_effort is low and if so, processing exits from block 835. If map_effort is medium or high, then processing continues to logic block 878 where the performance constraints are examined. The addition of elements by blocks 870, 872 and 874 can cause certain performance constraints to be violated. If constraint violations are not present, then processing exits logic block 835. At this point, performance and design rule constraints have been met and the netlist is fully scannable.

If constraint violations are present at block 878 and this is the first pass through logic block 835, then processing flows from block 885 to node "A" which enters FIG. 11A at node 856. If constraint violations are present at block 878 and this is the second pass through block 835, then processing flows from logic block 885 and exits block 835. In the latter case, the constraint driven compile process 835 was unable to satisfy the performance constraints 610 of the design considering the DFT implementations.

By providing the processing flow shown in FIG. 11A and FIG. 11B, the present invention offers a three tiered effort driven constraint driven compile process. At low map_effort, the least amount of CPU 101 processing time is consumed to size design only the circuitry added to the DFT implementations and design rules can be checked. At medium map_effort, the above is done and the size design optimization is applied across critical points of the entire design. At high map_effort, CPU 101 processing time is not a critical factor and the above is done as well as sequential mapping, size down, inverter reduction and another size design is performed. In addition, another size design optimization is performed. For medium and high map efforts, the above is performed through more than one pass if performance constraints are still not satisfied.

Figure 12:
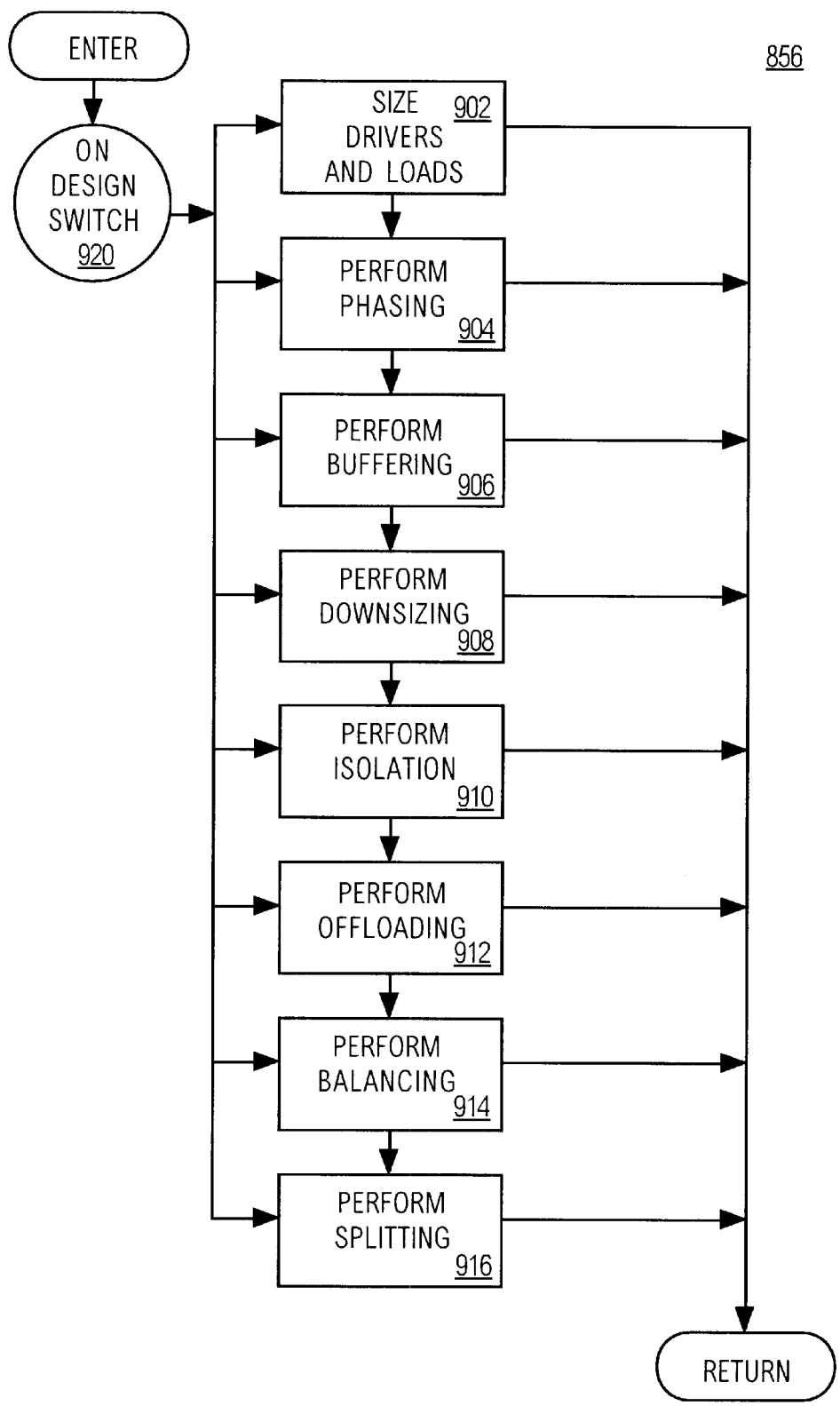
FIG. 12 is a flow diagram illustrating processes of the size design process of the constraint driven compile process of the present invention.

FIG. 12 illustrates in more detail the processing performed by the size design optimization block 856 (and block 866) of the present invention. It is appreciated that FIG. 12 represents a set of processes performed along critical points of the input circuit design domain in order to meet performance constraints. The size design optimization block 856 (of the constraint driven compile 835 block) is based on design dependent heuristics which determine processes are applied to the critical points of the input domain. The design domain can consist of only the DFT implemented circuitry (as for block 852) or can consist of the entire design (as for block 856).

Flow 856 of FIG. 12 enters at switch logic block 920 where design dependent heuristics determine which process to select from processes 902–916. At the completion of an optimization block (of 902–916), processing exists and can be repeated if critical points in the design remain. The blocks selected for subsequent processing depends on the design and history dependent heuristics and again is selected by switch logic 920. At block 902, the present invention increases the size and therefore the drive capacity of a driver or increases the receiving capability of a load. This is done to increase the response of a system to satisfy performance (e.g., timing) constraints. Block 902 is performed across critical points in the entire design. As discussed above, a critical point along the input netlist design consists of a design node wherein timing or other performance constraints are not met.

Figure 13A:
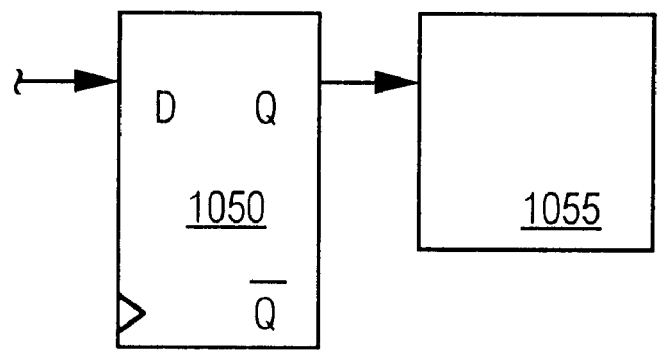
FIG. 13A and FIG. 13B illustrate an exemplary circuit transition performed by the phasing subprocess of the size design process shown in FIG. 12.
Figure 13B:
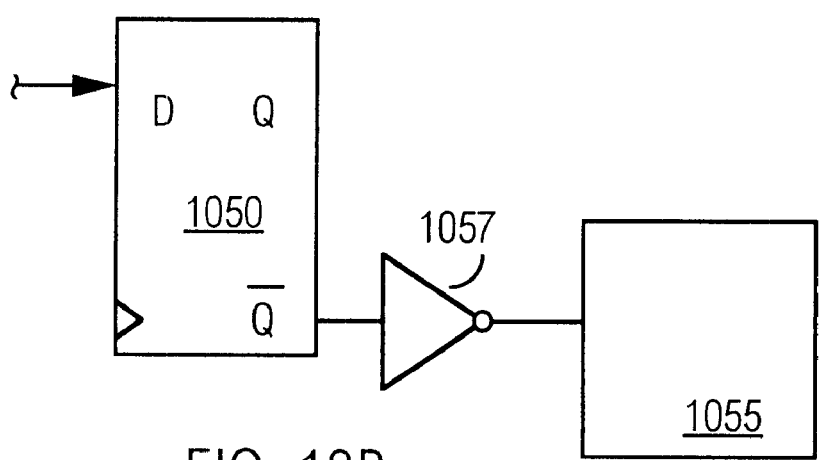

In logic block 904, the present invention moves a drive line from one output of a sequential cell to its inverse output. This is called phasing. FIG. 13A illustrates a sequential cell 1050 driving a load 1055 with the Q output. In phasing, the load 1055 is moved to the inverse output (/Q in this example) as shown in FIG. 13B. An inverter 1057 is required in this case. Block 904 is performed across critical points in the input design domain (e.g., the entire design or only the added DFT implementations). Phasing is particularly useful in NMOS systems.

Figure 14A:
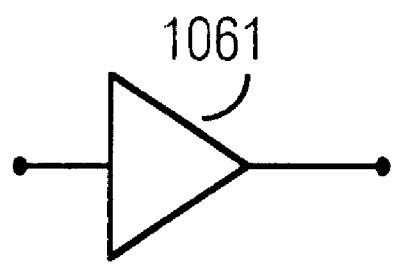
FIG. 14A and FIG. 14B illustrate an exemplary circuit transition performed by the buffering subprocess of the size design process shown in FIG. 12.
Figure 14B:
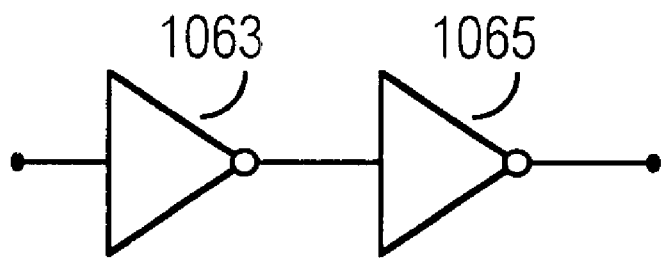

In logic block 906 of FIG. 12, buffering is performed where a number of different buffer configurations can be transformed. As shown in FIG. 14A, a single buffer 1061 can be transformed to a pair of inverters 1063 and 1065 as shown in FIG. 14B and vice-versa. A pair of buffers can also be replaced with a single buffer or vice-versa. At block 906, an inverter can be transformed into a buffered inverter or vice-versa. Or, lines coupled to a node in a branch network can be individually buffered. These options are applied across critical points in the input design domain to optimize to performance constraints. Options can be applied using a trial and error basis.

Figure 15A:
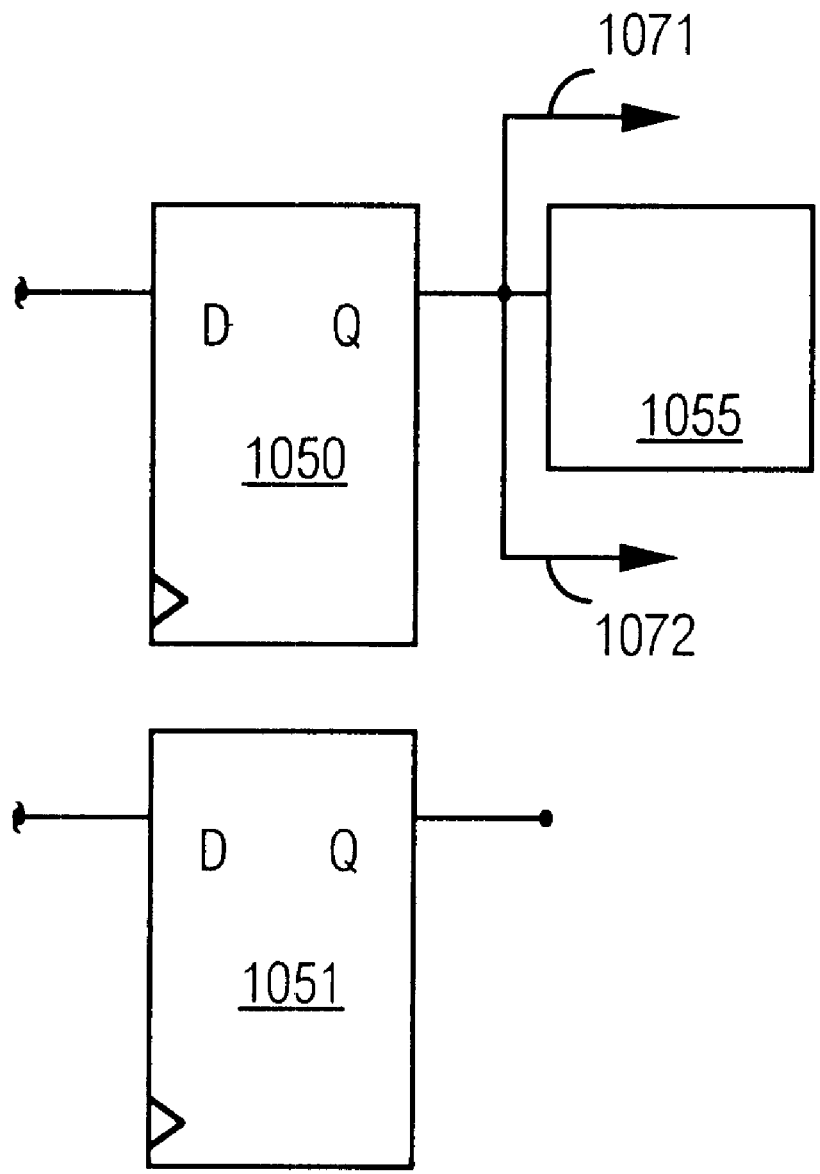
FIG. 15A and FIG. 15B illustrate an exemplary circuit transition performed by the downsizing subprocess of the size design process shown in FIG. 12.
Figure 15B:
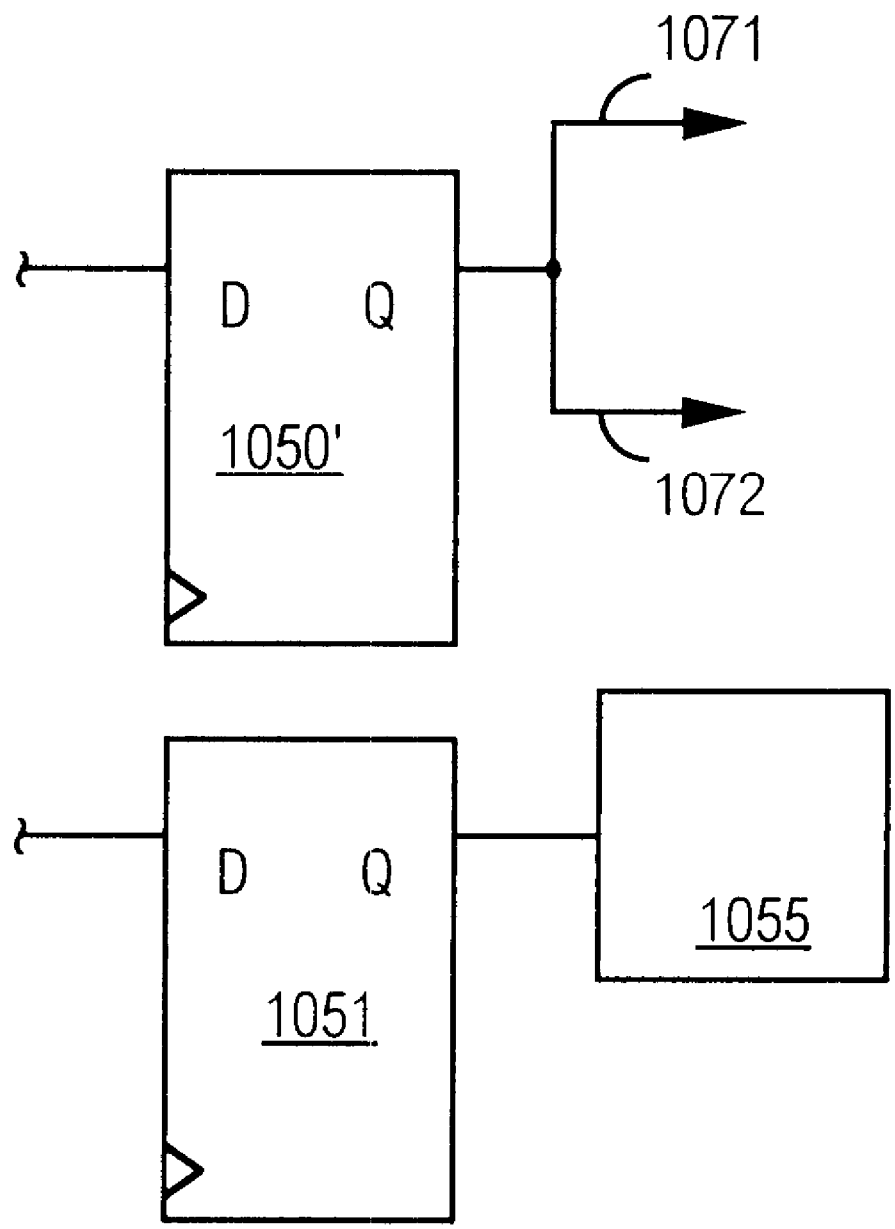

In logic block 908, the present invention performs downsizing where certain loads are determined that can be moved from one location to a logically equivalent location. After the load is removed, the associated driver is downsized to meet area constraints. FIG. 15A illustrates a sequential cell 1050 with an output, Q, driving a load 1055 and other lines 1071, 1072 driving other loads (not shown). Also shown is an other cell 1051. If is determined that Q of cell 1050 and Q of cell 1051 are logically equivalent, then the load 1055 can be moved from cell 1050 to cell 1051 as shown in FIG. 15B. In this example Q of cell 1050 is the critical point. The driver of cell 1050 is then downsized resulting in cell 1050'. By downsizing the driver, certain constraints can be more readily satisfied. Block 908 of the present invention is performed at critical points in the input design domain.

Figure 16A:
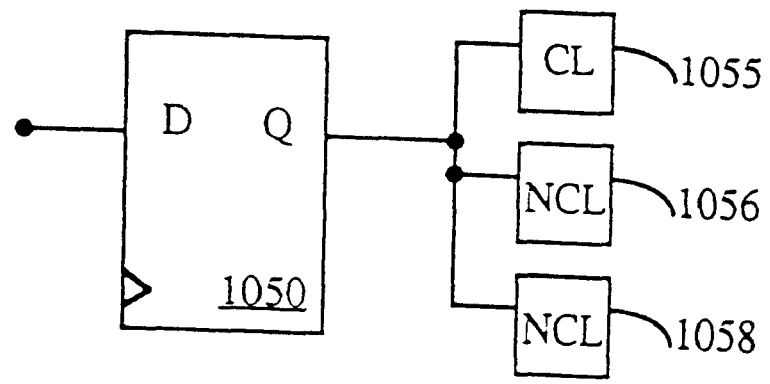
FIG. 16A and FIG. 16B illustrate an exemplary circuit transition performed by the isolation subprocess of the size design process shown in FIG. 12.
Figure 16B:
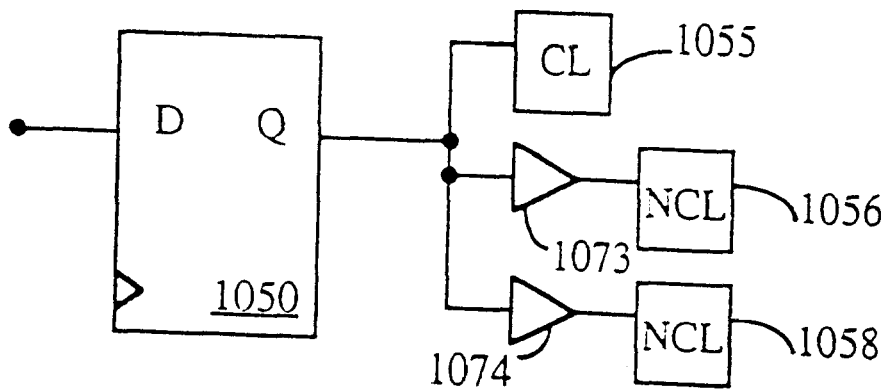

In logic block 910 of FIG. 12, the present invention performs load isolation. With reference to a critical point, all of the noncritical loads (NCLs) are buffered leaving the critical load (CL) directly coupled. In this way the NCLs are isolated from the critical point and path. FIG. 16A illustrates a critical point (Q) of cell 1050 coupled to two NCLs 1056, 1058 and one CL 1055. Isolation acts to buffer NCLs 1056 and 1058 with buffers 1073 and 1074 as shown in FIG. 16B. By isolating the critical point Q of cell 1055 from the NCLs, certain performance constraints can be more readily satisfied. Block 910 of the present invention is performed at critical points in the input design domain.

Figure 17A:
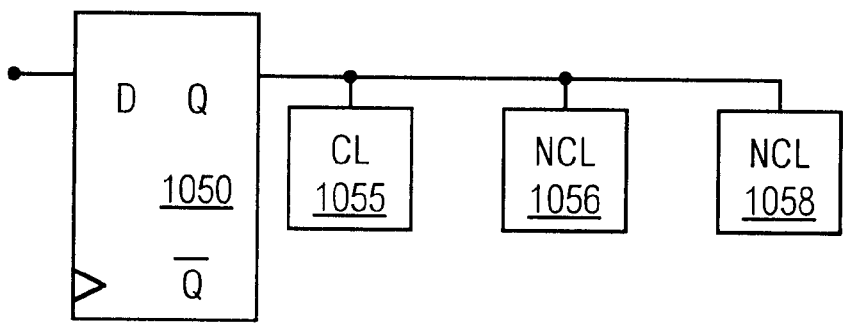
FIG. 17A and FIG. 17B illustrate an exemplary circuit transition performed by the offloading subprocess of the size design process shown in FIG. 12.
Figure 17B:
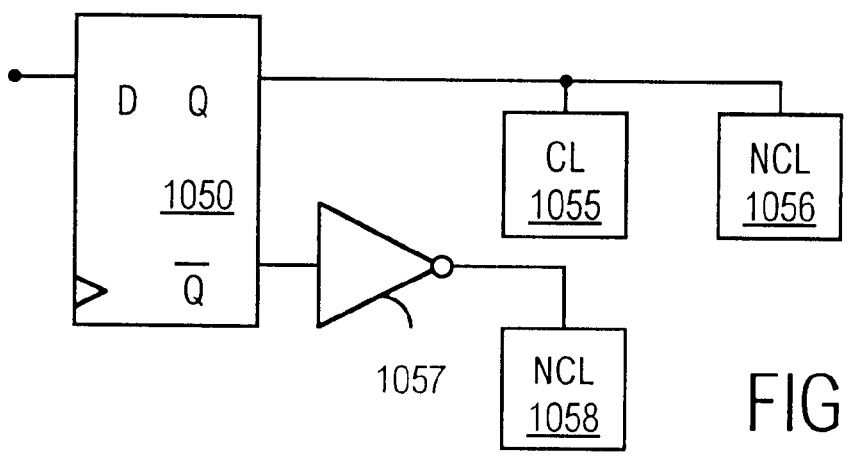

At logic block 912, the present invention performs offloading. In this process, the present invention determines NCLs of a particular critical point and offloads the NCLs to other equivalent drivers. The equivalent driver can have greater drive strength. Between many drivers, block 912 selects the one with the most slack. FIG. 17A illustrates two NCLs 1056, 1058 coupled to Q of cell 1050. Also a CL 1055 is coupled to Q. In offloading, the present invention offloads NCL 1058 to another driver. In this example, the equivalent driver is the /Q output of cell 1050 as shown in FIG. 17B. An inverter 1057 is added to maintain logical equivalence. Equally possible, both NCLs 1056, 1058 can be offloaded. Block 912 of the present invention is performed at critical points in the input design domain.

Figure 18A:
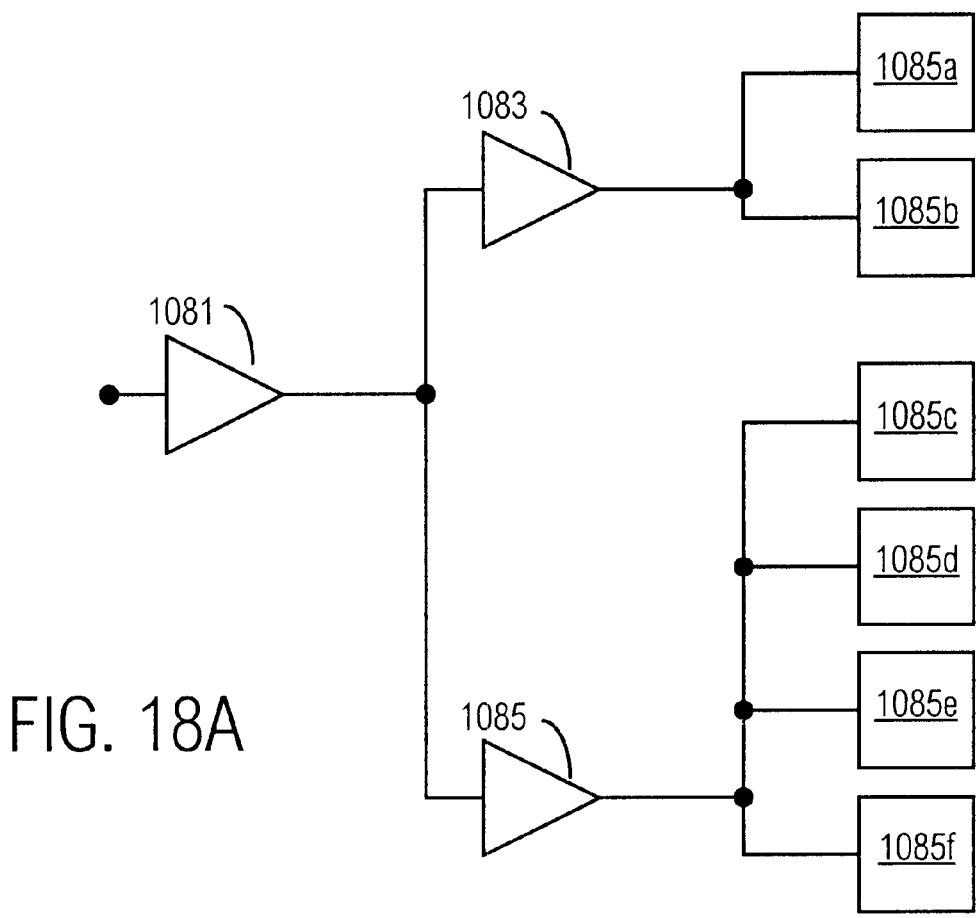
FIG. 18A and FIG. 18B illustrate an exemplary circuit transition performed by the balancing subprocess of the size design process shown in FIG. 12.
Figure 18B:
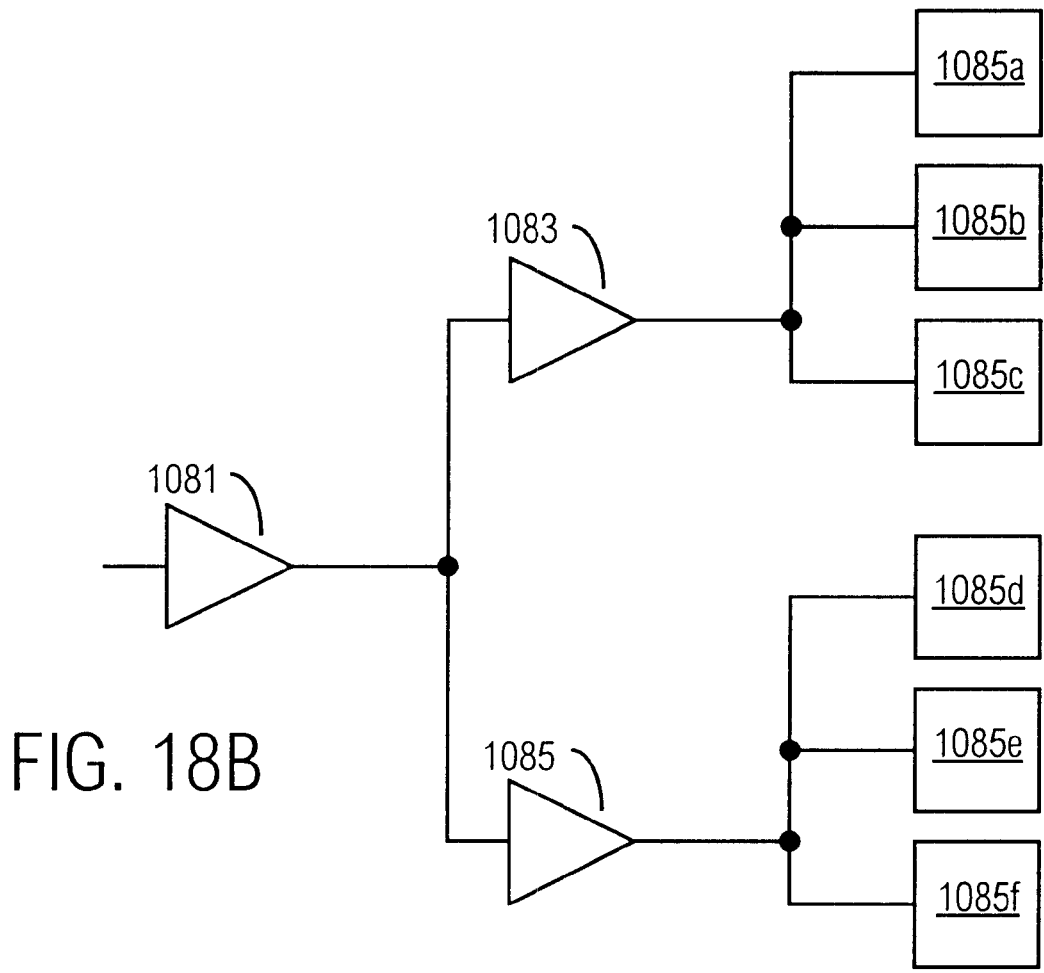

In logic block 914 of FIG. 12, the present invention performs balancing with respect to critical points of cells and within driver networks. With respect to a sequential cell, the present invention attempts to evenly balance loads across the Q and /Q outputs. This can require moving one load to another sequential output. With respect to a driver network, FIG. 18A illustrates a network having a common driver 1081 and secondary drivers 1083 and 1085. The loads 1085a–f are not balanced with more loads on driver 1085. The present invention moves a load from driver 1085 to driver 1083 to balance the network. The result is shown in FIG. 18B where the network is better balanced. By performing load balancing, certain performance constraints can be more readily satisfied. Block 914 of the present invention is performed at critical points in the input design domain.

Figure 19A:
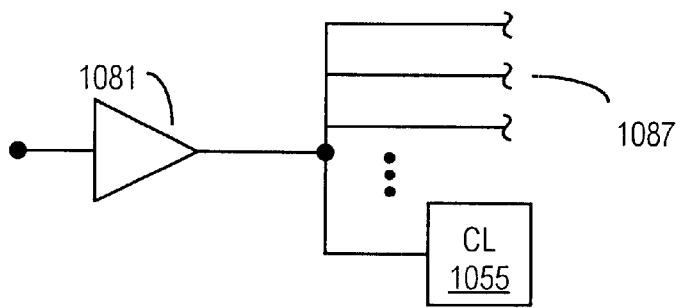
FIG. 19A and FIG. 19B illustrate an exemplary circuit transition performed by the splitting subprocess of the size design process shown in FIG. 12.
Figure 19B:
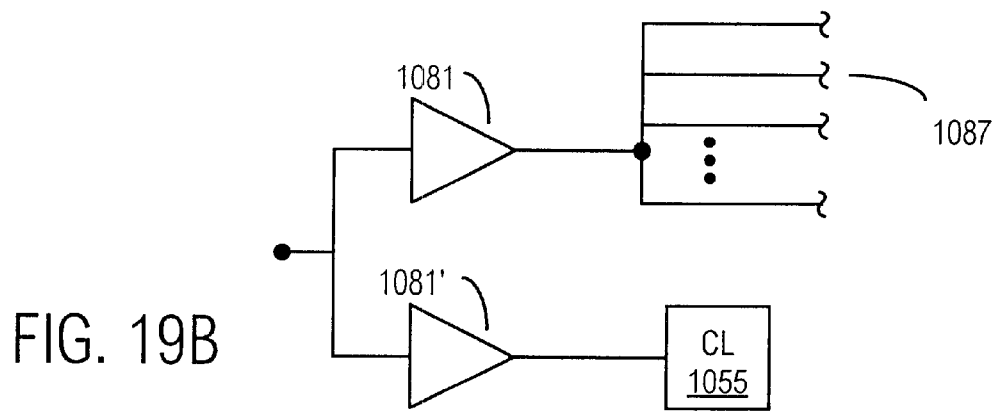

In logic block 916, the present invention performs load splitting. In this process, drivers having critical loads are duplicated with the critical load applied to its own driver or a duplicate driver having increased drive strength. FIG. 19A illustrates a single driver 1081 with a critical load 1055 and other lines 1087 coupling with other NCLs (not shown). The present invention, as shown in FIG. 19B, duplicates driver 1081 and provides driver 1081' which is coupled to the critical load 1055. The remainder of the NCLs are coupled via lines 1087 to driver 1081. By splitting, certain performance constraints can be more readily satisfied. Block 916 of the present invention is performed at critical points in the input design domain.

By applying the above eight timing related optimizations to the input design domain, the present invention constraint driven compile provides effective measures to meet the performance constraints while requiring substantially reduced CPU 101 processing time over the prior art incremental compile step. Although a number of procedures can be used, an exemplary procedure is shown below to implement the processing of FIG. 12:

```
while (critical point←get_critical_point(design))
do
   num_trials=1;
   do
      trial_process←get_trial_process(design);
      if (accept_trial←accept_trial(design, trial_
        process))
```

```
    then
        implement_process(design, trial_process)
        report_accept_process(design, trial_process,
            num_trials)
    else
        num_trials←num_trials+1
    fi
while (!accept_trial)
done
```
wherein:
  get_critical_point—processes different critical points
  get_trial_process—selects the next process (e.g., from blocks 902–916) and is a design-dependent heuristic.
  accept_trial—decides to accept the trial and is another design-dependent heuristic

PROCESSING HIERARCHICAL DESIGNS

Figure 20:
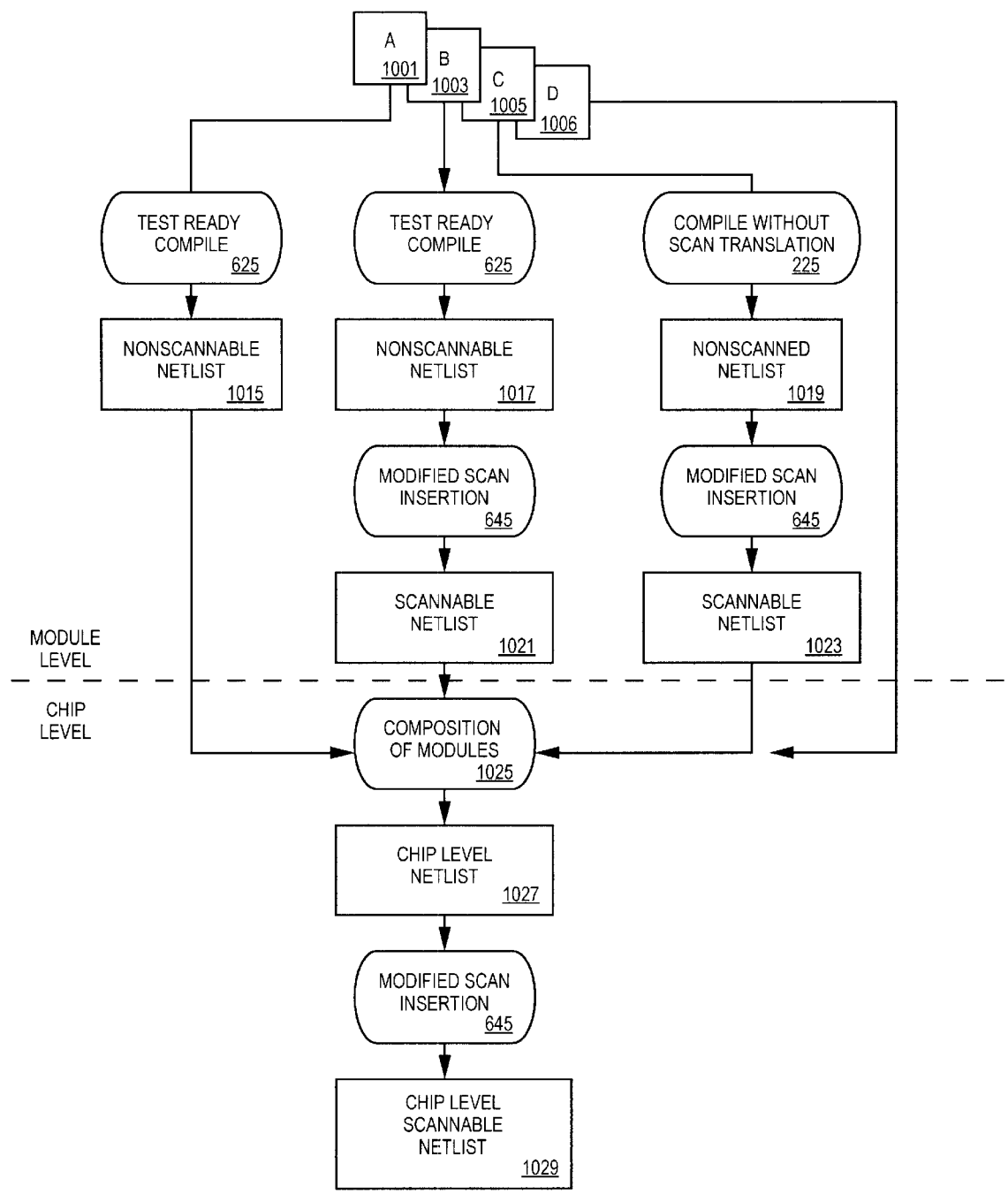
FIG. 20 illustrates the present invention test ready (TR) compiler and modified scan insertion process within a hierarchical design illustrating the practical nature of the present invention on a chip level netlist.

FIG. 20 illustrates that the present invention TR compiler 625 and the present invention modified scan insertion block 645 can be advantageously used to perform synthesis in a hierarchical fashion involving modules and submodules of an integrated circuit design. The present invention is extremely versatile in handling hierarchical processing because the modified scan insertion block 645 (1) accepts fully scanned, partially scanned or nonscanned netlist as input and also (2) operates efficiently in terms of processing time therefore chip level processing is possible without substantial delay.

Since the modified scan insertion block 645 accepts fully and partly scanned sequential cells, a number of different processes can output netlists to block 645. For those netlists that are fully scan replaced, block 645 performs no sequential translation or replacement but applies other procedures as described in FIG. 10 (such as loopback connection removal, scan chain routing, and optimization). For those netlists that are unscanned or partially scanned, block 645 performs the above tasks and also performs sequential replacement.

As shown in FIG. 20, a chip design can be represented by a number of modules 1001, 1003, 1005, and 1006. Alternatively, a single module can be represented by submodules 1001, 1003, 1005, and 1006. FIG. 20 illustrates an exemplary circuit synthesis using hierarchical approaches. Module A, in this example, is executed through the TR compiler 625 of the present invention that produces a fully scan replaced but unscannable netlist 1015. This netlist 1015 contains scannable sequential cells having loopback connections. A DFT DRC process can be run on netlist 1015 to mark violated cells. For reasons left up to designers, module 1001 is not processed on the module level by the modified scan insertion logic so the result is sent to block 1025.

Module 1003, like module 1001 is executed through the TR compiler 625 of the present invention which produces a fully scan replaced 1017 netlist that is unscannable due to the loopback connections 440. A DFT DRC process can be run at this point to mark violated cells. The result is then processed by the modified scan insertion block 645 of the present invention. This process 645 will unscan violated cells. The result of block 645 is a scannable netlist 1021 meeting the defined constraints. This is forwarded to block 1025.

Module 1005 of FIG. 20 is processed through a compiler 225 that does not provide any scan replacement or DFT optimization. The result is a nonscanned netlist 1019 that does not contain scannable sequential cells or scan chains. This result 1019 is then fed through the modified scan insertion block 645 of the present invention which will provide sequential translation and construction of scan chains as well as optimization as shown in FIG. 10. The result 1023 is a scannable netlist having scan chains and scannable memory cells. This netlist 1023 can be run through a DFT DRC to mark violated cells. This result is then forwarded to block 1025.

Lastly, module 1006 consists of a compiled design through a compiler without sequential replacement. Therefore, module 1006 contains unscanned cells that are technology dependent. This result is directly forwarded to block 1025.

At the chip level, logic block 1025 builds a composition or chip level netlist 1027 combining the data received from all of the modules 1001, 1003, 1005, and 1006. The composition of modules step within block 1025 can be performed implicitly as a result of processing each module through their module level processing. Also at block 1025, certain binding or linking functions are performed on the design. Binding connects the ports of modules together as needed and also connects ports as needed at the chip level design.

Composition block 1025 also accepts as input a nonscannable netlist with scannable cells but no loop back connections 440. The netlist 1027 contains some fully scan replaced portions and some completely unscanned portions. The chip level netlist 1027 is then input to the modified scan insertion block 645 which produces a chip level scannable netlist 1029. Block 645 unscans violated cells. Block 645 of the present invention preserves the scan chains constructed within the design associated with netlists 1021 and 1023 while deriving original scan chains for the design associated with netlist 1015 and module 1006. These scan chains are then linked, as necessary, to provide chip level DFT implementations. It is appreciated that block 645 can also accept a chip level netlist including a portion comprising a nonscannable netlist with scannable cells but no loop back connections 440.

It is appreciated that the present invention modified scan insertion logic block 645 is advantageously suited for chip level scan insertion because it operates with substantially reduced processing time so that an entire chip level netlist can practically be processed. In other words, a time consuming full or incremental compile does not need to be performed on the chip level netlist 1027. Further, since block 645 accepts netlists with scanned and nonscanned sequential cells, it is suited for receiving input from a variety of different compiler options.

It is appreciated that designs 1001, 1003, 1005 and 1006 can also be subdesigns of a single module. In this case, block 1025 will process at the module level while the above tasks process at the submodule level.

PARTIAL UNSCAN AND NEAR FULL SCAN

Figure 1:
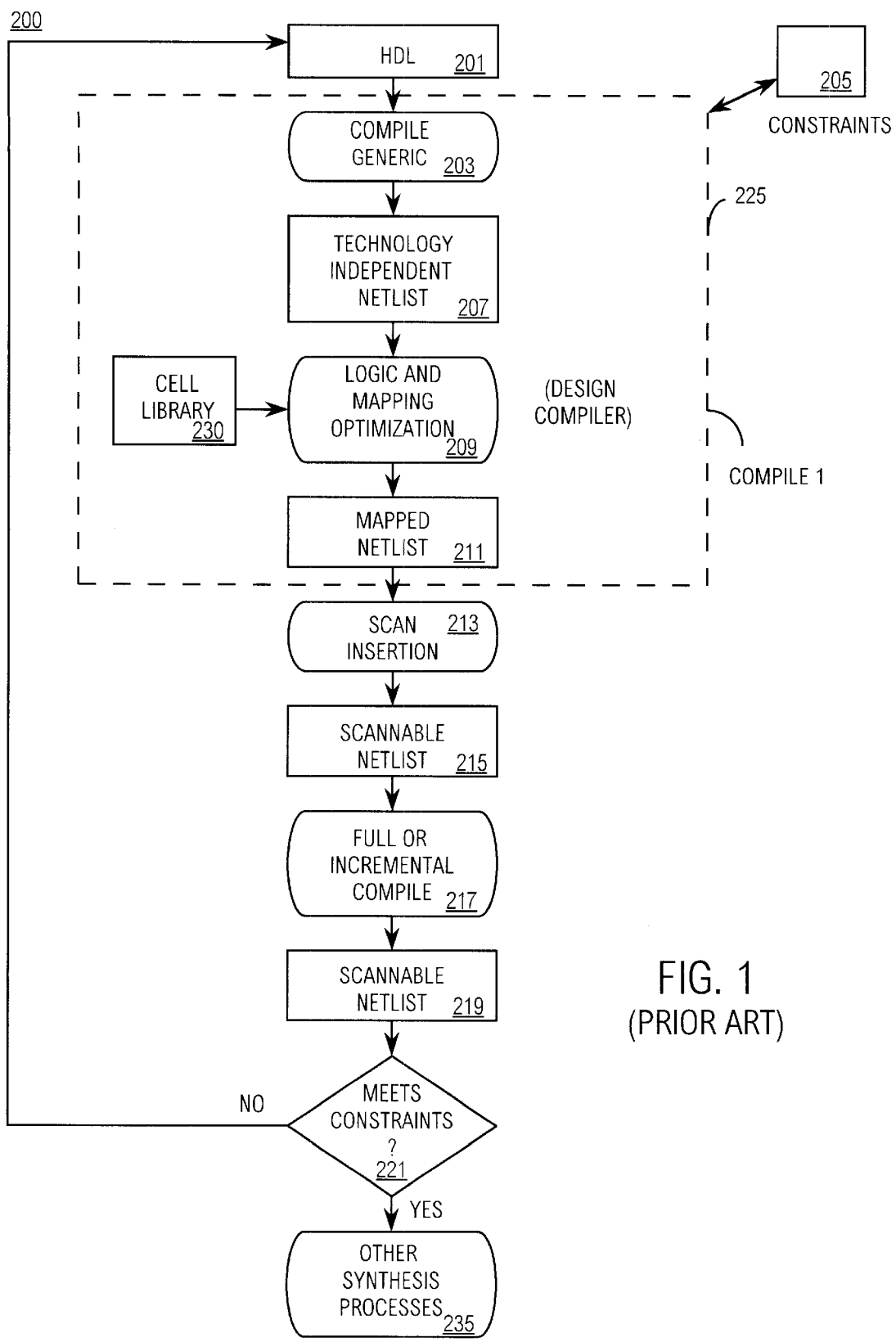
FIG. 1 is a flow diagram illustrating a prior art process for logic synthesis with design for test implementations.
Figure 21A:
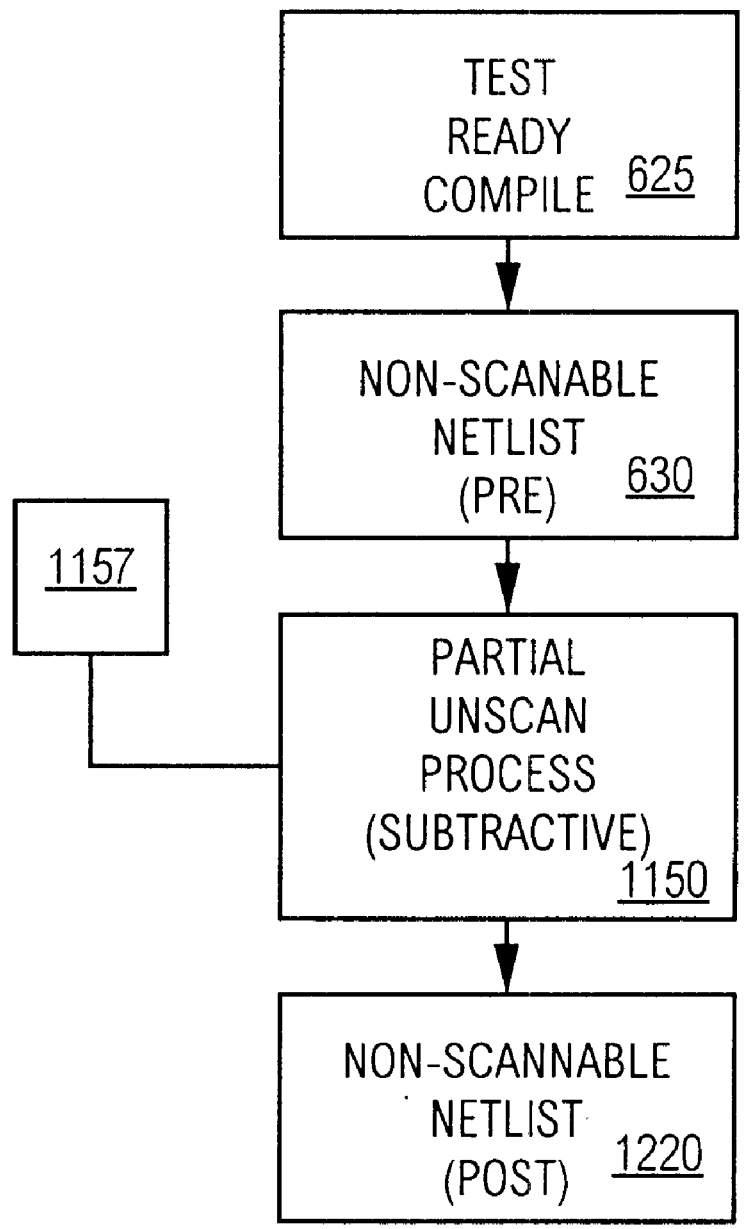
FIG. 21A illustrates a top level flow diagram of the novel subtractive (e.g., partial) scan procedure of the present invention.
Figure 21B:
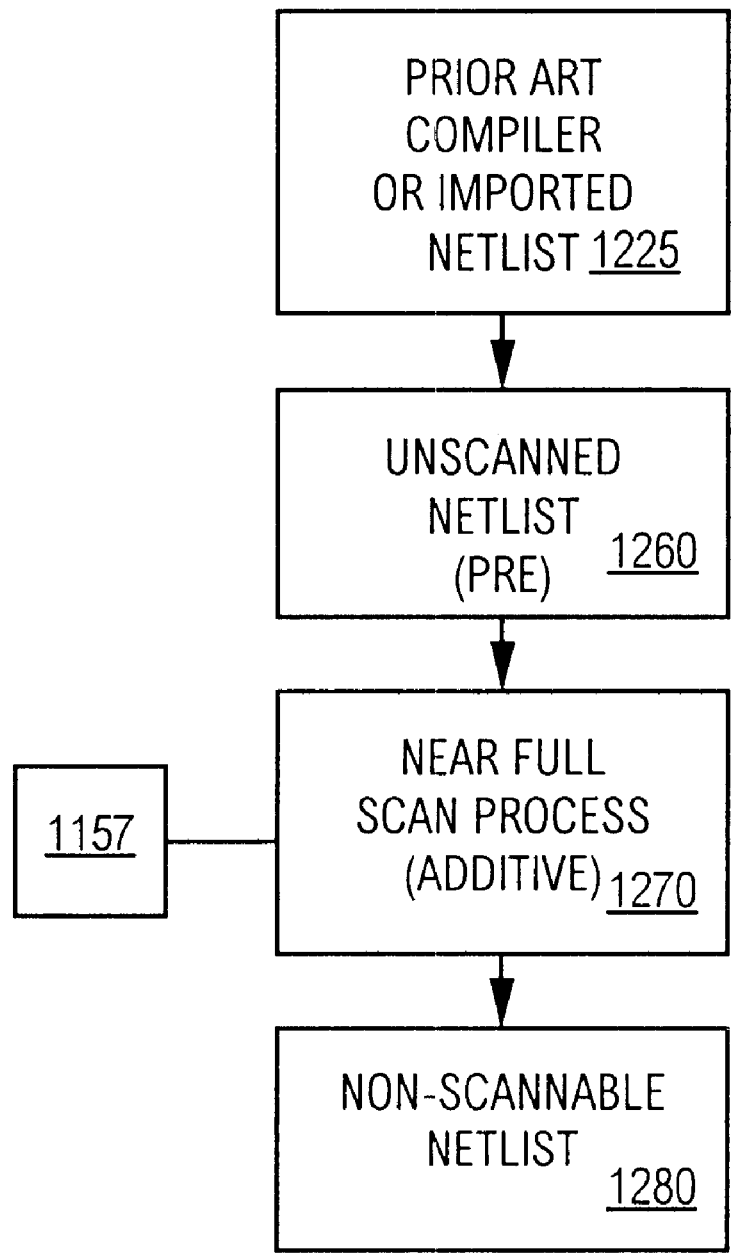
FIG. 21B illustrates a top level flow diagram of the novel additive (e.g., near full) scan procedure of the present invention.

FIG. 21A and FIG. 21B are top level flow diagrams of processes using the subtractive partial unscan procedure and the additive near full scan procedure of the present invention. These procedures are used to determine a set of sequential cells that can be scan replaced within an input design while still maintaining certain specified optimization constraints (e.g., area and/or timing) of an input circuit design. The subtractive partial unscan procedure 1150 (FIG. 21A) can be used for circuit designs that do not meet the given optimization constraints even after the constraint driven scan insertion process 645 (FIG. 8) is executed or after iterations of the prior art secondary compile process 217 (FIG. 1) are executed. The additive near full scan procedure 1270 (FIG. 21B) can be used with an unscanned netlist of a prior art compiler or of an imported netlist. The additive near full scan procedure 1270 can be used as a time effective scan replacement procedure for designs that are expected to have challenges meeting the given optimization constraints when DFT elements are added. An implementation also uses the additive near full scan and the partial unscan in combination, as described in more detail in FIG. 24.

With reference to FIG. 21A, high level process 1200 is an exemplary usage of the subtractive partial unscan process 1150 of the present invention. The steps and substeps of process 1200 are implemented as program code stored within a computer readable memory unit (e.g., unit 102, or unit 103, or unit 104 of FIG. 2) of a computer system. Process 1150 accesses, receives as input a netlist 630 that is fully scan replaced. In one example, this fully scan replaced netlist 630 originates from the test ready (TR) compiler 625 of the present invention, but can originate elsewhere. The TR compiler 625 of the present invention generates a netlist 630 that is non-scannable due to the loopback connections 440 associated with the sequential cells. However, the non-scannable netlist 630 is nevertheless fully scan replaced since all sequential cells are scan replaced. It is appreciated that procedure 1150 can accept a fully scan replaced netlist originating from a variety of different procedures and sources (e.g., refer to FIG. 24) and that the non-scannable netlist 630 originating from the TR compiler 625 of the present invention is but one example. For application of procedure 1150, it is assumed that the input fully scan replaced netlist 630 does not meet the given optimization constraints (e.g., area and/or timing) of the design. A ranked list, called a testability cell list (TCL) 1157, to be described further below, is accessed by process 1150 during its subtractive procedure.

Figure 22A:
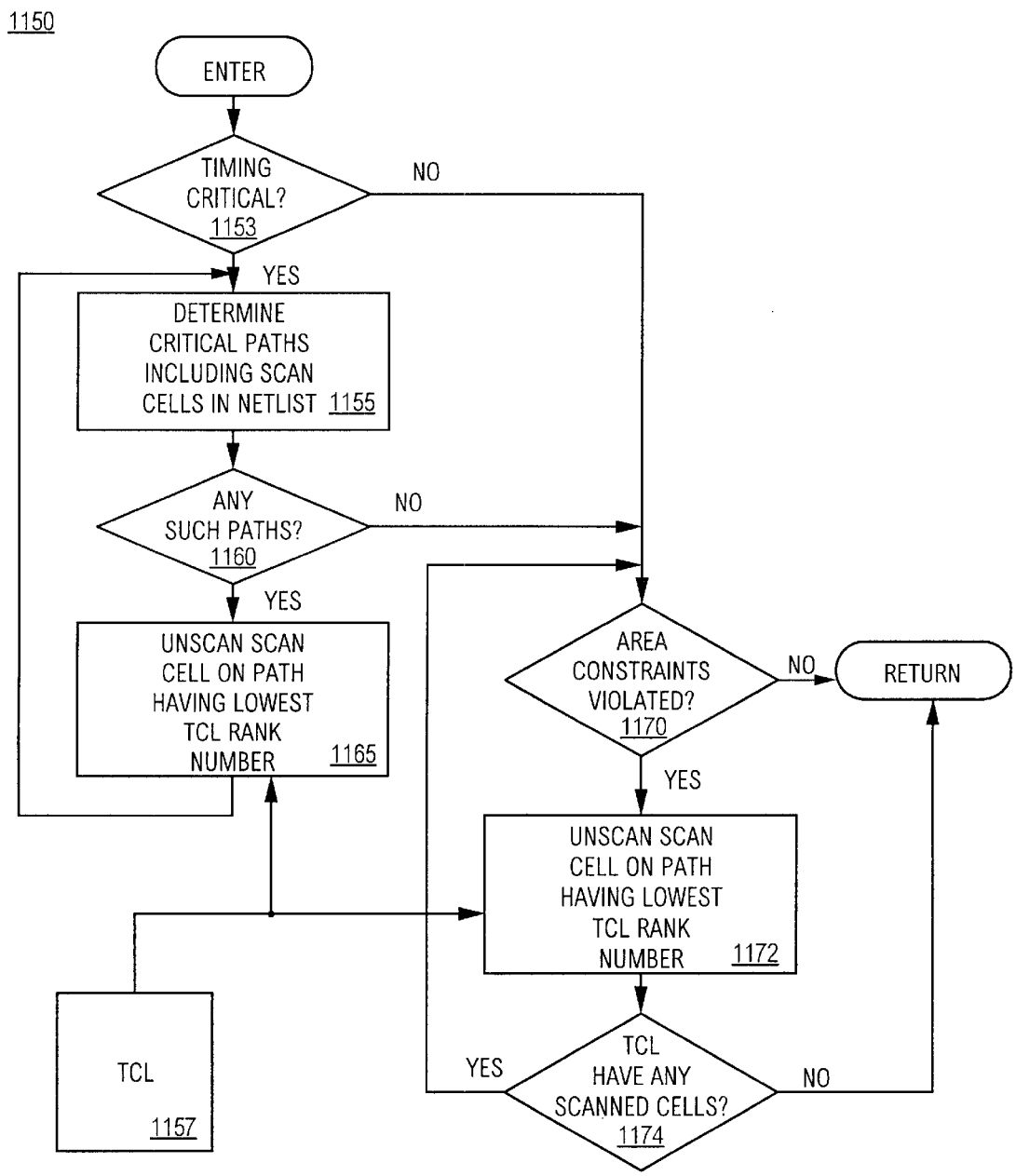
FIG. 22A is a flow diagram of steps of the novel subtractive system of the present invention.

As discussed in more detail with respect to FIG. 22A, the subtractive partial unscan process 1150 of the present invention selectively unscans certain scan replaced sequential cells of the input netlist 630 until the overall design meets the given optimization constraints (e.g., timing and area elements of constraints 610 of FIG. 8). The result is a partially scanned netlist 1220. This netlist 1220 is partially scanned because certain scan replaced cells from netlist 630 become and remain unscanned after process 1150. In the example of FIG. 21A, the resultant partially scanned netlist 1220 is called a "non-scannable netlist" because of the loopback connections 440 of the scan replaced cells.

With reference to FIG. 21B, high level process 1250 is an exemplary usage of the additive near full scan process 1270 of the present invention. The steps and substeps of process 1250 are implemented as program code stored within a computer readable memory unit (e.g., unit 102, or unit 103, or unit 104 of FIG. 2) of a computer system. Process 1270 accesses, receives an unscanned netlist 1260 as input. The unscanned netlist 1260 typically originates from a prior art compiler (e.g., block 225 of FIG. 1) and can be an imported netlist (including a manually created netlist). The additive near full scan process 1270 of the present invention selectively modifies the original input netlist 1260 by selectively scanning certain unscanned sequential cells. This process is iterative until the modified design does not meet its original area and/or timing constraints. The sequential cells selected for scan replacement are based on those cells that contribute most to testability. At the completion of process 1250, a non-scannable netlist 1280 is generated. The netlist 1280 is non-scannable because, like netlist 1220 of FIG. 21A, the scan replaced cells have not been linked together in scan chains. The ranked list or testability cell list (TCL) 1157, to be described further below, is also accessed by process 1270.

It is appreciated that netlists 1220 and 1280 of FIG. 21A and FIG. 21B can be input to the constraint driven scan insertion procedure 645 (FIG. 10) of the present invention to generate scannable netlists. Process 645 breaks the loopback connections 440 while constructing the scan chains between scan replaced sequential cells. Those cells remaining unscanned within netlist 1220 and 1280 can be appropriately marked as violated or valid non-scan before the netlist is input to process 645 and are not scan replaced by process 645 nor included in the resulting scan chains. Cells marked violated indicate that the cells violates design rule constraints while valid non-scanned indicates that the cell does not violate design rule constraints but is not being scanned to meet optimization constraints.

With reference to FIG. 22A, the subtractive partial scan process 1 150 is illustrated. Process 1150 is typically performed by embodiments of the present invention in those cases where the optimization procedures of the modified scan insertion block 645, or any other optimization, are unable to satisfy area, timing constraints and other performance related constraints. In such case, the user selects process 1150 which determines certain scan replaced sequential cells to unscan using different approaches to satisfy area and/or timing constraints. Before entry of process 1150, the user is allowed to assert a timing critical flag which indicates whether or not timing is to be optimized along with area optimization. Process 1150 continues to unscan certain scan replaced sequential cells until the constraints are satisfied or until another user selected termination point is reached. At the completion of process 1150, the maximum amount of scannable cells are left in the circuitry while satisfying area and performance constraints. Process 1150 executes within the CAD computer system 112 (FIG. 2) and the steps of process 1150 are stored as program code in computer readable memory units of system 112.

Process 1150 starts at logic block 1153 where a timing critical flag (e.g., stored in the input netlist 630) is accessed and checked. The timing critical flag indicates whether or not a user has selected that timing constraints should be checked during the subtractive process 1150. At block 1153, if the timing critical flag is not set, then processing flows to logic block 1170 where area constraints are examined, otherwise, processing flows to logic block 1155. At block 1155, the present invention examines the input fully scan replaced netlist (e.g., netlist 630) and determines a set of critical paths (or a single critical path) within the input netlist 630 that include scan replaced cells coupled therewith. Critical paths represent critical timing paths of the network because they do not satisfy performance (e.g., timing) constraints.

Figure 22B:
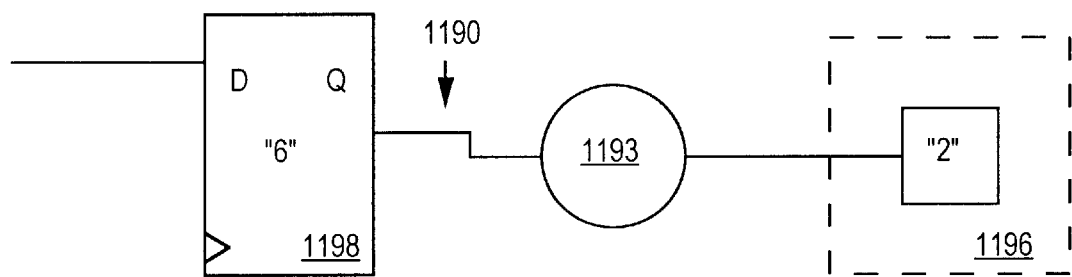
FIG. 22B illustrates a sample critical path (bounded by ranked sequential cells) involved in the processing of the novel subtractive system of the present invention.

A critical path is composed of two end points and typically each end point consists of a sequential cell (e.g. a first and a second sequential cell). FIG. 22B illustrates an exemplary critical path from sequential cell 1198 through combinational logic 1193 and to a sequential cell 1196. A critical path can have both of its sequential cells (e.g., 1198 and 1196) scan replaced, or only one of its sequential cells scan replaced, or neither of its sequential cells scan replaced. A critical path having at least one of its sequential cells scan replaced is called a critical path with a scan replaced (e.g., scanned) cell.

At logic block 1155 of FIG. 22A, a set of critical paths are determined by performing a timing analysis (e.g., a static timing analysis) on the input netlist design. The static timing analysis can be unit timing based or cycle based and many well known methods of performing static timing analysis can be performed in accordance with the present invention at logic block 1155. Those paths not meeting timing constraints as measured through the static timing analysis procedure are marked as critical paths of the input design. The critical paths can be ranked by their criticality. Those critical paths that have the worse timing performance and said to be the worst critical of the critical paths.

At logic block 1160 of FIG. 22A four conditions are checked in any order. First, if there are no critical paths with a scan replaced cell to be determined, but critical paths remain in the input design, then processing flows from block 1160 to block 1170 and a message is generated indicating that timing constraints are not satisfied and there is no more unscanning that can be accomplished within the design. Second, if there remain critical paths with scan replaced cells in the design, but there are worse critical paths also remaining in the design that do not have any scan replaced cells, processing flows from block 1160 to block 1170 and a message is generated indicating that timing constraints are not satisfied and will not improve by unscanning further critical paths since worse paths exist that have no scan replaced cells. Third, at block 1160, if there are no critical paths left at all, then processing flows from block 1160 to block 1170 and a message is generated indicating that timing constraints are satisfied. At block 1170, area constraints are checked. Fourth, if a critical path with a scan replaced cell exists or a set of critical paths each with a scan replaced cell exist, then processing flows from block 1160 to logic block 1165 and timing optimization continues.

Logic block 1165 interfaces with and uses a testability cell ranked list or "TCL ranked list" 1157, residing in computer readable memory unit 102 or 104 (FIG. 2). The TCL ranked list 1157 originates from a procedure that ranks each memory cell in the netlist by order of its importance within the mission mode circuitry. This ranking can also be viewed as a ranking of individual cells and their contribution to testability. A number of well known methods and procedures can be used to generate the TCL ranked list 1157 in accordance with the present invention and the result is a ranked list of sequential cells with their associated TCL rank number. The following references describe some of the well known ways in which the TCL ranked list 1157 can be generated: E. Trischler, "Incomplete Scan Path with an Automatic Test Generation Methodology," in Proc. Int. Test Conf., pp. 153–162, November 1980; K. S. Kim and C. R. Kime, "Partial Scan by User of Empirical Testability," in Proc. Int. Conf. Computer-Aided Design, pp. 314–317, November 1990; M. Abramovici, J. J. Kulikowski, and R. K. Roy, "The Best Flip-flops to Scan," in Proc. Int. Test Conf., pp. 166–173, October 1991; and D. H. Lee and S. M. Reddy, "On Determining Scan Flip-flops in Partial Scan Designs," in Proc. Int. Conf. on Computer-Aided Design, pp. 322–325, November 1990; and several other references (e.g., [1], [5–13], and [15–18]) cited by I. Park, D. S. Ha, and G. Sim, in "A New Method for Partial Scan Design Based on Propagation and Justification Requirements of Faults," Proc. Int. Test Conf., pp. 413–422, 1995, paper 19.2.

Within the TCL ranked list 1157, those sequential cells that do not control a relatively large amount of combinational logic and/or those cells that do not observe a relatively large amount of combinational logic are placed at the bottom of the TCL ranked list 1157 and have lower TCL rank numbers. Those sequential cells that control a relatively large amount of combinational logic and/or observe a relatively large amount of combinational logic are placed at the top of the TCL ranked list 1157 and have higher TCL rank numbers. It is more advantageous to scan replace cells with higher TCL rank numbers (e.g., lower in the list) because these cells contribute more to testability due to the amount of circuitry they control and/or observe. Alternatively, it is less advantageous to scan replace cells with lower TCL rank numbers (e.g., higher in the list).

It is appreciated that within the present invention the convention can be reversed of assigning higher TCL rankings to sequential cells that contribute highly to testability and assigning lower TCL rankings to the other sequential cells.

At logic block 1165 of FIG. 22A, the present invention selects a particular critical path having a scan replaced cell of those critical paths identified in block 1160. In an exemplary implementation of the present invention, at block 1165, those critical paths with the worse performance are selected first.

At block 1165, the present invention determines the specific sequential cells coupled with the particular selected critical path. An exemplary critical path 1190 is shown in FIG. 22B where both sequential cells coupled to the particular critical path are scan replaced. The scan replaced sequential cells coupled in path 1190 are cells 1198 and 1196. These sequential cells are also ranked in TCL ranked list 1157. Their TCL rank numbers are shown in quotes with 1198 at "6," and 1196 at "2." In this case, for this critical path 1190 having two scan replaced sequential cells, the present invention at logic block 1165 searches through the TCL ranked list 1157 to determine the scan replaced sequential cell with the lowest rank number; this scan replaced sequential cell is determined to have the smallest impact on, or contribution to, testability due to its low rank number compared to the other cells within the critical path 1190. This selected cell is then unscanned. Therefore, at logic block 1165 of FIG. 22A, the present invention unscans scan replaced sequential cell 1196, as shown by the dotted line, in an attempt to meet timing constraints 610.

At logic block 1165, if the selected particular critical path contains an unscanned and a scan replaced sequential cell on either ends of the path, the scan replaced sequential cell is unscanned regardless of TCL ranking.

Flow then returns to logic block 1155 of FIG. 22A where the input design is examined for critical paths again, if any. If another critical path with a scanned replaced cell is determined at logic block 1160 (and there are no worse critical paths having only unscanned cells), then logic block 1165 is again introduced to continue timing optimization.

At logic block 1170, the present invention checks area constraints. When the timing constraints flag is not asserted or timing constraints driven unscanning completes (e.g., logic blocks 1155, 1160, and 1165), the present invention goes on to satisfy area constraints. To satisfy area constraints, the present invention at logic block 1170 sums the area consumed by logic cells and routing resources of the input design and checks if the area constraints 610 are violated by this summation. If area constraints are violated, then processing flows to logic block 1172, else process 1150 exits. At logic block 1172, the present invention accesses the TCL ranked list 1157 and starts at the end of the TCL ranked list 1157 having the lowest rank number and selects the scan replaced cell having the lowest rank number. At block 1172, the selected scan replaced cell having the lowest rank number is then unscanned. After unscanning an individual cell, the present invention flows to logic block 1174 where the TCL ranked list 1157 is checked to determine if it contains any more scan replaced cells. If not, process 1150 returns, else processing flows to block 1170 where the present invention recomputes the area summation of the design and checks this new summation value against the area constraints 610. This subprocess continues until the area constraints are satisfied or until the TCL ranked list 1157 is empty; in either situation process 1150 returns. If the TCL ranked list 1157 becomes empty and area constraint have not been meet, process 1150 returns and indicates that area constraints could not be satisfied.

At the completion of process 1150, a partially unscanned netlist 1220 (FIG. 21A) results. The resulting netlist 1220 typically meets timing and area constraints. However, in extreme cases, netlist 1220 can be completely unscanned but there still remains critical paths with no scan replaced cells; in such case, timing constraints 610 are not met and an error message is indicated. Also, if area constraints are not satisfied, as discussed above, an error message is indicated. The resultant netlist 1220 generated by the processing 1150 of FIG. 22A is then stored in a computer memory, e.g., RAM 102 or device 104 (FIG. 2).

Figure 23A:
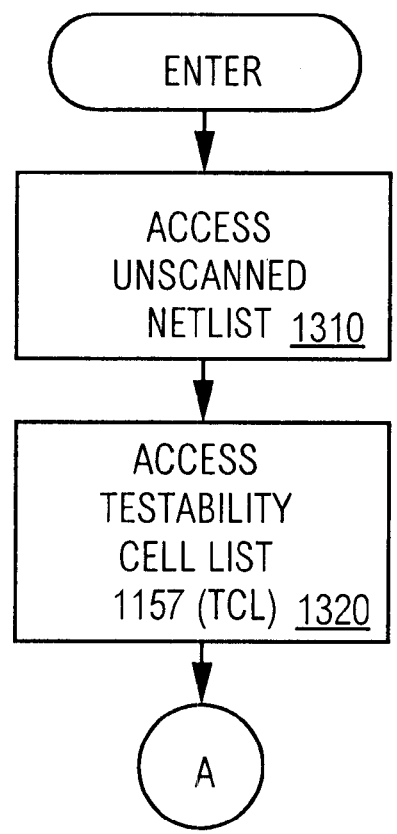
FIG. 23A is a flow diagram of initial steps of the novel additive system of the present invention.

With reference to FIG. 23A, the additive near full scan procedure 1270 of the present invention is shown. Process 1270 is executed on computer system 112 (FIG. 2) and the steps of process 1270 are stored as program code in computer readable memory units of system 112. At logic block 1310, process 1270 receives, accesses an unscanned netlist (e.g., netlist 1260 of FIG. 21B). The unscanned netlist received at logic block 1310 is called the original netlist design. At block 1310, process 1270 also receives timing information indicative of the worse timing path of the input design netlist 1260. At logic block 1320, the present invention receives, accesses the TCL ranked list 1157, e.g., the same TCL ranked list 1157 described above, which is a ranked list indicating sequential cells and their relative contribution to testability. Within TCL ranked list 1157, those cells with higher contributions to testability have higher ranking numbers and those cells with comparably less contributions to testability have lower ranking numbers.

Figure 23B:
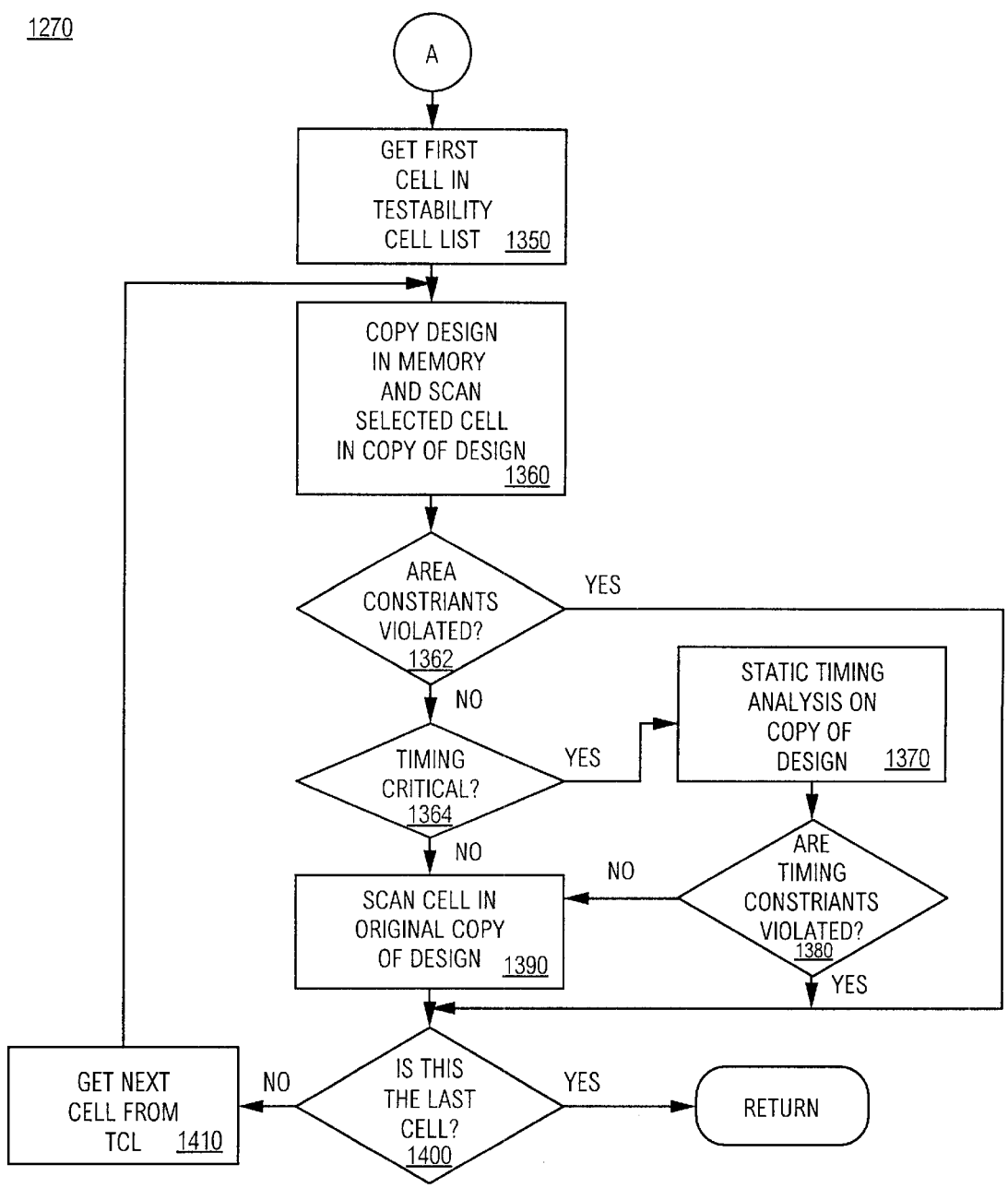
FIG. 23B is a flow diagram of steps of the novel additive system of the present invention.

Process 1270 flows to logic block 1350 of FIG. 23B. At block 1350, the present invention additive process 1270 accesses the unscanned sequential cell of the TCL ranked list 1157 having the highest rank number. At logic block 1360, the original netlist design is copied in an alternate portion of memory 102 (FIG. 2) as a design copy and the selected unscanned sequential cell within the design copy is then scan replaced. The scan replacement step of logic block 1360 is analogous to steps 750 through 755 (FIG. 9) of the TR compiler process 625.

At logic block 1362, the present invention determines whether the area constraints 610 are violated by the design copy created in block 1360. At block 1362, the area consumed by each logic element and the routing resources are summed and this summed value is compared against the predetermined area constraints 610. If area constraints are not violated by the design copy then processing flows to logic block 1364. If area constraints are violated by the design copy then processing flows to logic block 1400.

At logic block 1364, the present invention checks if a timing critical flag is set within the input design 1260. If the timing critical flag is set, then the present invention insures that each scan replaced cell does not cause the design copy to violate the predetermined timing constraints 610. If the timing critical flag is set, processing flows to block 1370. If the timing critical flag is not set, processing flows to logic block 1390 where the currently selected unscanned cell is scanned in the original design.

At logic block 1370 of FIG. 23B, the present invention then performs a timing analysis (e.g., static timing analysis) on the design copy having the most recently scan replaced memory cell. A number of well known static timing analysis procedures can be used at logic block 1370 and can include a unit timing based or cycle based analysis. From the information gained at logic block 1370, the present invention generates a set of paths within the design copy netlist including critical paths and less critical paths; the paths are ranked based on their criticality (e.g., their comparable performance). Located at the top of the list set are the worst critical paths, e.g., those circuit paths (e.g., between sequential cells) that require the longest settling time to process. Located on the bottom of the path set are less critical paths. The critical paths indicate those paths that do not meet timing constraints or that require the longest settling time of the paths of the netlist; these paths are stored in memory 102 or 104 of system 112 (FIG. 2) at logic block 1370. The overall timing of the design copy is based on these worst paths. More than one critical path can share the same timing value.

Within logic block 1370, after the timing analysis, the present invention identifies the worse path within the design copy. At logic block 1380, the present invention determines if the worse path of the design copy does not meet timing constraints, e.g., has worse timing than the original design received at block 1310. If this is the case, processing flows to logic block 1400 and the selected unscanned cell is not scan replaced within the original design. If the determination of logic block 1380 is false, then at logic block 1390 the selected unscanned cell is scan replaced in the original design and the original design now includes the scan replaced selected cell. It is appreciated that the scan replacement step of logic block 1390 is analogous to steps 750 through 755 (FIG. 9) of the TR compiler process 625.

After block 1390, logic block 1400 is executed. At logic block 1400, the present invention checks if the selected unscanned sequential cell was the last unscanned cell within the TCL ranked list 1157. If so, processing of the additive process 1270 exits. If the selected sequential cell was not the last unscanned sequential cell in the TCL ranked list 1157, then at logic block 1410 the next unscanned sequential cell in rank order within the TCL ranked list 1157 is selected. Processing then returns to logic block 1360 with the newly selected cell being scan replaced in the new design copy (the previous design copy can be overwritten by the new design copy).

This process continues until all unscanned sequential cells (or a predefined subset of cells) within the TCL ranked list 1157 are processed. The result is a partially scan replaced netlist that satisfies the determined optimization (e.g., area and/or timing) constraints.

It is appreciated that the partially scan replaced netlist that results from the additive process 1270 can be input to the constraint driven scan insertion process 645 of the present invention. Those cells remaining unscanned can be marked as valid non-scanned before input to process 645 and will not be scan replaced by process 645 nor included in the resulting scan chains.

Figure 24:
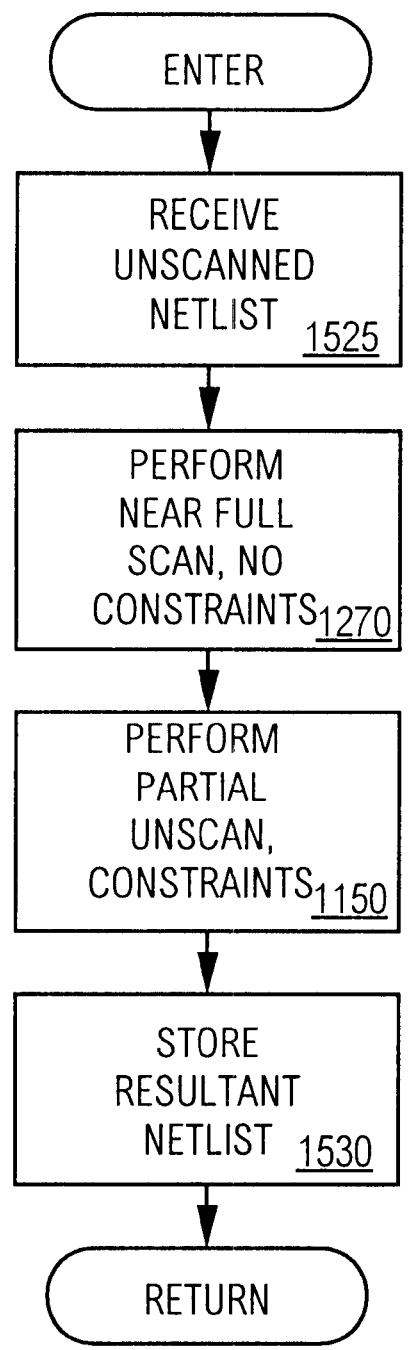
FIG. 24 is a flow diagram illustrating an embodiment of the present invention using near full scan as a front end for the partial unscan process.

FIG. 24 is a flow diagram illustrating an embodiment of the present invention using near full scan 1270 as a front end for the partial unscan process 1150. Process 1510 is useful for imported unscanned netlists (e.g., netlists that originate from a prior art compiler or are manually generated) and it is desired to transform these imported netlists into a form that imitates the output of the test ready compiler 625. At step 1525, process 1510 receives an imported netlist having unscanned sequential cells. This imported netlist is fed into the near full scan process 1270 and the optimization constraints 610 are eliminated during process 1270 so that all unscanned sequential cells of the imported netlist are scan replaced regardless of any optimization (e.g., timing and area) constraint violations. During process 1270, a TCL ranked list 1157 is constructed and all unscanned sequential cells are scan replaced to produce an resultant imported netlist. The resultant imported netlist is a fully scan replaced netlist and somewhat imitates the output produced by the test ready compiler 625 in that all sequential cells are scan replaced, except no loopback connections are present within the resultant imported netlist. An alternative step at this point (in lieu of using process 1270 without constraints) is to input the netlist and scan replace all sequential cells and then install loopback connections. The result of this alternative also mimics the output produced by the test ready compiler 625.

After process 1270 (or its alternative), the fully scan replaced resultant imported netlist is fed into the normal partial unscan process 1150 with optimization constraints (e.g. timing and area) restored to normal. Partial unscan 1150 then backs off of the scan replacement performed during step 1270 if timing and area violations exist. At the completion of process 1150, a resultant netlist is generated and stored at step 1530. Ideally, at the completion of step 1150, the imported netlist meets given timing and area constraints. As discussed above, timing critical flags can be set with respect to processes 1150 to check for or ignore timing.

MULTI-BIT CELL, MULTI-BIT COMPONENT AND MULTI-CELL LOOPBACK CONNECTIONS OF ONE EMBODIMENT OF THE PRESENT INVENTION

The loopback connections discussed above span between the ports of a single or individual scan cell and are called "self-loops." The following embodiment of the present invention, in addition to self-loops, also utilizes loopback connections that span from the scan-out port to the scan-in port of scans cells located within multi-bit cells and multi-bit components. Also used are long loopback connections that span over multiple individual scan cells (multi-cell groups). The loopback connections of multi-bit cells, multi-bit components and multi-cell groups act to simulate the electrical characteristics of the ports of scan cells as the ports would appear if coupled in a scan chain, thereby facilitating circuit optimizations, etc. As discussed above with respect to self-loops that span a single or individual sequential cell, multi-cell loopback connections provide the TR compiler 625 (FIG. 8) with enough information to determine the electrical impact of the DFT circuitry on its design without knowing the actual routing of the scan chain, which will be determined by subsequently driven processes. In this way, the TR compiler 625 of the present invention can generate its design with enough information regarding the DFT circuitry (that include multi-bit cells and components) so that the circuit constraints associated with the HDL specification can more likely be satisfied when the DFT circuitry is completed.

Figure 25A:
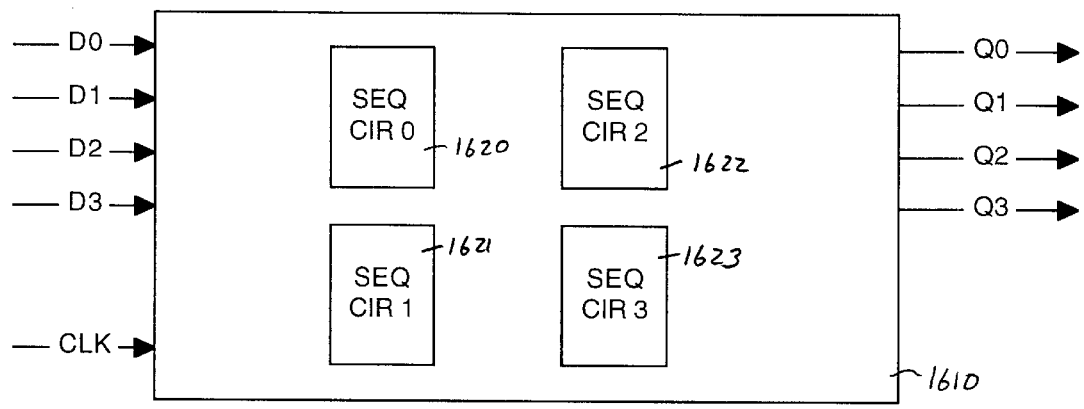
FIG. 25A is an exemplary four-bit multi-bit cell containing four sequential elements.

FIG. 25A illustrates a multi-bit cell 1610. Multi-bit cells are available from the technology libraries 743 of FIG. 9 and are cells that contain a number of replicated individual gates or elements therein. Each gate or element has the same functionality. A multi-bit cell can contain any number, n, of gates and the exemplary multi-bit cell 1610 of FIG. 25A contains four sequential elements as an example. Typically, the multi-bit cells are used in electronic design automation to reduce the clock skew between the gates of the multi-bit cell and all gates of a same multi-bit cell use the same clock or asynchronous control signal. For instance, the same clock, CLK, is used to gate all of the sequential cells 1620–1623 of FIG. 25A. The skew between each sequential cell of cells 1620–1623 is therefore very small. Use of multi-bit cells also leads to a better, more uniform and regular integrated circuit layout in the final integrated circuit device. The gates of the multi-bit cell also tend to be smaller devices. The type of multi-bit cell 1610 of FIG. 25A receives n number of D inputs (D0—D3) and produces n number of Q outputs (Q0–Q3) for n number of replicated gates. Only one clock signal, CLK, is needed.

Figure 25B:
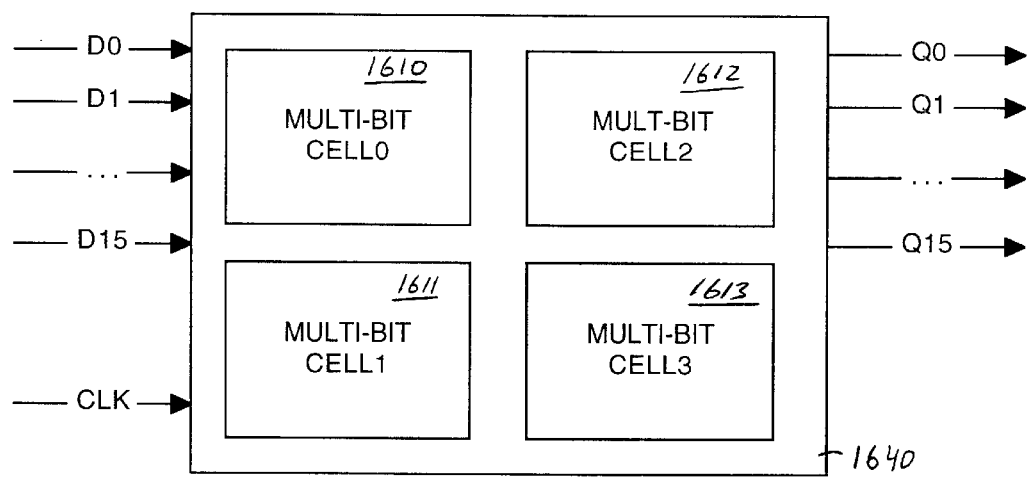
FIG. 25B is an exemplary multi-bit component containing four multi-bit cells with each multi-bit cell containing four sequential elements.

FIG. 25B illustrates a multi-bit component 1640. Multi-bit components contain one or more multi-bit cells. Multi-bit component 1640 contains multi-bit cells 1610–1613. Multi-bit components are used in electronic design automation for the same reasons as multi-bit cells, e.g., they provide reduced clock skew, provide more uniform circuit layouts and offer smaller gate sizes. In the example of FIG. 25B, the multi-bit component 1640 contains four multi-bit cells 1610–1613 which each contain four sequential elements. Therefore, 4×4 or 16 sequential elements are contained within the multi-bit component 1640. Multi-bit component 1640 receives 16 D inputs, D0–15, and produces 16 Q outputs, Q0–15. All sequential elements of the multi-bit component 1640 are clocked by the same clock signal, CLK.

Figure 26A:
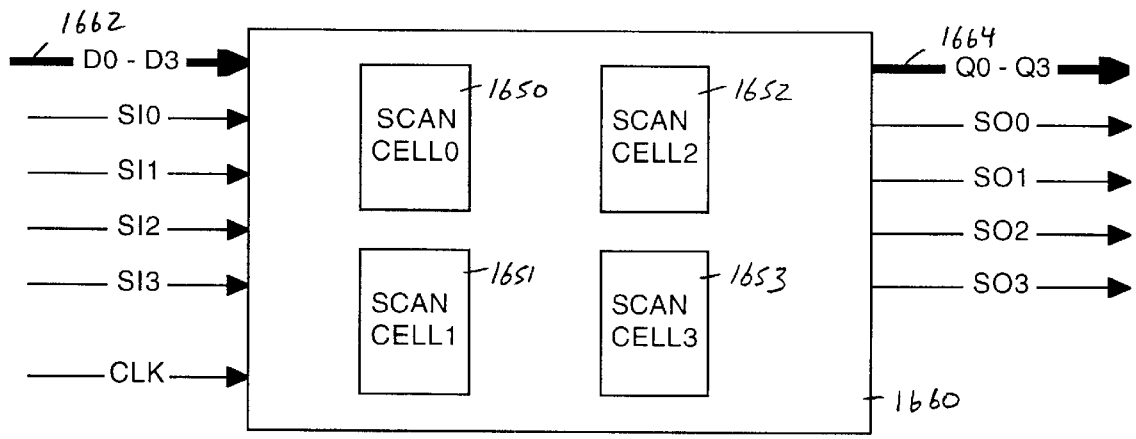
FIG. 26A illustrates one type of scannable multi-bit cell containing four scan cells each cell having its scan-in and scan-out ports available externally.

FIG. 26A illustrates a scannable multi-bit cell 1660 containing n number of replicated scan cells 1650–1653 where n=4. Multi-bit cells containing scan structure, e.g., "scannable" multi-bit cells, exist in at least two different types. The first type, as shown in FIG. 26A, makes each scan-in (SI) port and each scan-out (SO) port of the scan cells available externally. Therefore, SI0–SI3 represent the scan-in ports for the scan cells 1650–1653, respectively, and SO1–SO3, represent the scan-out ports for the scan cells 1650–1653, respectively. Each scan cell of the multi-bit scan cell 1660 is clocked by the same clock signal, CLK. Since the scan-in and scan-out ports are available externally, there does not necessarily need to be a scan chain order within the scan cells of multi-bit scan cell 1660. Bus 1662 represents the four externally available D inputs D0–D3 used by the scan cells 1650–1653 which produce four externally available Q outputs represented by bus 1664 (Q0–Q3).

Figure 26B:
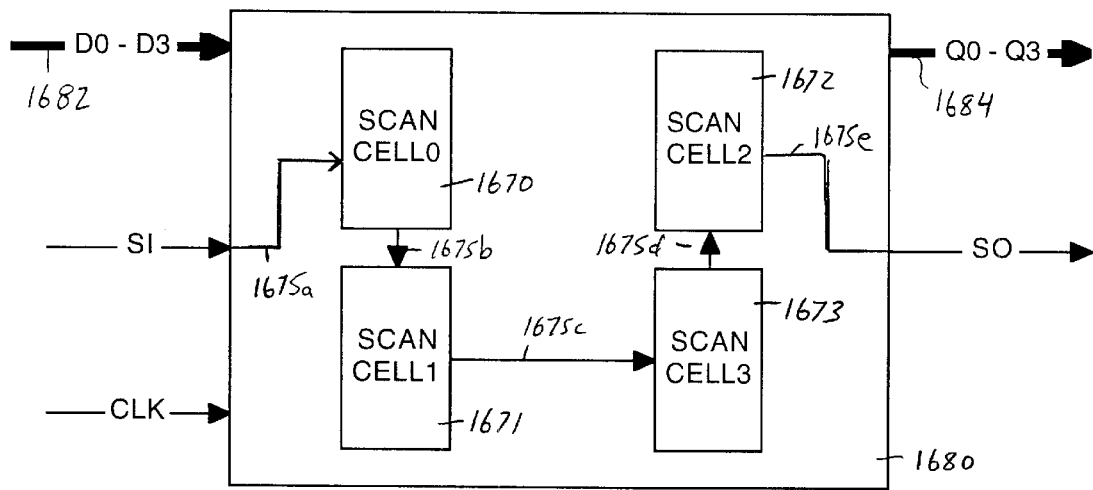
FIG. 26B illustrates a second type of scannable multi-bit cell containing four scan cells and having only one scan-in port and one scan-out port available externally.

FIG. 26B illustrates a scannable multi-bit cell 1680 of another type that contains only one external scan-in (SI) port and one external scan-out (SO) port. A pre-existing scan chain order therefore exists within the scannable multi-bit cell 1680 with respect to the gates of the multi-bit cell. The intermediate scan-in and scan-out ports are not observable external to the cell 1680. The scan chain is made of segments 1675a–1675e which couple the sequential elements in the following scan chain order: cell0 1670; cell1 1671; cell3 1673; and cell2 1672. Each scan cell of the multi-bit scan cell 1680 is clocked by the same clock signal, CLK. Bus 1682 represents the four externally available D inputs D0–D3 used by the scan cells 1670–1673 which produce four externally available Q outputs represented by bus 1684 (Q0–Q3).

Figure 27A:
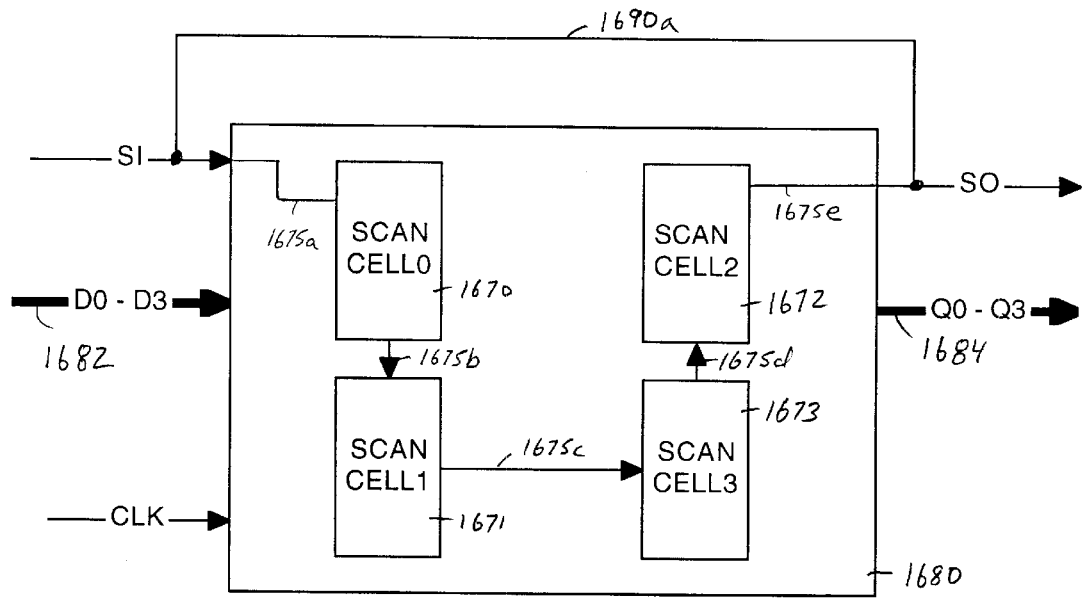
FIG. 27A is a circuit diagram of a scannable multi-bit cell having a multi-bit loopback connection in accordance with one embodiment of the present invention.
Figure 27B:
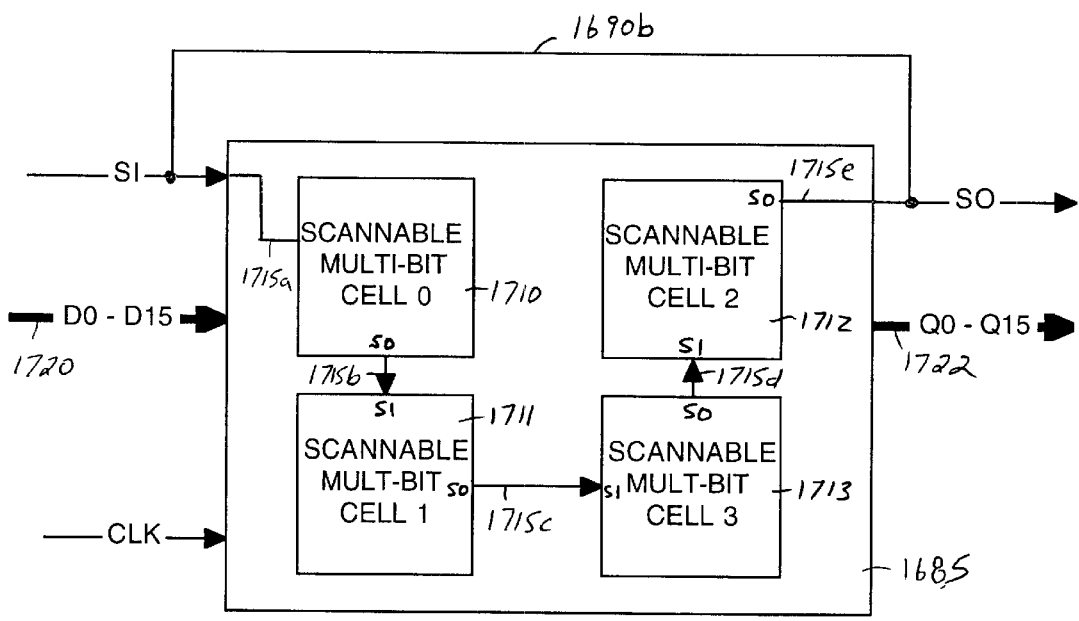
FIG. 27B is a circuit diagram of a scannable multi-bit component having a multi-bit loopback connection in accordance with an embodiment of the present invention.
Figure 31:
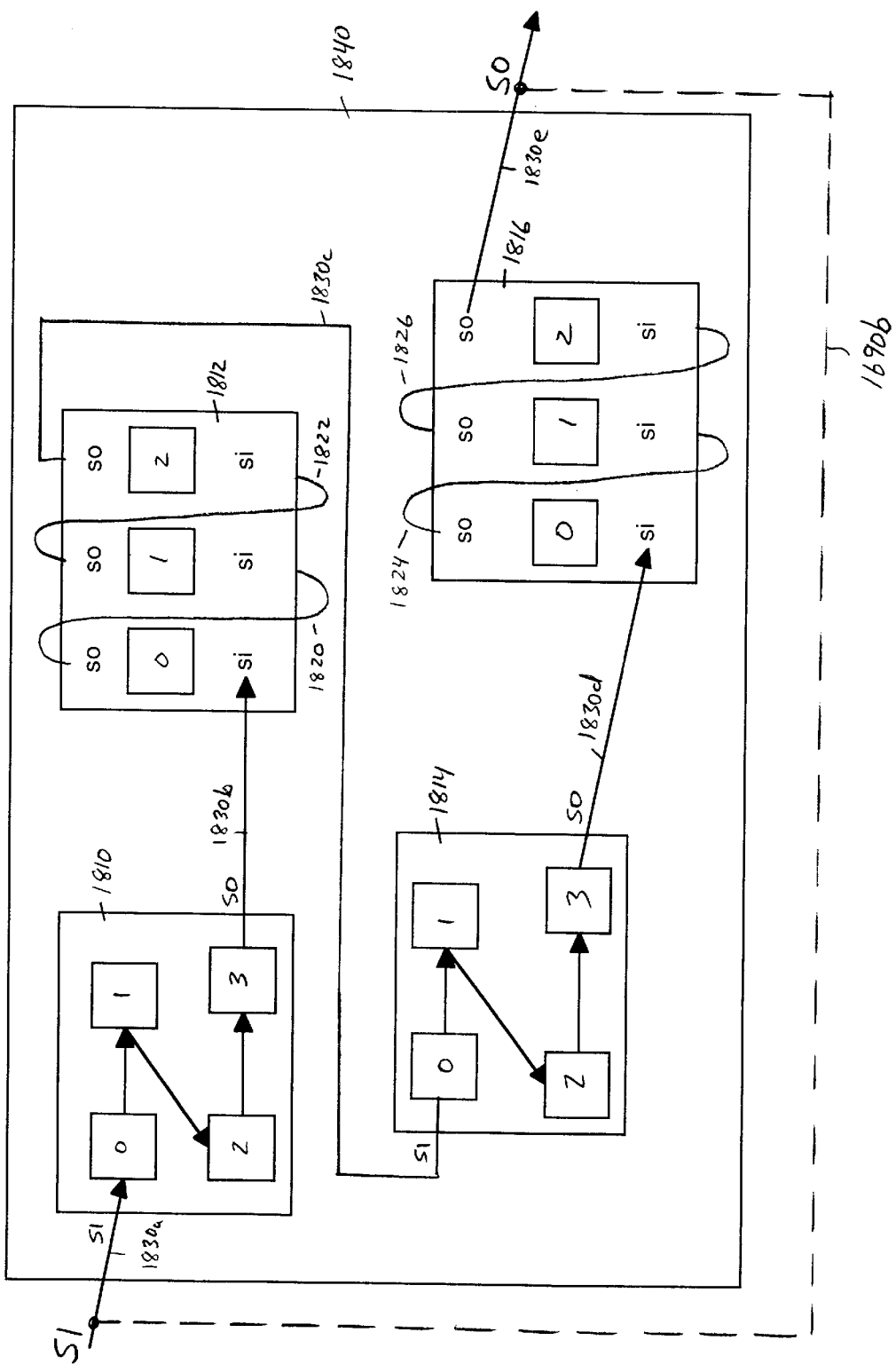
FIG. 31 illustrates an exemplary scannable multi-bit component with a loopback connection in accordance with one embodiment of the present invention.

It is appreciated that scannable multi-bit components are also available (see FIG. 27B and FIG. 31). Scannable multi-bit components can contain: (1) all scannable multi-bit cells of the type of FIG. 26A, or (2) all scannable multi-bit cells of the type of FIG. 26B, or (3) a mixture of scan cell types of FIG. 26A and FIG. 26B. Regardless of the internal make up of the scannable multi-bit component, the scan chain ordering of its internal gates or elements is predetermined. The D and Q pins of each sequential cell of a multi-bit scan component (also called "scannable multi-bit component") are all available externally.

During TR compile 625 and constraint driven scan insertion 645 processes, as described above, one embodiment of the present invention utilizes loopback connections with respect to multi-bit scan cells (also called "scannable multi-bit cells"). In this embodiment, the loopback connection spans multiple scan cells rather than a single individual scan cell as described above with respect to the self-loops of FIG. 6A and FIG. 6B. FIG. 27A illustrates a loopback connection 1690 a of the present invention applied between the scan-out (SO) and scan-in (SI) ports of multi-bit scan cell 1680. This loopback connection spans between scan cells 1670 and 1672 which are also coupled via scan chain structure 1675a–1675e. During certain optimizations, before scan chain construction, it is not known to which element the multi-bit scan cell 1680 will be coupled. Therefore, the loopback connection 1690a accurately simulates the electrical characteristics seen by the Q output port of cell 1672 because, in a scan chain, this port will likely be coupled to another scannable memory cell having similar input characteristics as the input mux on scan cell 1670 and also because the compile wire model uses a unit delay model for this connection. Similarly, the loopback connection 1690a accurately simulates the electrical characteristics seen by the input mux of cell 1670 because in its scan chain mux will likely be coupled to another scannable memory cell having similar output characteristics as the Q output of cell 1672 and also because the compile wire model does not distinguish between inter and intra module connections. During compilation, the TR compiler 625 of the present invention will therefore accurately operate on this multi-bit scan cell 1680 with the loopback connection 1690a so that constraints will more likely be met after the DFT circuitry is complete. Because the loopback connection 1690 a spans over more than one scan cell, circuit degeneration is also avoided during optimization.

FIG. 27B illustrates a loopback connection 1690b of the present invention applied between the scan-out (SO) and scan-in (SI) ports of multi-bit scan component 1685. Multi-bit scan component 1685 includes several scannable multi-bit cells 1710–1713. This loopback connection 1690b spans between the last scan cell of multi-bit scan cell 1712 and the first scan cell of multi-bit scan cell 1710. The multi-bit scan cells are coupled together to form a scan chain by segments 1715a–1715e. Each multi-bit scan cell has a predetermined scan chain order with respect to its scan cells. During certain optimizations, before scan chain construction, it is not known to which element the multi-bit scan component 1685 will be coupled. Therefore, the loopback connection 1690b accurately simulates the electrical characteristics seen by the Q output port of the last cell of multi-bit scan cell 1712 because, in a scan chain, this port will likely be coupled to another scannable memory cell having similar input characteristics as the input mux on the first scan cell of multi-bit cell 1710 and also because the compile wire model uses a unit delay model for this connection. Similarly, the loopback connection 1690b accurately simulates the electrical characteristics seen by the input mux of the first scan cell of multi-bit scan cell 1710 because in its scan chain mux will likely be coupled to another scannable memory cell having similar output characteristics as the Q output of the last scan of multi-bit scan cell 1712 and also because the compile wire model does not distinguish between inter and intra module connections. During compilation, the TR compiler 625 of the present invention will therefore accurately operate on this multi-bit scan component 1685 with the loopback connection 1690b so that constraints will more likely be met after the DFT circuitry is complete. Like self loops, the loopback connections discussed above are eventually broken before the scan chains are constructed by process 645.

Figure 27C:
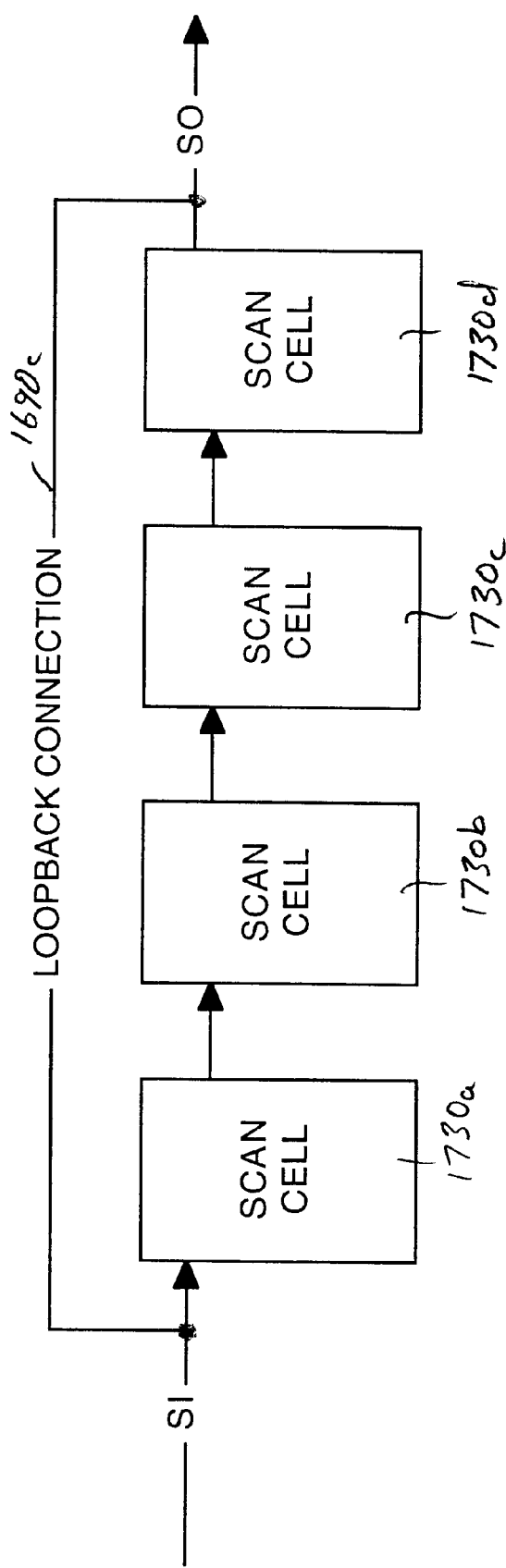
FIG. 27C is a circuit diagram of a group of scan cells having a multi-cell loopback connection in accordance with an embodiment of the present invention.

Loopback connections in accordance with the present invention can also span multiple individual scan cells of a group of scan cells 1730a–1730d that are not necessarily associated with a multi-bit cell or multi-bit component. FIG. 27C illustrates a group of scan cells 1730a–1730d in which the scan-out (SO) port of scan cell 1730d is coupled to the scan-in (SI) port of scan cell 1730a using a transient loopback connection 1690c. The loopback is called "transient" because generally it is used during optimization, but not stored in the netlist after the compile process is finished. During circuit optimization, the TR compiler 625 temporarily installs and uses "long" loopback connections 1690c, e.g., loopback connections that span over multiple sequential cells. Herein, long loopback connections are also called multi-cell loopback connections. Long loopback connections are used by the TR compiler 625 in order to prevent circuit degeneration during optimization. Circuit degeneration can occur when using self loops, e.g., loopbacks that span only a single or individual sequential cell because the loopback appears as an electrical short circuit thereby preventing any further optimization analysis involving the degenerated circuitry. This type of circuit degeneration (with respect to cells 1730a–1730d) is reduced or eliminated using the long loopback connection 1690c.

Figure 28A:
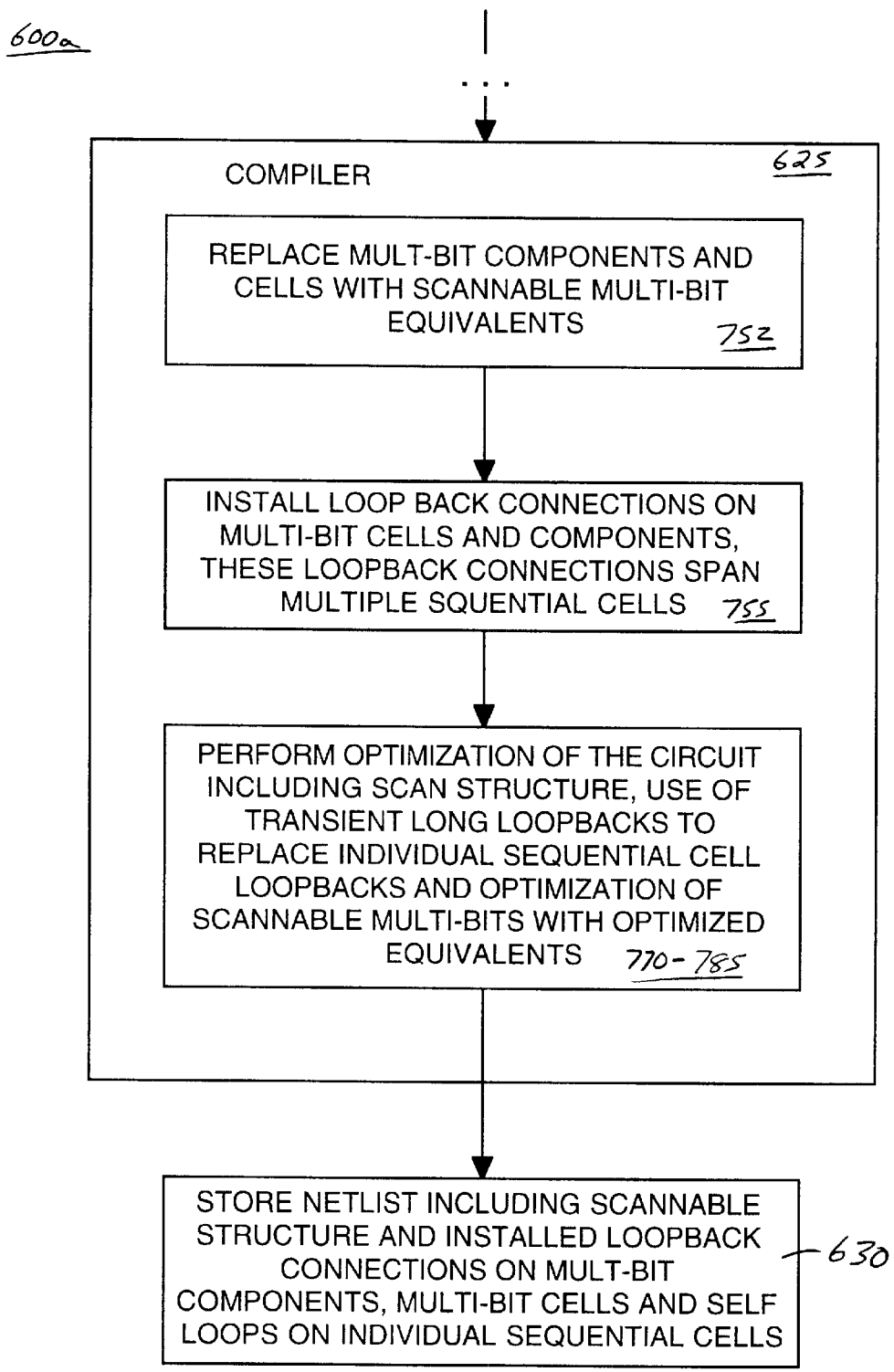
FIG. 28A illustrates the compiler related steps of the electronic design automation process of FIG. 8 that are modified in accordance with an embodiment of the present invention that utilizes multi-bit cell loopback connections, multi-bit component loopback connections and multi-cell long loopback connections.
Figure 28B:
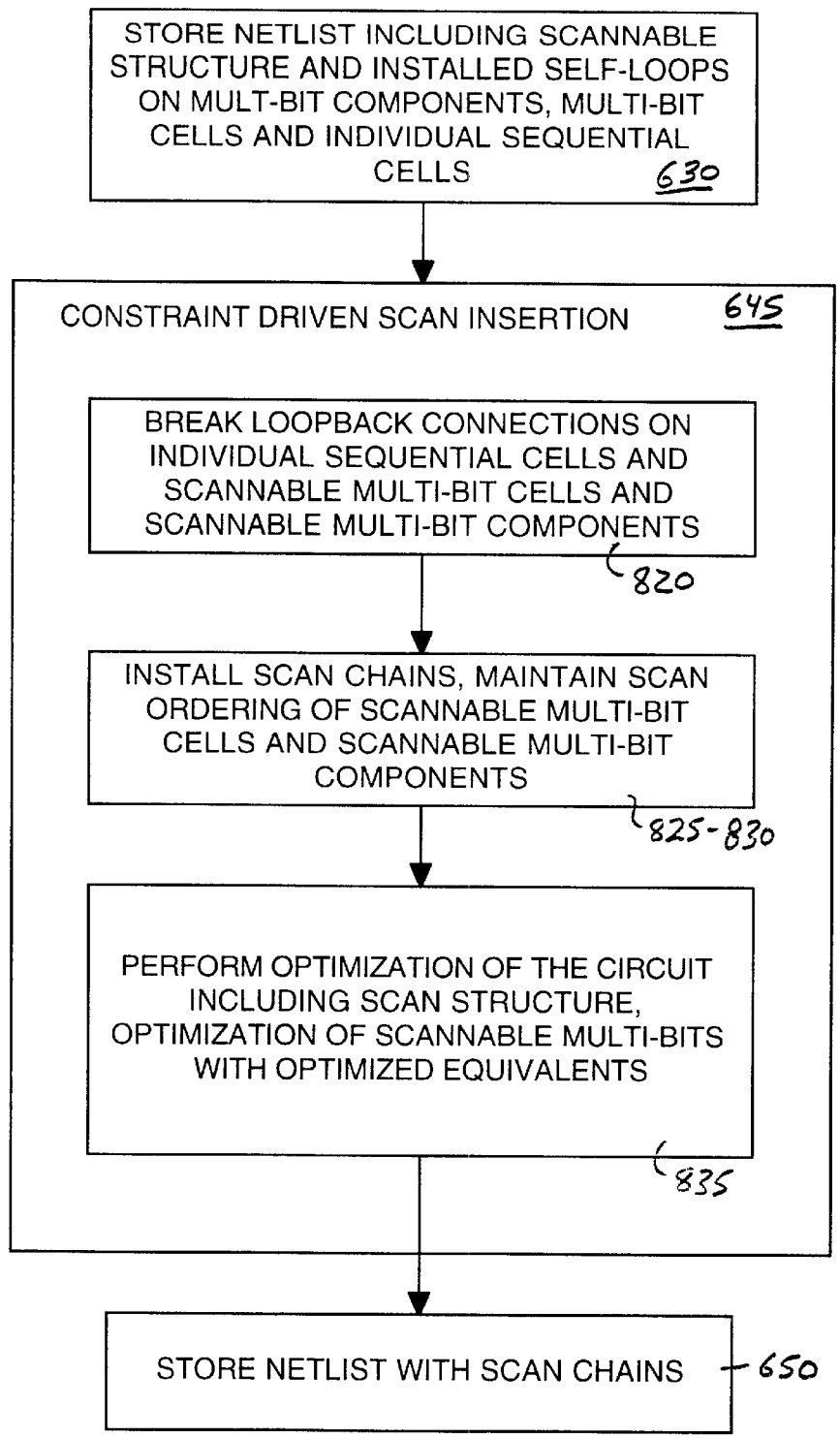
FIG. 28B illustrates the constraint driven scan insertion related steps of the electronic design automation process of FIG. 8 that are modified in accordance with an embodiment of the present invention that utilizes multi-bit cell loopback connections, multi-bit component loopback connections and multi-cell long loopback connections.

FIG. 28A and FIG. 28B illustrate an electronic design automation process 600a (implemented as instructions executed over computer system 112 of FIG. 2) which is analogous to process 600 (FIG. 8) except as modified by the steps shown in FIG. 28A and FIG. 28B. Process 600a represents an embodiment of the present invention that uses loopback connections with scannable multi-bit cells, scannable multi-bit components and long loopback connections (of the type shown in FIG. 27C). FIG. 28A illustrates the steps of the TR compiler process 625 that are modified in accordance with the embodiment of the present invention that utilizes multi-bit cells and multi-bit components. Except for the discussions below, the TR compiler process 625 of FIG. 28A is analogous to the TR compiler process 625 of process 600. Process 600a, like process 600, receives an HDL specification defining an integrated circuit, however, process 600 a generates a netlist that contains multi-bit cells and multi-bit components therein. At step 752 of process 600a, the present invention utilizes technology libraries 743 (FIG. 9) as a resource in analyzing the netlist and replacing therein any multi-bit cells or multi-bit components with scannable multi-bit cells and scannable multi-bit components that are otherwise equivalent in function. A scan replaced netlist is then produced. For instance, at step 752, a multi-bit cell (of the input netlist) of the type shown in FIG. 25A can be replaced with a scannable multi-bit cell of the type shown in FIG. 26A or FIG. 26B. Similarly at step 752, a multi-bit component (of the input netlist) of the type shown in FIG. 25B can be replaced with a scannable multi-bit component of the type shown in FIG. 27B (without the loopback connection).

Figure 29:
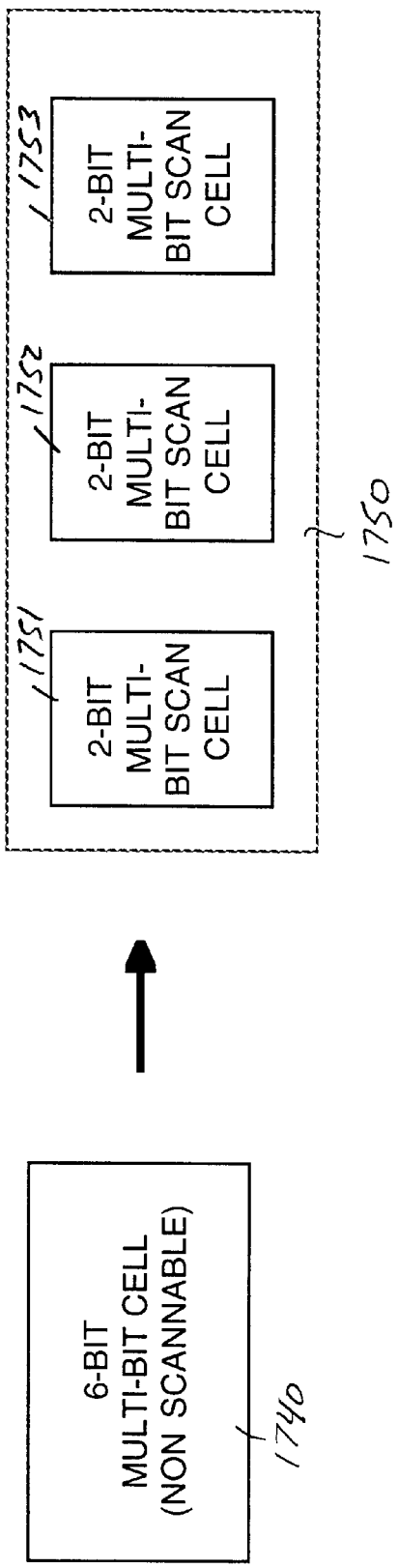
FIG. 29 illustrates an example substitution of a larger multi-bit cell with several smaller sized multi-bit cells during scan optimization processes of the present invention.

It is appreciated that during the scan replacement process 752, multi-bit cells and/or multi-bit components can be replaced with a group of multiple multi-bit elements of a lesser gate number. This is known as a "width adjustment"

replacement. For instance, as shown in FIG. 29, a 6-bit multi-bit cell 1740 can be replaced with three 2-bit scannable multi-bit cells 1751–1753. This type of scan replacement can be performed as a result of cell library contents or other integrated circuit design constraints. It is appreciated that the reverse scan replacement can also be supported during step 752. Namely, a group of lesser bit multi-bit cells can be replaced by a multi-bit scan cell of larger bit size. For instance, three 2-bit multi-bit cells can be replaced by a single 6-bit scannable multi-bit cell. During the above width adjustments of the scan replacement step 752, the present invention also insures that no other aspect of the multi-bit structure is violated so that scan replacement can be performed homogeneously. Step 752 generates a scan replaced netlist.

At step 755 of FIG. 28A, the TR compiler 625 of process 600a then installs loopback connections on the scannable multi-bit cells and scannable multi-bit components of the scan replaced netlist as shown in FIG. 27A and FIG. 27B. Generally, the technology library 753 will contain a predetermined scan chain ordering even for multi-bit scan cells of the type shown in FIG. 26A. In other cases, such as the multi-bit scan cell of FIG. 26B, the scan chain is already constructed. Therefore, in either case, the scan ordering is known for all scannable multi-bit cells at step 755. The loopback connections installed at step 755 on the multi-bit scan cell traverse from the scan-out (SO) port of the last scan cell of the multi-bit scan cell to the scan-in (SI) port of the first scan cell of the multi-bit scan cell. The same is true for multi-bit components. With respect to the type of multi-bit scan cells of FIG. 26A, step 755 installs external connections between the scan-in and scan-out ports of the multi-bit scan cell to provide a scan chain within the multi-bit scan cell, this is described in more detail with respect to FIG. 31.

FIG. 31 illustrates an exemplary scannable multi-bit component 1840 that includes four multi-bit scan cells 1810–1816. Multi-bit scan cells 1810 and 1814 contain predetermined scan chain orderings and therefore each have only one scan-in port and one scan-out port. However, multi-bit scan cells 1812 and 1816 individually provide a separate scan-out and a separate scan-in for each of their three scan cells. In order to install the loopback connection 1690b from the last scan cell to the first scan cell of the scannable multi-bit component 1840, the present invention constructs a scan chain ordering within the scannable multi-bit component 1840. This is done by providing external wires (1830a–1830e) to connect the SO ports and SI ports of the multi-bit cells to form a scan chain.

For multi-bit cells that do not have a scan chain installed therein, one is installed using external connections. This is done by installing external connections 1820 and 1822 across the scan-in (SI) and scan-out (SO) ports of multi-bit scan cell 1812 to provide a scan chain ordering of gate0; gate1 and gate2. A similar configuration is done to cell 1816 using connections 1824 and 1826. A connection 1830b is also made between the SO of cell 1810 to the SI of the first gate (gate0) of cell 1812. A connection 1830c is also made between the SO of the last gate (gate2) of cell 1812 to the SI of the first gate of cell 1814. A connection 1830d is also made between the SO of cell 1814 to the SI of the first gate (gate0) of cell 1816. The SO of the multi-bit scan component is then taken from the last gate (g2) of cell 1816. As shown in FIG. 31, if the multi-bit scan cell has a scan chain internally, it is used by step 755 of process 600a. However, if the multi-bit scan cell does not have an internal scan chain, one is externally installed by the present invention at step 755 of process 600a. Then, the multi-bit scan cells are connected together to form one large scan chain within the scannable multi-bit component.

At the completion of step 755 of FIG. 28A, all scannable multi-bit cells and all scannable multi-bit components have loopback connections installed thereon using the above described processes. Also at step 755, long loopback connections of the type shown in FIG. 27C are installed with respect to groups of individual scan cells. It is appreciated that self loops are not installed on the individual scan cells of a scannable multi-bit cell (or scannable multi-bit component) because the scan chain is already installed therein thereby obviating any need for a self-loop in these instances.

At steps 770–785 of the process 600a of FIG. 28A, the present invention performs optimization on the scan replaced netlist including the installed loopback connections and long loopback connections. At these steps, a cell is broken down into its underlying functionality and then the peripheral logic surrounding the cell is examined in light of the cell's underlying functionality to find a match with another library cell that can optimize the circuit for a given characteristic, e.g., performance, area, etc. In other words, the surrounding or peripheral logic of scannable multi-bit cells is examined to determine if the surrounding or peripheral logic and the scannable multi-bit cell can be replaced by an optimized equivalent scannable multi-bit cell from a technology library. If an optimization can be made, then at steps 770–785, a cell and logic replacement is performed. The same is performed for scannable multi-bit components. During optimization, width adjustments for multi-bit cells can also be performed.

Figure 30A:
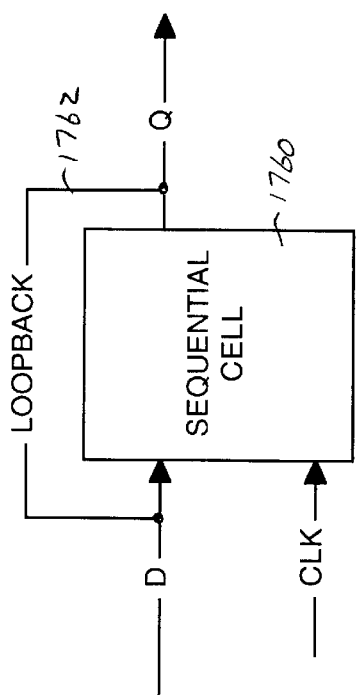
FIG. 30A and FIG. 30B illustrate circuit degeneration that can occur during circuit optimizations if the optimizations do not use multi-cell loopback connections.
Figure 30B:
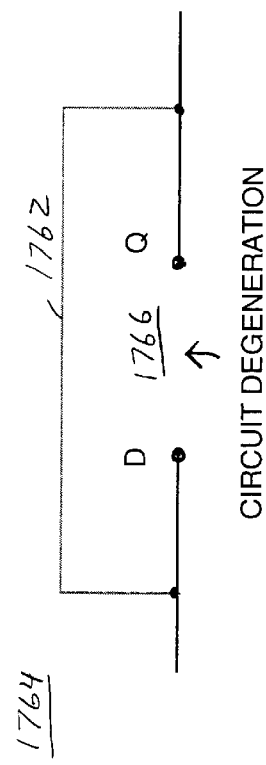

It is appreciated that during optimization (steps 770–785), the installed long loopback connections prevent circuit degeneration that can occur when self loops are applied across individual cells. FIG. 30A illustrates a self loop 1762 across an individual scan cell 1760. FIG. 30B illustrates that the circuitry within the scan cell can degenerate 1766 during optimization due to the presence of the self-loop 1762 which acts as a short circuit across the D and Q ports. The short acts to remove the underlying circuitry. In this case, the effectiveness of optimization is reduced as a result of the circuit degeneration 1766 because the underlying functionality of the cell is removed. Therefore, the present invention utilizes long loopbacks that span more than one scan cell to prevent the occurrence of the short circuit and thereby prevent this type of underlying circuit degeneration during the optimization steps 770–785. As shown in FIG. 27C, the long loopback 1690c traverses from cell 1730d to cell 1730a, thereby avoiding the short circuit between the ports of any one individual scan cell. In accordance with the present invention, individual scan cells installed at step 752 are effectively optimized at steps 770–785 by the use of long loopbacks installed across groups of scan cells which avoid the short circuit across the D and Q ports of an individual scan cell.

Although useful for circuit optimizations, the long loopbacks have a negative impact on layout processes by introducing arbitrary spatial affinities between scan cells that otherwise are not connected. Once the scan circuitry is effectively optimized, the long loopback connections are therefore removed by process 600a and replaced with individual self loops before the optimized netlist is stored in computer memory at step 630. Therefore, at step 630 of FIG. 28A, loopbacks across scannable multi-bit cells and scannable multi-bit components are stored and any self-loops over individual scan cells are stored, but the long loopbacks are removed and replaced with self-loops for individual scan cells. The self-loops are replaced before storing the netlist because these self loops correctly simulate the load capacitance on the D and Q ports of the individual scan cells and are used by other tools that need this information without placing an arbitrary spatial constraint on the cells of the netlist that could be detrimental during layout.

FIG. 28B illustrates the steps of the constraint driven scan insertion process 645 that are modified in accordance with the embodiment of the present invention that utilizes multi-bit cells and multi-bit components. Process 645 of FIG. 28B is analogous to process 645 of FIG. 10 except as described differently herein. Process 820 of FIG. 28B receives the netlist stored by step 630 and breaks the self-loops installed on the individual scan cells and also breaks the loopback connections on all scannable multi-bit cells and scannable multi-bit components. At steps 825–830, the present invention then constructs the scan chains by linking the existing scan structure into balanced scan chains. It is appreciated that, in one embodiment, step 755 can be performed using the processes described in U.S. Pat. No. 5,828,579 issued on Oct. 27, 1998 and entitled "Scan Segment Processing within Hierarchical Scan Architecture for Design for Test Applications" by Beausang et al., which is incorporated herein by reference. Within U.S. Pat. No. 5,828,579, a user can define a particular scan segment which is called a user defined scan segment. The cell ordering in the user defined scan segment is then maintained in the computer controlled construction of the scan chains. In other words, the user defined scan segment is not broken into its component parts and reassembled in other chains or out of order in a single chain. It is appreciated that existing scan chain segments found within scannable multi-bit cells and scannable multi-bit components are treated as a user defined scan segment with respect to steps 825–830. That is, steps 825–830 maintain any scan chain orderings found within the scan chain segments of scannable multi-bit cells and scannable multi-bit component s a s they construct the scan chains.

At step 835 of FIG. 28B, the netlist produced by steps 825–830 is optimized with the inserted scan chain structure. At step 650, the optimized netlist with scan structure is then stored in computer memory.

Figure 32A:
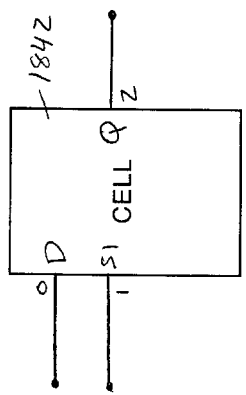
FIG. 32A and FIG. 32B illustrate a pin naming convention utilized by one embodiment of the present invention for representing a scan chain ordering within a scannable multi-bit cell.
Figure 32B:
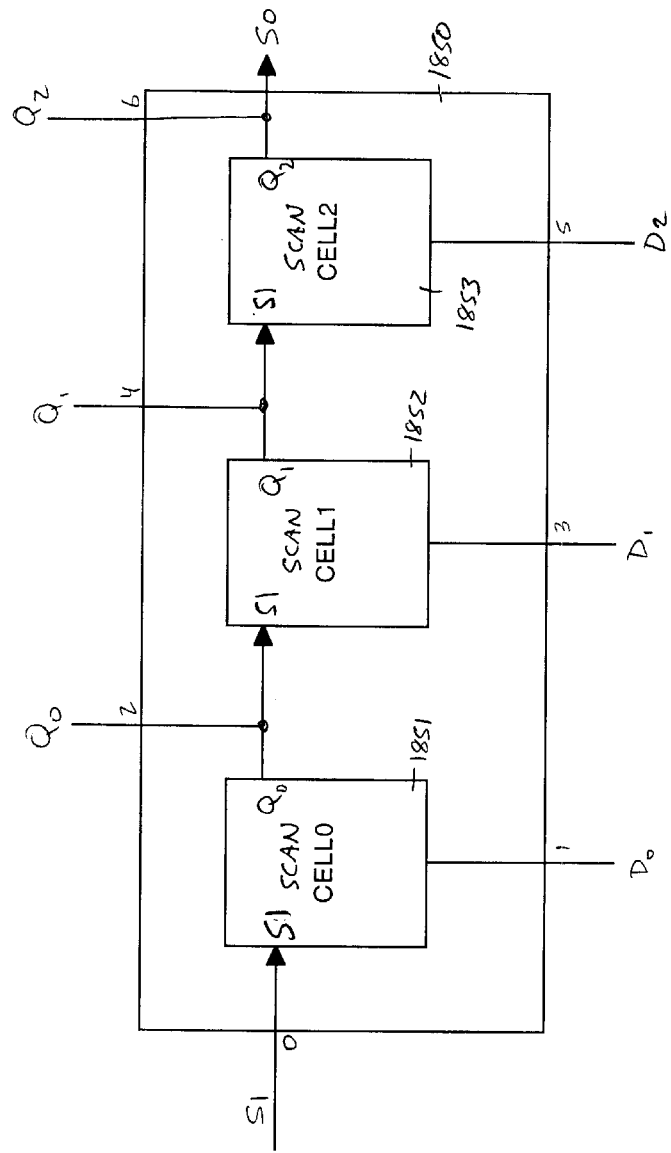

FIG. 32A and FIG. 32B illustrate a pin numbering format (pin_map) that can be used in accordance with one embodiment of the present invention. The pin_map of a scannable multi-bit cell or component can be used to determine the scan chain ordering of a library stored multi-bit scan cell or component. In this way, the scan chain order of the scan cells within the multi-bit cell can be determined by inspecting its pin_map. As shown in FIG. 32A, the D input is called "0," the scan-in (SI) is called "1" and the Q output is called "2" with respect to generic sequential scan cell 1842. This ordering is represented in the format:

<0:1:2> in the general case. According to the multi-bit scan cell 1850, the outputs Q0–Q2 are on pins 2, 4 and 6, respectively, the inputs D0–D2 are on pins 1, 3 and 5, respectively, and the scan-in is on pin 0 and the scan-out is on pin 6. Therefore, to represent the pin_map for the cell configuration of FIG. 32B, the following format is used and associated with this library cell 1850:

pin_map:
  bit0: <1:0:2>
  bit1: <3:2:4>
  bit2: <5:4:6>

Using the above pin_map, the scan chain order of the scan cells 1851–1853 can readily be determined. For instance, the Q of bit0 being "2" is the same as the SI of bit1. Therefore, they are connected. Likewise, the Q of bit1 being "4" is the same as the SI of bit2, so they are connected.

Pin_maps are useful when performing scan replacement. For instance, when accessing a non-scan multi-bit cell, the cells can be unpacked using the pin_map. Then scan replacement can be performed on the individual cells and then the cell can be repacked to produce a new pin_map which describes the scan chain order therein. A scannable multi-bit cell is then produced. As such, the pin_map dictates the manner in which the scan chain is laid out within the scan cells of a multi-bit scan cell. Generally, once the multi-bit cell is designed, its pin_map is fixed and this information is stored along with the multi-bit cell in the technology library.

Figure 33:
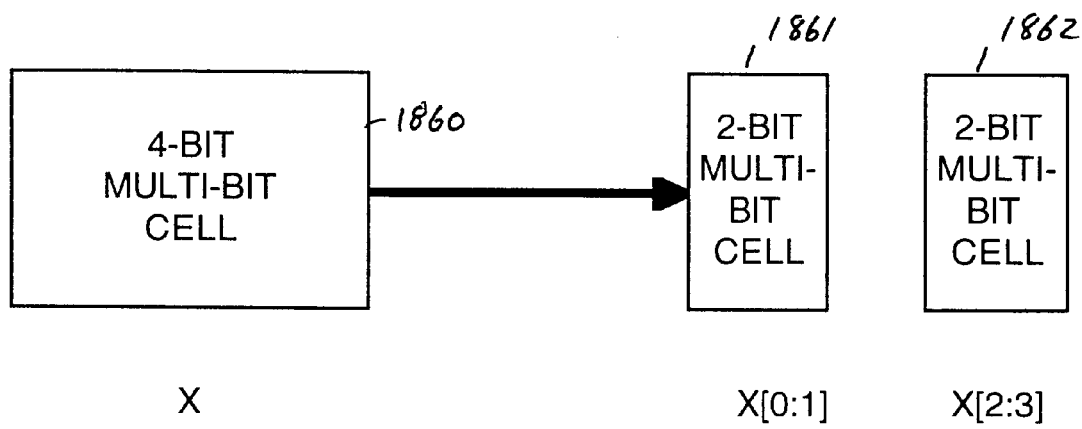
FIG. 33 illustrates a multi-bit cell naming convention used by the present invention for width adjustments.

FIG. 33 illustrates a cell naming convention used by one implementation of the present invention when width adjustments are performed. When a larger multi-bit cell 1860 is broken into smaller multi-bit cells 1861 and 1862 during scan replacement or optimization, the following naming convention is used. The original larger cell, X, then becomes X[0:1] and X[2:3], in the case when a 4-bit multi-bit cell is broken into two 2-bit multi-bit cells. In each instance, the bits are individually represented within the "[]" syntax and associated with the original named cell, e.g., X.

The preferred embodiment of the present invention, an electronic design automation process that makes use of loopback connections that span across multi-bit cells, multi-bit components and multi-cell groups, is thus described. While the present invention has been described in particular embodiments, it should be appreciated that the present invention should not be construed as limited by such embodiments, but rather construed according to the below claims.

What is claimed is:

1. In an electronic design automation system, a method of generating a netlist description comprising the computer implemented steps of:
   a) accessing an HDL specification representing an integrated circuit to be realized in physical form and accessing constraints applicable to said electronic design;
   b) compiling said HDL specification with a compiler to produce a netlist description of said integrated circuit wherein said netlist description comprises multi-bit cells, multi-bit components and combinational logic, said step b) comprising the steps of:
     b1) inserting scannable multi-bit cells and scannable multi-bit components by replacing said multi-bit cells and said multi-bit components with equivalent scannable multi-bit cells and equivalent scannable multi-bit components, respectively; and
     b2) installing a loopback connection between a scan-out port of a respective scannable multi-bit cell and a scan-in port of said respective scannable multi-bit cell; and
     b3) installing a loopback connection between a scan-out port of a respective scannable multi-bit component and a scan-in port of said respective scannable multi-bit component; and
   c) storing said netlist description into computer memory.

2. A method as described in claim 1 wherein said step b) further includes the step of b4) optimizing said scannable multi-bit cells and said scannable multi-bit components according to said constraints by utilizing said loopback connections installed by steps b2) and b3) to simulate electrical characteristics of scan-in and scan-out ports of said scannable multi-bit cells and said scannable multi-bit components.

3. A method as described in claim 2 wherein said step b4) comprises the steps of:
- installing a long loopback connection over multiple scan cells wherein said long loopback connection is coupled to a scan-in port of a first scan cell of said multiple scan cells and also coupled to a scan-out port of a last scan cell of said multiple scan cells;
- optimizing using said long loopback connection which prevents circuitry degeneration of said first and last scan cells; and
- removing said long loopback connection.

4. A method as described in claim 1 further comprising the steps of:
- d) removing said loopback connections from said netlist description; and
- e) constructing scan chains that include said scannable multi-bit cells and said scannable multi-bit components, wherein said step e) utilizes existing scan chain ordering of any existing scan chain segments found within scan scannable multi-bit cells and scan scannable multi-bit components of said netlist description.

5. A method as described in claim 1 wherein said step b2) comprises the step of, provided said respective scannable multi-bit cell does not already contain an existing scan chain ordering, then installing connections to scan-in ports and scan-out ports of said respective scannable multi-bit cell to construct a scan chain ordering for said respective scannable multi-bit cell.

6. A method as described in claim 1 wherein said step b3) comprises the step of, provided said respective scannable multi-bit component does not already contain an existing scan chain ordering, then installing connections to scan-in ports and scan-out ports of said respective scannable multi-bit component to construct a scan chain ordering for said respective scannable multi-bit component.

7. A method as described in claim 1 wherein said constraints define design rule and performance limitations applicable to said design.

8. An electronic design automation system having a processor coupled to computer memory wherein said memory contains instructions that when executed implement a method of generating a netlist description comprising the computer implemented steps of:
- a) accessing an HDL specification representing an integrated circuit to be realized in physical form and accessing constraints applicable to said electronic design;
- b) compiling said HDL specification with a compiler to produce a netlist description of said integrated circuit wherein said netlist description comprises multi-bit cells, multi-bit components and combinational logic, said step b) comprising the steps of:
  - b1) inserting scannable multi-bit cells and scannable multi-bit components by replacing said multi-bit cells and said multi-bit components with equivalent scannable multi-bit cells and equivalent scannable multi-bit components, respectively; and
  - b2) installing a loopback connection between a scan-out port of a respective scannable multi-bit cell and a scan-in port of said respective scannable multi-bit cell; and
  - b3) installing a loopback connection between a scan-out port of a respective scannable multi-bit component and a scan-in port of said respective scannable multi-bit component; and
- c) storing said netlist description into said computer memory.

9. An electronic design automation system as described in claim 8 wherein said step b) of said method further includes the step of b4) optimizing said scannable multi-bit cells and said scannable multi-bit components according to said constraints by utilizing said loopback connections installed by steps b2) and b3) to simulate electrical characteristics of scan-in and scan-out ports of said scannable multi-bit cells and said scannable multi-bit components.

10. An electronic design automation system as described in claim 9 wherein said step b4) of said method comprises the steps of:
- installing a long loopback connection over multiple scan cells wherein said long loopback connection is coupled to a scan-in port of a first scan cell of said multiple scan cells and also coupled to a scan-out port of a last scan cell of said multiple scan cells;
- optimizing using said long loopback connection which prevents circuitry degeneration of said first and last scan cells; and
- removing said long loopback connection.

11. An electronic design automation system as described in claim 8 wherein said method further comprising the steps of:
- d) removing said loopback connections from said netlist description; and
- e) constructing scan chains that include said scannable multi-bit cells and said scannable multi-bit components, wherein said step e) utilizes existing scan chain ordering of any existing scan chain segments found within scan scannable multi-bit cells and scan scannable multi-bit components of said netlist description.

12. An electronic design automation system as described in claim 8 wherein said step b2) of said method comprises the step of, provided said respective scannable multi-bit cell does not already contain an existing scan chain ordering, then installing connections to scan-in ports and scan-out ports of said respective scannable multi-bit cell to construct a scan chain ordering for said respective scannable multi-bit cell.

13. An electronic design automation system as described in claim 8 wherein said step b3) of said method comprises the step of, provided said respective scannable multi-bit component does not already contain an existing scan chain ordering, then installing connections to scan-in ports and scan-out ports of said respective scannable multi-bit component to construct a scan chain ordering for said respective scannable multi-bit component.

14. In an electronic design automation system, a method of generating a netlist description comprising the computer implemented steps of:
- a) compiling an HDL specification to produce a netlist description of an integrated circuit, wherein said netlist description represents an integrated circuit design and comprises individual memory cells, multi-bit cells and multi-bit components, said step a) comprising the steps of:
  - a1) inserting scannable multi-bit cells and scannable multi-bit components by replacing said multi-bit cells and said multi-bit components with equivalent scannable multi-bit cells and equivalent multi-bit components, respectively;
  - a2) inserting individual scan cells by replacing said individual memory cells with equivalent individual sequential cells; and a3) installing loopback connections between respective scan-in and scan-out ports of said scannable multi-bit cells and said scannable multi-bit components; and b) storing said netlist description into computer memory.

15. A method as described in claim 14 wherein said step a) further comprises the steps of:

a4) installing a long loopback connection over multiple individual scan cells wherein said long loopback connection is coupled to a scan-in port of a first scan cell of said multiple individual scan cells and also coupled to a scan-out port of a last scan cell of said multiple individual scan cells; and a5) optimizing said scannable multi-bit cells, said scannable multi-bit components and said individual scan cells wherein said step a5) uses said loopback connections installed by steps a3) and a4) to simulate electrical characteristics of scan-in and scan-out ports of said scannable multi-bit cells, said scannable multi-bit components and said individual scan cells.

16. A method as described in claim 15 wherein said step a) further comprises the steps of:

a6) removing said long loopback connections; and a7) installing self-loops between scan-in and scan-out ports of said individual scan cells.

17. A method as described in claim 14 further comprising the steps of:

c) removing said loopback connections from said netlist description; and d) constructing scan chains that include said scannable multi-bit cells, said scannable multi-bit components and said individual scan cells, wherein said step d) maintains existing scan chain ordering found within said scannable multi-bit cells and said scannable multi-bit components of said netlist description.

18. A method as described in claim 14 wherein said step a3) comprises the steps of:

provided a respective scannable multi-bit cell does not already contain an existing scan chain ordering, then installing connections to scan-in ports and scan-out ports of said respective scannable multi-bit cell to construct a scan chain ordering for said respective scannable multi-bit cell; and provided a respective scannable multi-bit component does not already contain an existing scan chain ordering, then installing connections to scan-in ports and scan-out ports of said respective scannable multi-bit component to construct a scan chain ordering for said respective scannable multi-bit component.

19. A method as described in claim 14 wherein said step a1) and said step a2) each comprise the step of performing sequential mapping based scan equivalence.

20. A method as described in claim 14 wherein said scannable multi-bit cells each comprise n number of replicated scannable sequential cells that are each multiplexed input D flip-flops.

* * * * *